US011990730B2

(12) United States Patent
Aoki et al.

(10) Patent No.: US 11,990,730 B2
(45) Date of Patent: May 21, 2024

(54) LIGHT-EMITTING DEVICE

(71) Applicant: HAMAMATSU PHOTONICS K.K., Hamamatsu (JP)

(72) Inventors: Yuta Aoki, Nara (JP); Kazuyoshi Hirose, Hamamatsu (JP); Satoru Okawara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 684 days.

(21) Appl. No.: 16/973,602

(22) PCT Filed: Jun. 19, 2019

(86) PCT No.: PCT/JP2019/024339
§ 371 (c)(1),
(2) Date: Dec. 9, 2020

(87) PCT Pub. No.: WO2019/244943
PCT Pub. Date: Dec. 26, 2019

(65) Prior Publication Data
US 2021/0249841 A1 Aug. 12, 2021

(30) Foreign Application Priority Data

Jun. 20, 2018 (JP) .................................. 2018-116878

(51) Int. Cl.
*H01S 5/183* (2006.01)
*H01S 5/11* (2021.01)
(Continued)

(52) U.S. Cl.
CPC ............ *H01S 5/11* (2021.01); *H01S 5/18305* (2013.01); *H01S 5/185* (2021.01); *H01S 5/34333* (2013.01)

(58) Field of Classification Search
CPC ........ H01S 5/11; H01S 5/18305; H01S 5/185; H01S 5/34333; H01S 5/04256;
(Continued)

(56) References Cited

U.S. PATENT DOCUMENTS

| 9,214,788 B2* | 12/2015 | Kawaguchi ......... H01S 5/18361 |
| 2004/0013157 A1* | 1/2004 | Deng ...................... H01S 5/183 372/96 |

FOREIGN PATENT DOCUMENTS

| CN | 102460866 A | 5/2012 |
| JP | 2007-019277 A | 1/2007 |

(Continued)

OTHER PUBLICATIONS

Y. Kurosaka et al., "Effects of non-lasing band in two-dimensional photonic-crystal lasers clarified using omnidirectional band structure", Opt. Express, 20,2012, p. 21773-p. 21783.
(Continued)

*Primary Examiner* — Xinning(Tom) Niu
(74) *Attorney, Agent, or Firm* — Faegre Drinker Biddle & Reath LLP

(57) ABSTRACT

A light-emitting device according to an embodiment includes a structure for increasing an optical confinement coefficient of a layer forming a resonance mode. The light-emitting device includes a first cladding layer, an active
(Continued)

layer, a second cladding layer, a resonance mode formation layer, and a high refractive index layer. The first cladding layer, the active layer, the second cladding layer, the resonance mode formation layer, and the high refractive index layer mainly contain nitride semiconductors. The high refractive index layer has a refractive index higher than that of any of the first cladding layer, the active layer, the second cladding layer, and the resonance mode formation layer, and has a superlattice structure in which two or more layers having refractive indices different from each other are repeatedly laminated.

28 Claims, 43 Drawing Sheets

(51) Int. Cl.
  *H01S 5/185* (2021.01)
  *H01S 5/343* (2006.01)
(58) Field of Classification Search
  CPC .... H01S 5/2009; H01S 5/2031; H01S 5/3213; H01S 5/42; B82Y 20/00
  See application file for complete search history.

(56) References Cited

U.S. PATENT DOCUMENTS

| | | | |
|---|---|---|---|
| 2008/0056320 A1* | 3/2008 | Takeuchi | B82Y 20/00 |
| | | | 372/45.01 |
| 2009/0175304 A1* | 7/2009 | Noda | H01S 5/183 |
| | | | 372/44.01 |
| 2011/0134941 A1* | 6/2011 | Hoshino | H01S 5/187 |
| | | | 372/7 |
| 2016/0036201 A1* | 2/2016 | Takiguchi | H01S 5/2018 |
| | | | 372/45.01 |

FOREIGN PATENT DOCUMENTS

| | | |
|---|---|---|
| JP | 2014-027264 A | 2/2014 |
| WO | WO-2010/109223 A1 | 9/2010 |
| WO | WO-2017/191320 A1 | 11/2017 |
| WO | WO-2018/030523 A1 | 2/2018 |

OTHER PUBLICATIONS

International Preliminary Report on Patentability dated Dec. 30, 2020 for PCT/JP2019/024339.
Takiguchi et al. "Principle of beam generation in on-chip 2D beam pattern projecting lasers," Optics Express, vol. 26 issue 8, 10787-10800, (2018), pp. 1-4. 14.

* cited by examiner

*Fig.9*
(a) 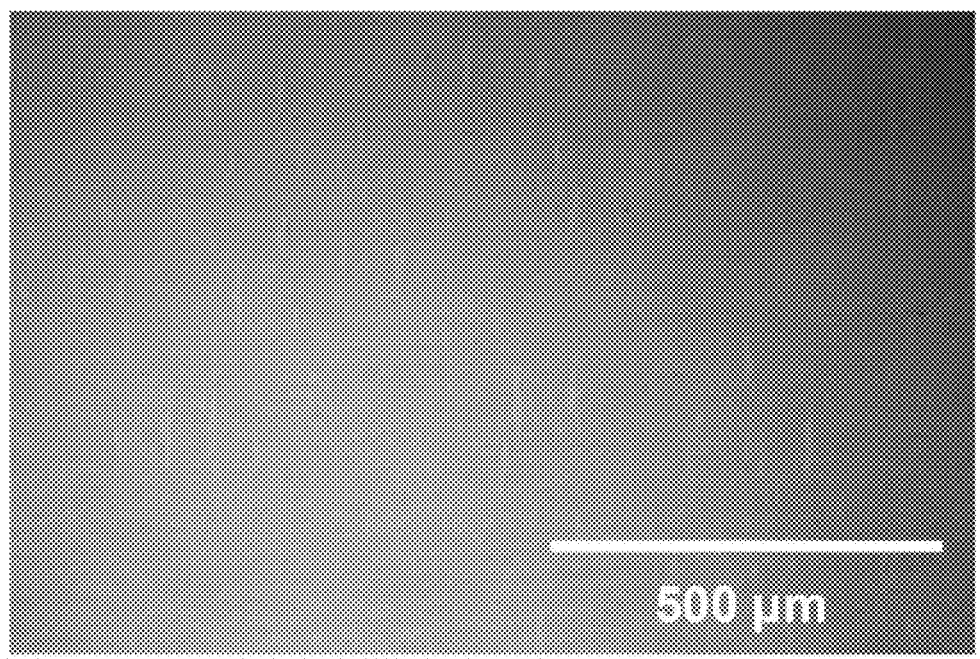
(b) 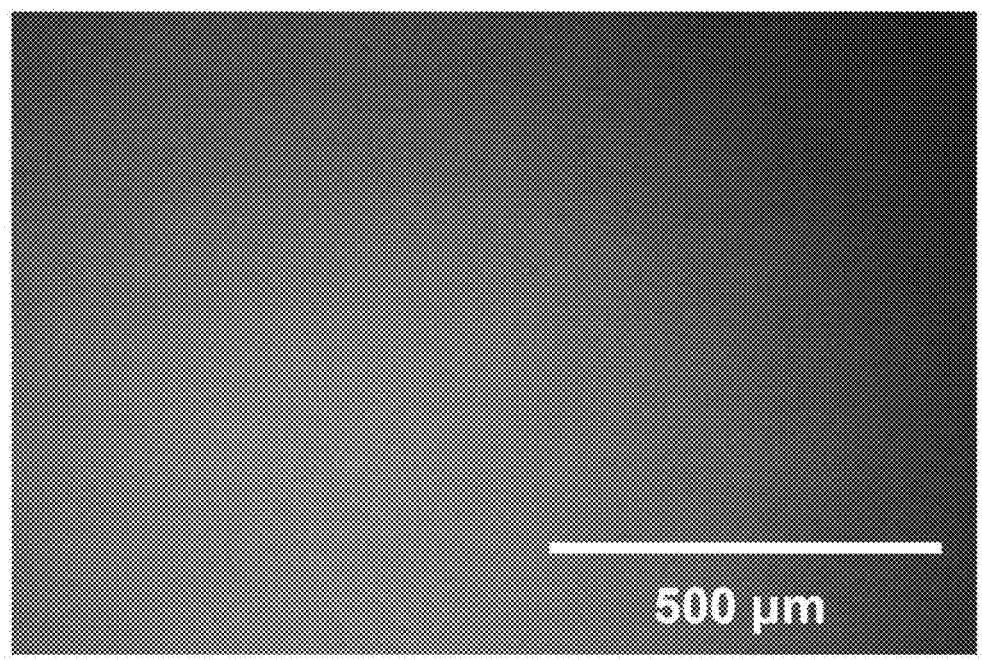

| A2 | A1 |
|---|---|
| A3 | A4 |

ORIGINAL IMAGE (b)

| A4<br><br>A2 ROTATION | A3<br><br>A1 ROTATION |
|---|---|
| A1<br><br>A3 ROTATION | A2<br><br>A4 ROTATION |

RESULTING BEAM PATTERN

Fig. 24

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.3 |
| 2 | p | AlGaN CLADDING LAYER (Al COMPOSITION 6%) | 500 | 2.5289 | 23.2 |
| 3 | p | AlGaN CARRIER BARRIER LAYER (Al COMPOSITION 18%) | 20 | 2.4808 | 2.3 |
| 4 | u/p | GaN GUIDE LAYER | 60 | 2.5549 | 8.4 |
| 5 | u/n | InGaN BARRIER LAYER (In COMPOSITION 1%) | 10 | 2.5704 | 1.5 |
| 6 | u/n | InGaN QUANTUM WELL LAYER (In COMPOSITION 10%) | 3 | 2.7724 | 0.6 |
| 7 | u/n | InGaN BARRIER LAYER (In COMPOSITION 1%) | 10 | 2.5704 | 1.5 |
| 8 | u/n | InGaN QUANTUM WELL LAYER (In COMPOSITION 10%) | 3 | 2.7724 | 0.3 |
| 9 | u/n | InGaN BARRIER LAYER (In COMPOSITION 1%) | 10 | 2.5704 | 1.5 |
| 10 | u/n | InGaN QUANTUM WELL LAYER (In COMPOSITION 10%) | 3 | 2.7724 | 0.6 |
| 11 | u/n | InGaN BARRIER LAYER (In COMPOSITION 1%) | 10 | 2.5704 | 1.3 |
| 12 | u/n | AlGaN CARRIER BARRIER LAYER (Al COMPOSITION 18%) | 10 | 2.4808 | 1.2 |
| 13 | u/n | GaN/InGaN (In COMPOSITION 0%) HIGH REFRACTIVE INDEX LAYER | (5/5)×3 | 2.5549/2.5549 | 3.1 |
| 14 | u/n | GaN GUIDE LAYER | 20 | 2.5549 | 1.6 |
| 15 | u/n | RESONANCE MODE FORMATION LAYER (GaN/HOLE, HOLE FF = 15%) | 70 | 2.3871 | 3.8 |
| 16 | u/n | GaN GUIDE LAYER | 20 | 2.5549 | 1.2 |
| 17 | u/n | InGaN (In COMPOSITION 0%)/N-GaN HIGH REFRACTIVE INDEX LAYER | (5/5)×7 | 2.5549/2.5549 | 5.2 |
| 18 | n | GaN LAYER GUIDE LAYER | 50 | 2.5549 | 4.1 |
| 19 | n | AlGaN CLADDING LAYER (Al COMPOSITION 6%) | 1200 | 2.5289 | 38.4 |
|  | n | GaN LAYER SUBSTRATE | — | — | — |

Fig. 25

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.2 |
| 2 | p | AlGaN CLADDING LAYER (Al COMPOSITION 6%) | 500 | 2.5289 | 23.8 |
| 3 | p | AlGaN CARRIER BARRIER LAYER (Al COMPOSITION 18%) | 20 | 2.4808 | 2.5 |
| 4 | u / p | GaN GUIDE LAYER | 60 | 2.5549 | 9.1 |
| 5 | u / n | InGaN BARRIER LAYER (In COMPOSITION 1%) | 10 | 2.5704 | 1.7 |
| 6 | u / n | InGaN QUANTUM WELL LAYER (In COMPOSITION 10%) | 3 | 2.7724 | 0.7 |
| 7 | u / n | InGaN BARRIER LAYER (In COMPOSITION 1%) | 10 | 2.5704 | 1.7 |
| 8 | u / n | InGaN QUANTUM WELL LAYER (In COMPOSITION 10%) | 3 | 2.7724 | 0.3 |
| 9 | u / n | InGaN BARRIER LAYER (In COMPOSITION 1%) | 10 | 2.5704 | 1.6 |
| 10 | u / n | InGaN QUANTUM WELL LAYER (In COMPOSITION 10%) | 3 | 2.7724 | 0.6 |
| 11 | u / n | InGaN BARRIER LAYER (In COMPOSITION 1%) | 10 | 2.5704 | 1.5 |
| 12 | u / n | AlGaN CARRIER BARRIER LAYER (Al COMPOSITION 18%) | 10 | 2.4808 | 1.4 |
| 13 | u / n | GaN/InGaN (In COMPOSITION 1%) HIGH REFRACTIVE INDEX LAYER | (5/5)×3 | 2.5549/2.5704 | 3.5 |
| 14 | u / n | GaN GUIDE LAYER | 20 | 2.5549 | 1.8 |
| 15 | u / n | RESONANCE MODE FORMATION LAYER (GaN/HOLE, HOLE FF = 15%) | 70 | 2.3871 | 4.4 |
| 16 | u / n | GaN GUIDE LAYER | 20 | 2.5549 | 1.4 |
| 17 | u / n | InGaN (In COMPOSITION 1%)/N-GaN HIGH REFRACTIVE INDEX LAYER | (5/5)×7 | 2.5704/2.5549 | 6.1 |
| 18 | n | GaN LAYER GUIDE LAYER | 50 | 2.5549 | 4.7 |
| 19 | n | AlGaN CLADDING LAYER (Al COMPOSITION 6%) | 1200 | 2.5289 | 32.9 |
|  | n | GaN LAYER SUBSTRATE | — | — | — |

Fig.26

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.2 |
| 2 | p | AlGaN CLADDING LAYER (Al COMPOSITION 6%) | 500 | 2.5289 | 23.1 |
| 3 | p | AlGaN CARRIER BARRIER LAYER (Al COMPOSITION 18%) | 20 | 2.4808 | 2.6 |
| 4 | u / p | GaN GUIDE LAYER | 60 | 2.5549 | 9.5 |
| 5 | u / n | InGaN BARRIER LAYER (In COMPOSITION 1%) | 10 | 2.5704 | 1.8 |
| 6 | u / n | InGaN QUANTUM WELL LAYER (In COMPOSITION 10%) | 3 | 2.7724 | 0.7 |
| 7 | u / n | InGaN BARRIER LAYER (In COMPOSITION 1%) | 10 | 2.5704 | 1.8 |
| 8 | u / n | InGaN QUANTUM WELL LAYER (In COMPOSITION 10%) | 3 | 2.7724 | 0.4 |
| 9 | u / n | InGaN BARRIER LAYER (In COMPOSITION 1%) | 10 | 2.5704 | 1.7 |
| 10 | u / n | InGaN QUANTUM WELL LAYER (In COMPOSITION 10%) | 3 | 2.7724 | 0.7 |
| 11 | u / n | InGaN BARRIER LAYER (In COMPOSITION 1%) | 10 | 2.5704 | 1.6 |
| 12 | u / n | AlGaN CARRIER BARRIER LAYER (Al COMPOSITION 18%) | 10 | 2.4808 | 1.5 |
| 13 | u / n | GaN/InGaN (In COMPOSITION 2%) HIGH REFRACTIVE INDEX LAYER | (5/5)×3 | 2.5549/2.5870 | 3.9 |
| 14 | u / n | GaN GUIDE LAYER | 20 | 2.5549 | 2.0 |
| 15 | u / n | RESONANCE MODE FORMATION LAYER (GaN/HOLE, HOLE FF = 15%) | 70 | 2.3871 | 5.0 |
| 16 | u / n | GaN GUIDE LAYER | 20 | 2.5549 | 1.6 |
| 17 | u / n | InGaN (In COMPOSITION 2%)/N-GaN HIGH REFRACTIVE INDEX LAYER | (5/5)×7 | 2.5870/2.5549 | 7.1 |
| 18 | n | GaN LAYER GUIDE LAYER | 50 | 2.5549 | 5.3 |
| 19 | n | AlGaN CLADDING LAYER (Al COMPOSITION 6%) | 1200 | 2.5289 | 29.6 |
|  | n | GaN LAYER SUBSTRATE | — | — | — |

Fig. 27

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.2 |
| 2 | p | AlGaN CLADDING LAYER (Al COMPOSITION 6%) | 500 | 2.5289 | 21.5 |
| 3 | p | AlGaN CARRIER BARRIER LAYER (Al COMPOSITION 18%) | 20 | 2.4808 | 2.6 |
| 4 | u / p | GaN GUIDE LAYER | 60 | 2.5549 | 9.6 |
| 5 | u / n | InGaN BARRIER LAYER (In COMPOSITION 1%) | 10 | 2.5704 | 1.8 |
| 6 | u / n | InGaN QUANTUM WELL LAYER (In COMPOSITION 10%) | 3 | 2.7724 | 0.7 |
| 7 | u / n | InGaN BARRIER LAYER (In COMPOSITION 1%) | 10 | 2.5704 | 1.9 |
| 8 | u / n | InGaN QUANTUM WELL LAYER (In COMPOSITION 10%) | 3 | 2.7724 | 0.4 |
| 9 | u / n | InGaN BARRIER LAYER (In COMPOSITION 1%) | 10 | 2.5704 | 1.8 |
| 10 | u / n | InGaN QUANTUM WELL LAYER (In COMPOSITION 10%) | 3 | 2.7724 | 0.7 |
| 11 | u / n | InGaN BARRIER LAYER (In COMPOSITION 1%) | 10 | 2.5704 | 1.7 |
| 12 | u / n | AlGaN CARRIER BARRIER LAYER (Al COMPOSITION 18%) | 10 | 2.4808 | 1.6 |
| 13 | u / n | GaN/InGaN (In COMPOSITION 3%) HIGH REFRACTIVE INDEX LAYER | (5/5)×3 | 2.5549/2.6047 | 4.2 |
| 14 | u / n | GaN GUIDE LAYER | 20 | 2.5549 | 2.2 |
| 15 | u / n | RESONANCE MODE FORMATION LAYER (GaN/HOLE, HOLE FF = 15%) | 70 | 2.3871 | 5.6 |
| 16 | u / n | GaN GUIDE LAYER | 20 | 2.5549 | 1.9 |
| 17 | u / n | InGaN (In COMPOSITION 3%)/N-GaN HIGH REFRACTIVE INDEX LAYER | (5/5)×7 | 2.6047/2.5549 | 8.3 |
| 18 | n | GaN LAYER GUIDE LAYER | 50 | 2.5549 | 6.0 |
| 19 | n | AlGaN CLADDING LAYER (Al COMPOSITION 6%) | 1200 | 2.5289 | 27.5 |
| | n | GaN LAYER SUBSTRATE | — | — | — |

Fig. 28

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 19.5 |
| 3 | p | AlGaN CARRIER BARRIER LAYER (Al COMPOSITION 18%) | 20 | 2.4808 | 2.5 |
| 4 | u/p | GaN GUIDE LAYER | 60 | 2.5549 | 9.6 |
| 5 | u/n | InGaN BARRIER LAYER (In COMPOSITION 1%) | 10 | 2.5704 | 1.8 |
| 6 | u/n | InGaN QUANTUM WELL LAYER (In COMPOSITION 10%) | 3 | 2.7724 | 0.8 |
| 7 | u/n | InGaN BARRIER LAYER (In COMPOSITION 1%) | 10 | 2.5704 | 1.9 |
| 8 | u/n | InGaN QUANTUM WELL LAYER (In COMPOSITION 10%) | 3 | 2.7724 | 0.4 |
| 9 | u/n | InGaN BARRIER LAYER (In COMPOSITION 1%) | 10 | 2.5704 | 1.9 |
| 10 | u/n | InGaN QUANTUM WELL LAYER (In COMPOSITION 10%) | 3 | 2.7724 | 0.7 |
| 11 | u/n | InGaN BARRIER LAYER (In COMPOSITION 1%) | 10 | 2.5704 | 1.8 |
| 12 | u/n | AlGaN CARRIER BARRIER LAYER (Al COMPOSITION 18%) | 10 | 2.4808 | 1.7 |
| 13 | u/n | GaN/InGaN (In COMPOSITION 4%) HIGH REFRACTIVE INDEX LAYER | (5/5)×3 | 2.5549/2.6237 | 4.4 |
| 14 | u/n | GaN GUIDE LAYER | 20 | 2.5549 | 2.3 |
| 15 | u/n | RESONANCE MODE FORMATION LAYER (GaN/HOLE, HOLE FF = 15%) | 70 | 2.3871 | 6.2 |
| 16 | u/n | GaN GUIDE LAYER | 20 | 2.5549 | 2.2 |
| 17 | u/n | InGaN (In COMPOSITION 4%)/N-GaN HIGH REFRACTIVE INDEX LAYER | (5/5)×7 | 2.6237/2.5549 | 9.7 |
| 18 | n | GaN LAYER GUIDE LAYER | 50 | 2.5549 | 6.8 |
| 19 | n | AlGaN CLADDING LAYER (Al COMPOSITION 6%) | 1200 | 2.5289 | 25.9 |
|  | n | GaN LAYER SUBSTRATE | – | – | – |

Fig. 29

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 17.0 |
| 3 | p | AlGaN CARRIER BARRIER LAYER (Al COMPOSITION 18%) | 20 | 2.4808 | 2.4 |
| 4 | u / p | GaN GUIDE LAYER | 60 | 2.5549 | 9.3 |
| 5 | u / n | InGaN BARRIER LAYER (In COMPOSITION 1%) | 10 | 2.5704 | 1.8 |
| 6 | u / n | InGaN QUANTUM WELL LAYER (In COMPOSITION 10%) | 3 | 2.7724 | 0.7 |
| 7 | u / n | InGaN BARRIER LAYER (In COMPOSITION 1%) | 10 | 2.5704 | 1.9 |
| 8 | u / n | InGaN QUANTUM WELL LAYER (In COMPOSITION 10%) | 3 | 2.7724 | 0.4 |
| 9 | u / n | InGaN BARRIER LAYER (In COMPOSITION 1%) | 10 | 2.5704 | 1.9 |
| 10 | u / n | InGaN QUANTUM WELL LAYER (In COMPOSITION 10%) | 3 | 2.7724 | 0.7 |
| 11 | u / n | InGaN BARRIER LAYER (In COMPOSITION 1%) | 10 | 2.5704 | 1.8 |
| 12 | u / n | AlGaN CARRIER BARRIER LAYER (Al COMPOSITION 18%) | 10 | 2.4808 | 1.7 |
| 13 | u / n | GaN/InGaN (In COMPOSITION 5%) HIGH REFRACTIVE INDEX LAYER | (5/5)×3 | 2.5549/2.6441 | 4.6 |
| 14 | u / n | GaN GUIDE LAYER | 20 | 2.5549 | 2.5 |
| 15 | u / n | RESONANCE MODE FORMATION LAYER (GaN/HOLE, HOLE FF = 15%) | 70 | 2.3871 | 6.8 |
| 16 | u / n | GaN GUIDE LAYER | 20 | 2.5549 | 2.5 |
| 17 | u / n | InGaN (In COMPOSITION 5%)/N-GaN HIGH REFRACTIVE INDEX LAYER | (5/5)×7 | 2.6441/2.5549 | 11.3 |
| 18 | n | GaN LAYER GUIDE LAYER | 50 | 2.5549 | 7.6 |
| 19 | n | AlGaN CLADDING LAYER (Al COMPOSITION 6%) | 1200 | 2.5289 | 24.9 |
|  | n | GaN LAYER SUBSTRATE | — | — | — |

Fig. 30

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | AlGaN CLADDING LAYER (Al COMPOSITION 6%) | 500 | 2.5289 | 14.4 |
| 3 | p | AlGaN CARRIER BARRIER LAYER (Al COMPOSITION 18%) | 20 | 2.4808 | 2.2 |
| 4 | u/p | GaN GUIDE LAYER | 60 | 2.5549 | 8.8 |
| 5 | u/n | InGaN BARRIER LAYER (In COMPOSITION 1%) | 10 | 2.5704 | 1.8 |
| 6 | u/n | InGaN QUANTUM WELL LAYER (In COMPOSITION 10%) | 3 | 2.7724 | 0.7 |
| 7 | u/n | InGaN BARRIER LAYER (In COMPOSITION 1%) | 10 | 2.5704 | 1.9 |
| 8 | u/n | InGaN QUANTUM WELL LAYER (In COMPOSITION 10%) | 3 | 2.7724 | 0.4 |
| 9 | u/n | InGaN BARRIER LAYER (In COMPOSITION 1%) | 10 | 2.5704 | 1.9 |
| 10 | u/n | InGaN QUANTUM WELL LAYER (In COMPOSITION 10%) | 3 | 2.7724 | 0.7 |
| 11 | u/n | InGaN BARRIER LAYER (In COMPOSITION 1%) | 10 | 2.5704 | 1.8 |
| 12 | u/n | AlGaN CARRIER BARRIER LAYER (Al COMPOSITION 18%) | 10 | 2.4808 | 1.7 |
| 13 | u/n | GaN/InGaN (In COMPOSITION 6%) HIGH REFRACTIVE INDEX LAYER | (5/5)×3 | 2.5549/2.6660 | 4.8 |
| 14 | u/n | GaN GUIDE LAYER | 20 | 2.5549 | 2.6 |
| 15 | u/n | RESONANCE MODE FORMATION LAYER (GaN/HOLE, HOLE FF = 15%) | 70 | 2.3871 | 7.5 |
| 16 | u/n | GaN GUIDE LAYER | 20 | 2.5549 | 2.8 |
| 17 | u/n | InGaN (In COMPOSITION 6%)/N-GaN HIGH REFRACTIVE INDEX LAYER | (5/5)×7 | 2.6660/2.5549 | 13.2 |
| 18 | n | GaN LAYER GUIDE LAYER | 50 | 2.5549 | 8.6 |
| 19 | n | AlGaN CLADDING LAYER (Al COMPOSITION 6%) | 1200 | 2.5289 | 24.0 |
| | n | GaN LAYER SUBSTRATE | — | — | — |

Fig. 31

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.1 |
| 2 | p | IGaN CLADDING LAYER (Al COMPOSITION 6%) | 500 | 2.5289 | 11.8 |
| 3 | p | AlGaN CARRIER BARRIER LAYER (Al COMPOSITION 18%) | 20 | 2.4808 | 2.0 |
| 4 | u / p | GaN GUIDE LAYER | 60 | 2.5549 | 8.2 |
| 5 | u / n | InGaN BARRIER LAYER (In COMPOSITION 1%) | 10 | 2.5704 | 1.7 |
| 6 | u / n | InGaN QUANTUM WELL LAYER (In COMPOSITION 10%) | 3 | 2.7724 | 0.7 |
| 7 | u / n | InGaN BARRIER LAYER (In COMPOSITION 1%) | 10 | 2.5704 | 1.8 |
| 8 | u / n | InGaN QUANTUM WELL LAYER (In COMPOSITION 10%) | 3 | 2.7724 | 0.4 |
| 9 | u / n | InGaN BARRIER LAYER (In COMPOSITION 1%) | 10 | 2.5704 | 1.8 |
| 10 | u / n | InGaN QUANTUM WELL LAYER (In COMPOSITION 10%) | 3 | 2.7724 | 0.7 |
| 11 | u / n | InGaN BARRIER LAYER (In COMPOSITION 1%) | 10 | 2.5704 | 1.8 |
| 12 | u / n | AlGaN CARRIER BARRIER LAYER (Al COMPOSITION 18%) | 10 | 2.4808 | 1.7 |
| 13 | u / n | GaN/InGaN (In COMPOSITION 7%) HIGH REFRACTIVE INDEX LAYER | (5/5)×3 | 2.5549/2.6896 | 4.9 |
| 14 | u / n | GaN GUIDE LAYER | 20 | 2.5549 | 2.7 |
| 15 | u / n | RESONANCE MODE FORMATION LAYER (GaN/HOLE, HOLE FF = 15%) | 70 | 2.3871 | 8.1 |
| 16 | u / n | GaN GUIDE LAYER | 20 | 2.5549 | 3.2 |
| 17 | u / n | InGaN (In COMPOSITION 7%)/N-GaN HIGH REFRACTIVE INDEX LAYER | (5/5)×7 | 2.6896/2.5549 | 15.4 |
| 18 | n | GaN LAYER GUIDE LAYER | 50 | 2.5549 | 9.7 |
| 19 | n | AlGaN CLADDING LAYER (Al COMPOSITION 6%) | 1200 | 2.5289 | 23.2 |
|  | n | GaN LAYER SUBSTRATE | — | — | — |

Fig. 32

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.0 |
| 2 | p | AlGaN CLADDING LAYER (Al COMPOSITION 6%) | 500 | 2.5289 | 9.4 |
| 3 | p | AlGaN CARRIER BARRIER LAYER (Al COMPOSITION 18%) | 20 | 2.4808 | 1.7 |
| 4 | u/p | GaN GUIDE LAYER | 60 | 2.5549 | 7.5 |
| 5 | u/n | InGaN BARRIER LAYER (In COMPOSITION 1%) | 10 | 2.5704 | 1.6 |
| 6 | u/n | InGaN QUANTUM WELL LAYER (In COMPOSITION 10%) | 3 | 2.7724 | 0.7 |
| 7 | u/n | InGaN BARRIER LAYER (In COMPOSITION 1%) | 10 | 2.5704 | 1.7 |
| 8 | u/n | InGaN QUANTUM WELL LAYER (In COMPOSITION 10%) | 3 | 2.7724 | 0.3 |
| 9 | u/n | InGaN BARRIER LAYER (In COMPOSITION 1%) | 10 | 2.5704 | 1.8 |
| 10 | u/n | InGaN QUANTUM WELL LAYER (In COMPOSITION 10%) | 3 | 2.7724 | 0.7 |
| 11 | u/n | InGaN BARRIER LAYER (In COMPOSITION 1%) | 10 | 2.5704 | 1.7 |
| 12 | u/n | AlGaN CARRIER BARRIER LAYER (Al COMPOSITION 18%) | 10 | 2.4808 | 1.7 |
| 13 | u/n | GaN/InGaN (In COMPOSITION 8%) HIGH REFRACTIVE INDEX LAYER | (5/5)×3 | 2.5549/2.7150 | 4.9 |
| 14 | u/n | GaN GUIDE LAYER | 20 | 2.5549 | 2.8 |
| 15 | u/n | RESONANCE MODE FORMATION LAYER (GaN/HOLE, HOLE FF = 15%) | 70 | 2.3871 | 8.8 |
| 16 | u/n | GaN GUIDE LAYER | 20 | 2.5549 | 3.7 |
| 17 | u/n | InGaN (In COMPOSITION 8%)/N-GaN HIGH REFRACTIVE INDEX LAYER | (5/5)×7 | 2.7150/2.5549 | 17.8 |
| 18 | n | GaN LAYER GUIDE LAYER | 50 | 2.5549 | 10.8 |
| 19 | n | AlGaN CLADDING LAYER (Al COMPOSITION 6%) | 1200 | 2.5289 | 22.3 |
|  | n | GaN LAYER SUBSTRATE | — | — | — |

Fig. 33

| LAYER NUMBER | CONDUCTIVITY TYPE | LAYER STRUCTURE | FILM THICKNESS (nm) | REFRACTIVE INDEX | Γ(%) |
|---|---|---|---|---|---|
| 1 | p | GaN CONTACT LAYER | 100 | 2.5549 | 0.0 |
| 2 | p | AlGaN CLADDING LAYER (Al COMPOSITION 6%) | 500 | 2.5289 | 7.2 |
| 3 | p | AlGaN CARRIER BARRIER LAYER (Al COMPOSITION 18%) | 20 | 2.4808 | 1.5 |
| 4 | u / p | GaN GUIDE LAYER | 60 | 2.5549 | 6.7 |
| 5 | u / n | InGaN BARRIER LAYER (In COMPOSITION 1%) | 10 | 2.5704 | 1.5 |
| 6 | u / n | InGaN QUANTUM WELL LAYER (In COMPOSITION 10%) | 3 | 2.7724 | 0.6 |
| 7 | u / n | InGaN BARRIER LAYER (In COMPOSITION 1%) | 10 | 2.5704 | 1.6 |
| 8 | u / n | InGaN QUANTUM WELL LAYER (In COMPOSITION 10%) | 3 | 2.7724 | 0.3 |
| 9 | u / n | InGaN BARRIER LAYER (In COMPOSITION 1%) | 10 | 2.5704 | 1.7 |
| 10 | u / n | InGaN QUANTUM WELL LAYER (In COMPOSITION 10%) | 3 | 2.7724 | 0.7 |
| 11 | u / n | InGaN BARRIER LAYER (In COMPOSITION 1%) | 10 | 2.5704 | 1.7 |
| 12 | u / n | AlGaN CARRIER BARRIER LAYER (Al COMPOSITION 18%) | 10 | 2.4808 | 1.7 |
| 13 | u / n | GaN/InGaN (In COMPOSITION 9%) HIGH REFRACTIVE INDEX LAYER | (5/5)×3 | 2.5549/2.7425 | 4.9 |
| 14 | u / n | GaN GUIDE LAYER | 20 | 2.5549 | 2.9 |
| 15 | u / n | RESONANCE MODE FORMATION LAYER (GaN/HOLE, HOLE FF = 15%) | 70 | 2.3871 | 9.4 |
| 16 | u / n | GaN GUIDE LAYER | 20 | 2.5549 | 4.2 |
| 17 | u / n | InGaN (In COMPOSITION 9%)/N-GaN HIGH REFRACTIVE INDEX LAYER | (5/5)×7 | 2.7425/2.5549 | 20.4 |
| 18 | n | GaN LAYER GUIDE LAYER | 50 | 2.5549 | 11.9 |
| 19 | n | AlGaN CLADDING LAYER (Al COMPOSITION 6%) | 1200 | 2.5289 | 21.3 |
|  | n | GaN LAYER SUBSTRATE | — | — | — |

LIGHT-EMITTING DEVICE

TECHNICAL FIELD

The present invention relates to a light-emitting device.

BACKGROUND ART

Patent Document 1 describes a technology related to a surface emitting laser. The surface emitting laser includes a lamination portion in which a first cladding layer, a two-dimensional photonic crystal layer, an active layer, and a second cladding layer are sequentially laminated. The active layer is composed of a barrier layer and a well layer. The two-dimensional photonic crystal layer has a structure in which media having different refractive indices are periodically arranged. This surface emitting laser has a resonance mode in an in-plane direction of the two-dimensional photonic crystal layer. Furthermore, this surface emitting laser includes a light inducement layer. The light inducement layer has a refractive index higher than that of any of the barrier layer, the first cladding layer, and the second cladding layer, and has a band gap wider than that of the well layer. The light inducement layer is provided between the two-dimensional photonic crystal layer and the active layer or between the two-dimensional photonic crystal layer and the first cladding layer.

CITATION LIST

Patent Literature

Patent Document 1: Japanese Unexamined Patent Publication No. 2010-109223

Non-Patent Literature

Non-Patent Document 1: Y. Kurosaka et al., "Effects of non-lasing band in two-dimensional photonic-crystal lasers clarified using omnidirectional band structure," Opt. Express 20, 21773-21783 (2012)

SUMMARY OF INVENTION

Technical Problem

The inventors have found the following problems as a result of examining the above-described conventional technology. That is, in a surface emitting type light-emitting device that outputs laser light in a direction intersecting with a main surface of a substrate, a layer (e.g., a photonic crystal layer) that forms a resonance mode in a direction along the main surface of the substrate is sometimes provided in the vicinity of the active layer. In that case, in order to minimize the threshold current as much as possible, it is required to increase the optical confinement coefficient in the layer forming the resonant mode. In the case of a light-emitting device in a near infrared region (0.9 to 1.1 jam) mainly containing a GaAs-based semiconductor, for example, the optical confinement coefficient of the layer forming the resonance mode is 20% or more, and a relatively good threshold current value (threshold current density<1 kA/cm 2) is obtained. However, in the case of a light-emitting device in the ultraviolet region to the blue region mainly containing a nitride semiconductor such as GaN, if the layer structure is the same as that of a light-emitting device mainly containing a GaAs-based semiconductor, the optical confinement coefficient of the layer forming a resonant mode remains about 2 to 3% due to the characteristics of the material. In this case, the threshold current value becomes extremely large, and it becomes difficult to obtain a practical light-emitting device capable of continuously oscillating. When the optical confinement coefficient is thus small, the stability of an oscillation mode may also decrease.

The present invention has been made to solve the above problems, and an object of the present invention is to improve the optical confinement coefficient of a layer that forms a resonant mode in a surface emitting type light-emitting device that mainly includes a nitride semiconductor and includes a layer that forms the resonant mode.

Solution to Problem

In order to solve the above-mentioned problems, the light-emitting device according to the present embodiment includes at least a substrate, a first cladding layer, an active layer, a second cladding layer, a resonance mode formation layer, and a high refractive index layer. The substrate has a main surface. The active layer is provided on the main surface. The second cladding layer is provided on the first cladding layer. The second cladding layer is provided on the active layer. The resonance mode formation layer is provided between the first cladding layer and the active layer or between the active layer and the second cladding layer. The resonance mode formation layer includes a base layer and a plurality of modified refractive index regions having a refractive index different from a refractive index of the base layer and distributed two-dimensionally on a design surface orthogonal to the normal of the main surface. The high refractive index layer is provided between the first cladding layer and the second cladding layer, has a refractive index higher than that of any of the first cladding layer, the second cladding layer, and the resonance mode formation layer. The high refractive index layer is provided in at least one of a space where the resonance mode formation layer is sandwiched between the high refractive index layer and the active layer, and a space where the high refractive index layer is sandwiched between the active layer and the resonance mode formation layer. The first cladding layer, the active layer, the second cladding layer, the resonance mode formation layer, and the high refractive index layer mainly contain nitride semiconductors. Furthermore, the high refractive index layer has a superlattice structure in which two or more layers having refractive indices different from each other are repeatedly laminated along the normal direction of the main surface.

Advantageous Effects of Invention

According to the present embodiment, it is possible to improve the optical confinement coefficient of a layer that forms a resonant mode in a surface emitting type light-emitting device that mainly includes a nitride semiconductor and includes a layer that forms the resonant mode.

BRIEF DESCRIPTION OF DRAWINGS

FIGS. 9A and 9B are surface photographs of a GaN layer.

FIGS. 19A and 19B are diagrams for explaining points to be noted of a case of calculation using a general discrete Fourier transform (or fast Fourier transform) when determining an arrangement of the modified refractive index region 15b.

FIG. 24 is a table showing a specific layer structure of the surface emitting laser element.

FIG. 25 is a table showing a specific layer structure of the surface emitting laser element.

FIG. 26 is a table showing a specific layer structure of the surface emitting laser element.

FIG. 27 is a table showing a specific layer structure of the surface emitting laser element.

FIG. 28 is a table showing a specific layer structure of the surface emitting laser element.

FIG. 29 is a table showing a specific layer structure of the surface emitting laser element.

FIG. 30 is a table showing a specific layer structure of the surface emitting laser element.

FIG. 31 is a table showing a specific layer structure of the surface emitting laser element.

FIG. 32 is a table showing a specific layer structure of the surface emitting laser element.

FIG. 33 is a table showing a specific layer structure of the surface emitting laser element.

DESCRIPTION OF EMBODIMENTS

Figure 1:
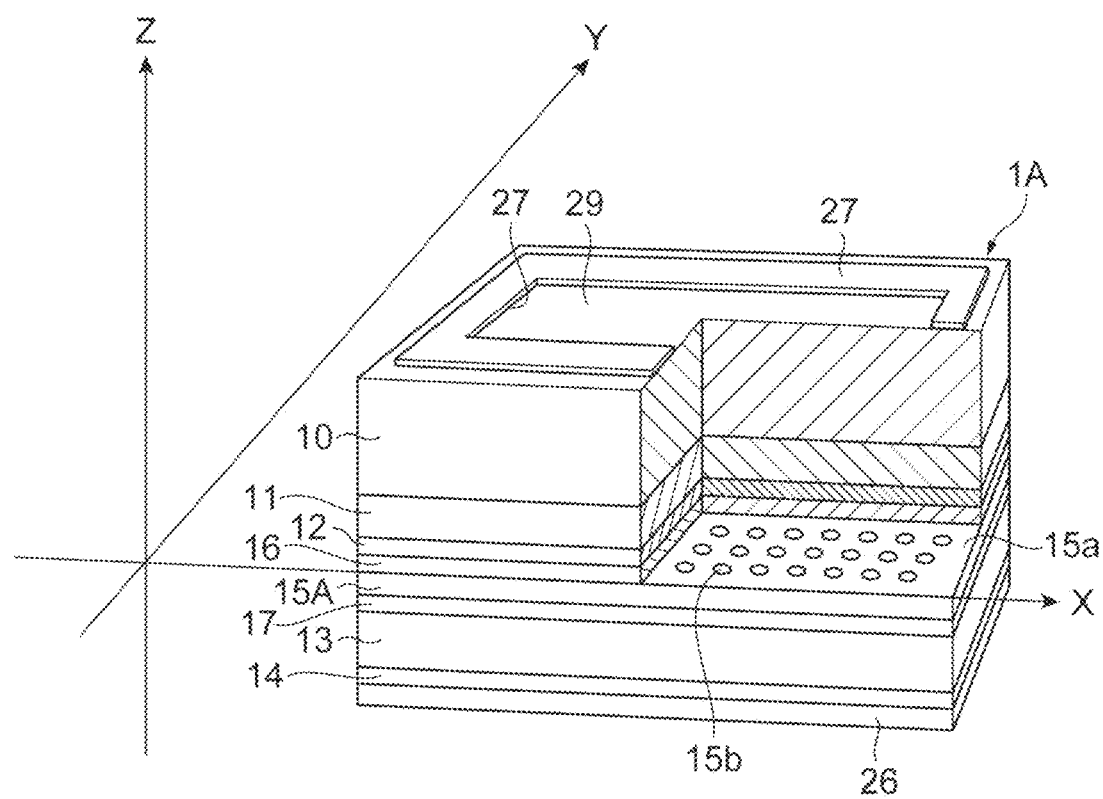
FIG. 1 is a perspective view showing a configuration of a surface emitting laser element 1A as a light-emitting device according to a first embodiment of the present invention.

Description of Embodiments of Invention of This Application

First, contents of the embodiments of the invention of this application will be individually listed and described.

(1) The light-emitting device according to the present embodiment includes, as one aspect thereof, at least a substrate, a first cladding layer, an active layer, a second cladding layer, a resonance mode formation layer, and a high refractive index layer. The substrate has a main surface. The active layer is provided on the main surface. The second cladding layer is provided on the first cladding layer. The second cladding layer is provided on the active layer. The resonance mode formation layer is provided between the first cladding layer and the active layer or between the active layer and the second cladding layer. The resonance mode formation layer includes a base layer and a plurality of modified refractive index regions having a refractive index different from a refractive index of the base layer and distributed two-dimensionally on a design surface orthogonal to the normal of the main surface. The high refractive index layer is provided between the first cladding layer and the second cladding layer, has a refractive index higher than that of any of the first cladding layer, the second cladding layer, and the resonance mode formation layer. The high refractive index layer is provided in at least one of a space where the resonance mode formation layer is sandwiched between the high refractive index layer and the active layer, and a space where the high refractive index layer is sandwiched between the active layer and the resonance mode formation layer. The first cladding layer, the active layer, the second cladding layer, the resonance mode formation layer, and the high refractive index layer mainly contain nitride semiconductors. Furthermore, the high refractive index layer has a superlattice structure in which two or more layers having refractive indices different from each other are repeatedly laminated along the normal direction of the main surface.

In the light-emitting device having the structure described above, the light outputted from the active layer reaches the resonance mode formation layer while being confined between the first cladding layer and the second cladding layer. In the resonance mode formation layer, a resonance mode is formed in a direction along the main surface of the substrate, and laser light of a mode corresponding to the arrangement state of a plurality of modified refractive index regions is generated. The laser light travels in a direction intersecting with the main surface of the substrate, and is outputted to the outside from the surface on the first cladding layer side or the second cladding layer side of the light-emitting device. The light-emitting device having the structure described above further includes a high refractive index layer having a refractive index higher than that of the first cladding layer, the second cladding layer, and the resonance mode formation layer. The high refractive index layer is provided in the vicinity of the resonance mode formation layer (e.g., a position where the resonance mode formation layer is sandwiched between the refractive index layer and the active layer, or a position sandwiched between the active layer and the resonance mode formation layer). Since the high refractive index layer has an optical confinement coefficient larger than the surrounding layers have, the optical confinement coefficient of the resonance mode formation layer located in the vicinity of the high refractive index layer also becomes large under the influence thereof. Therefore, according to the light-emitting device of one aspect of the present embodiment, the optical confinement coefficient of the layer forming the resonance mode can be increased.

The first cladding layer, the active layer, the second cladding layer, the resonance mode formation layer, and the high refractive index layer mainly contain nitride semiconductors. In a case where a nitride semiconductor is applied, when a plurality of layers having different compositions from each other are laminated, defects due to differences in lattice constant and thermal expansion coefficient are more likely to occur compared with typical compound semiconductors such as GaAs-based and InP-based semiconductors. In particular, when it is attempted to form thick a high refractive index layer, it is difficult to obtain a good-quality layer structure due to strain caused by a difference in lattice constant with the substrate material. However, if the high refractive index layer is made thin, the effect of increasing the optical confinement coefficient of the resonance mode formation layer becomes limited. Therefore, in the light-emitting device according to one aspect of the present embodiment, the high refractive index layer has a superlattice structure in which two or more layers having refractive indices different from each other are repeatedly laminated. Thus, by alternately growing the layer having a large refractive index and the layer having a small refractive index, the strain caused by the difference in lattice constant can be dispersed. As a result, it is possible to easily realize a high refractive index layer having a sufficient thickness as a whole while reducing defects caused by distortion.

(2) As one aspect of the present embodiment, the resonant mode formation layer preferably includes a photonic crystal layer in which a plurality of modified refractive index regions is periodically arranged. The light outputted from the active layer reaches the photonic crystal layer while being confined between the first cladding layer and the second cladding layer. In the photonic crystal layer, a resonance mode is formed in a direction along the main surface of the substrate, and light oscillates at a wavelength corresponding to an array period of the plurality of modified refractive index regions, thereby generating laser light. For example, when the array period in a square lattice crystal is a length of one wavelength of light, a part of the laser light is diffracted in a direction perpendicular to the main surface of the substrate, and is outputted to the outside from the surface on the first cladding layer side or the second cladding layer side of the light-emitting device.

(3) As one aspect of the present embodiment, in order to output light for forming an optical image along the normal direction of the main surface of the substrate, the tilt direction intersecting the normal direction, or both the normal direction and the tilt direction, the barycentric positions of the plurality of modified refractive index regions may be individually adjusted. That is, as an example of barycentric adjustment of the modified refractive index region, in a virtual square lattice set on the design surface of the resonance mode formation layer, at least one modified refractive index region of the plurality of modified refractive index regions is associated with each lattice point of the virtual square lattice. The center of gravity of each of the plurality of modified refractive index regions may be arranged at a position having a rotation angle corresponding to the optical image centered on the corresponding lattice point in a state of being separated from the corresponding lattice point. The light outputted from the active layer reaches the resonance mode formation layer while being confined between the first cladding layer and the second cladding layer. In the resonance mode formation layer, the centers of gravity of the plurality of modified refractive index regions have a rotation angle set for each modified refractive index region centered on a lattice point of the virtual square lattice. In such a case, as compared with the case where the centers of gravity of the plurality of modified refractive index regions are located on the lattice point of the square lattice, the light intensity of light (zero-order light) outputted along the normal direction of the main surface of the substrate is reduced, and the light intensity of high-order light (e.g., +1 order light and −1 order light) outputted along the tilt direction intersecting with the normal direction is increased. Furthermore, since the center of gravity of each modified refractive index region has a rotation angle corresponding to the optical image, the phase of light can be modulated for each modified refractive index region. Therefore, according to the light-emitting device, it is possible to output light for forming an optical image of any shape along the tilt direction intersecting with the normal direction of the main surface of the substrate.

(4) As one aspect of the present embodiment, the adjustment of the barycentric position of each of the plurality of modified refractive index regions is not limited to the above-described example. As another example of barycentric adjustment of the modified refractive index region, in a virtual square lattice set on the design surface of the resonance mode formation layer, at least one modified refractive index region of the plurality of modified refractive index regions is associated with each lattice point of the virtual square lattice. The center of gravity of each of the plurality of modified refractive index regions may be arranged on a straight line passing through the corresponding lattice point and tilted with respect to the square lattice in a state where the distance between the center of gravity and the corresponding lattice point is individually set according to the optical image. The light outputted from the active layer is efficiently distributed between the first cladding layer and the second cladding layer, and also distributed in the resonance mode formation layer. In the resonance mode formation layer, the center of gravity of each of the plurality of modified refractive index regions is arranged on a straight line passing through the corresponding lattice point of the virtual square lattice and tilted with respect to the square lattice. Then, the distance between the center of gravity of each modified refractive index region and the corresponding lattice point is individually set according to the optical image. Also in such a case, the light intensity of light (zero-order light) outputted along the normal direction of the main surface of the substrate is reduced, and the light intensity of high-order light (e.g., +1 order light and −1 order light) outputted along the tilt direction intersecting with the normal direction is increased. Furthermore, since the distance between the center of gravity of each modified refractive index region and the corresponding lattice point is individually set according to the optical image, the phase of light can be modulated for each modified refractive index region. Therefore, according to the light-emitting device, it is possible to output light that forms an optical image of any shape along a tilt direction intersecting with the normal direction of the main surface of the substrate.

(5) As one aspect of the present embodiment, the first cladding layer, the second cladding layer, and the base layer may be a GaN layer or an AlGaN layer. In this case, at least one of the two or more layers of the high refractive index layer is preferably a nitride semiconductor layer containing In. Accordingly, it is possible to preferably realize the high refractive index layer having a refractive index higher than that of the first cladding layer, the second cladding layer, and the photonic crystal layer (or the phase modulation layer). Furthermore, as one aspect of the present embodiment, at least one layer of the high refractive index layers may further contain AL. The larger the AL composition becomes, the lower the refractive index of the high refractive index layer becomes, but the band gap becomes wider and the light transmittivity can be enhanced. The inclusion of AL can reduce the lattice constant due to the nitride semiconductor layer containing In, and bring it close to the lattice constant of GaN of the base layer, thereby making the effect of strain relaxation expected.

(6) As one aspect of the present embodiment, the active layer has a multiple quantum well structure in which quantum well layers and barrier layers are alternately laminated along the normal direction. In this case, the band gap of at least one layer of the high refractive index layer is preferably wider than the band gap of the quantum well layer. This allows electric carriers to be efficiently confined in the quantum well layer of the active layer. As one aspect of the present embodiment, the quantum well layer is preferably a nitride semiconductor layer containing In. Furthermore, the In composition of at least one layer of the high refractive index layer is preferably smaller than the In composition of the quantum well layer. It is to be noted that "In composition" refers to the percentage of the molar ratio with respect to the all dopants contained in the nitride semiconductor. Such a configuration allows the band gap of at least one layer to be made wider than the band gap of the quantum well layer. Specifically, as one aspect of the present embodiment, the In composition of at least one layer of the high refractive index layer is preferably 2% or more. This allows the refractive index of the high refractive index layer to be sufficiently increased with respect to the refractive index of the surrounding, and the optical confinement coefficient of the layer forming the resonance mode to be increased.

Thus, each aspect listed in this [Description of Embodiments of Invention of This Application] column is applicable to each of all remaining aspects or to all combinations of these remaining aspects.

Details of Embodiments of Invention of This Application

Hereinafter, a specific structure of the light-emitting device according to the present embodiment will be described in detail with reference to the accompanying drawings. It is to be noted that the present invention is not limited to these examples, but is shown by the claims, and is intended to include all variations within the meaning and scope equivalent of the claims In addition, in the description of the drawings, identical elements are given identical reference numerals and redundant description is omitted.

First Embodiment

Figure 2:
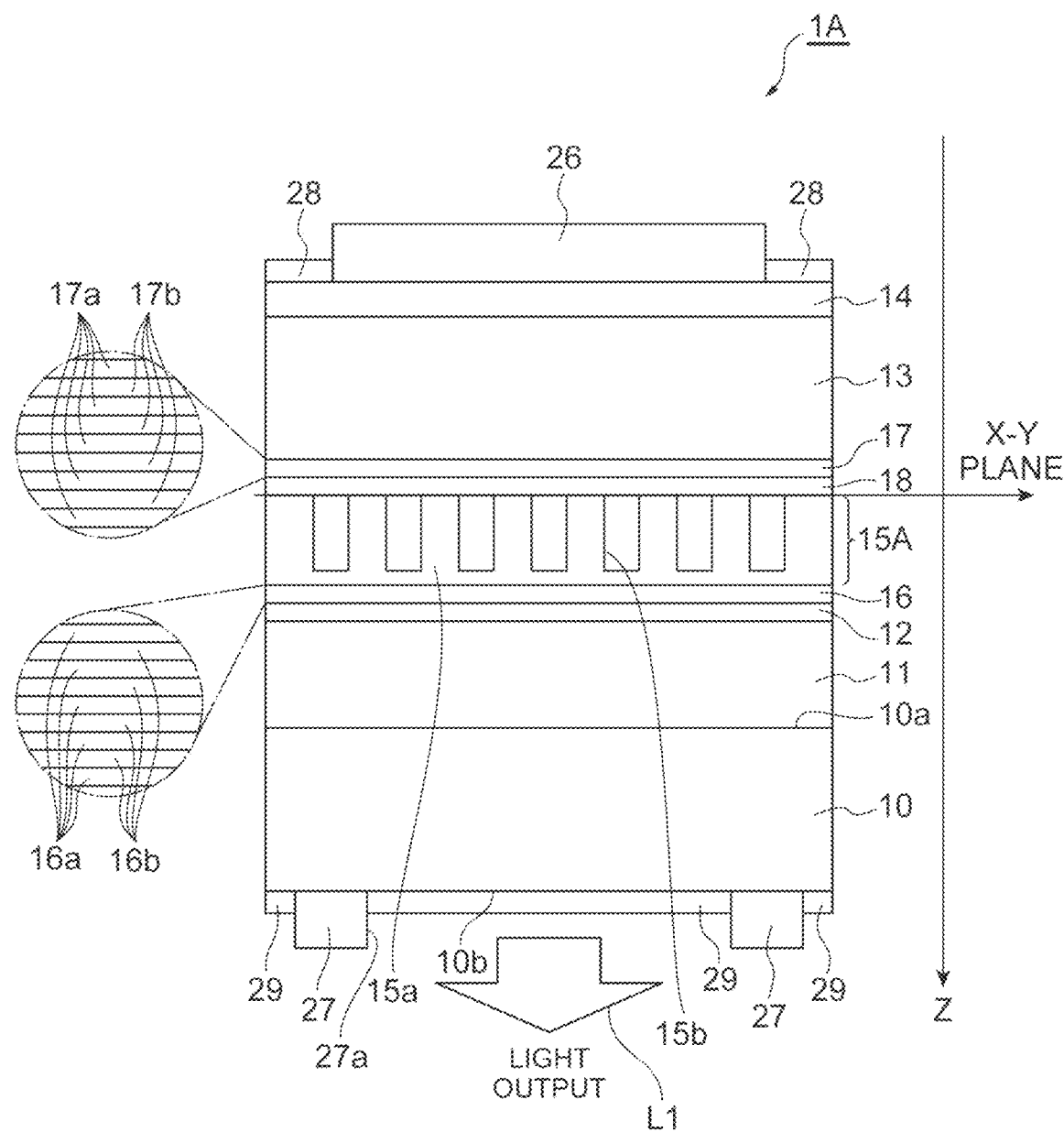
FIG. 2 is a diagram schematically showing a cross-sectional structure of the surface emitting laser element 1A.

FIG. 1 is a perspective view showing the configuration of the surface emitting laser element 1A as a light-emitting device according to a first embodiment of the present invention. FIG. 2 is a diagram schematically showing a cross-sectional structure of the surface emitting laser element 1A. It is to be noted that an XYZ orthogonal coordinate system in which an axis extending in the thickness direction of the surface emitting laser element 1A is the Z-axis is defined. The surface emitting laser element 1A forms a standing wave along a direction defined on X-Y, plane and outputs laser light L1 in a direction (Z-axis direction) perpendicular to the main surface of a semiconductor substrate 10.

The surface emitting laser element 1A is a photonic crystal surface emitting laser (PCSEL). The surface emitting laser element 1A includes the semiconductor substrate 10, a cladding layer 11 (first cladding layer) provided on a main surface 10a of the semiconductor substrate 10, an active layer 12 provided on the cladding layer 11, a cladding layer 13 (second cladding layer) provided on the active layer 12, and a contact layer 14 provided on the cladding layer 13. Furthermore, the surface emitting laser element 1A includes a photonic crystal layer 15A, high refractive index layers 16 and 17, and a guide layer 18. Laser light is outputted from a back surface 10b of the semiconductor substrate 10.

The semiconductor substrate 10, the cladding layers 11 and 13, the active layer 12, the contact layer 14, the photonic crystal layer 15A, the high refractive index layers 16 and 17, and the guide layer 18 mainly contain nitride semiconductors. The energy band gap of the cladding layer 11 and the energy band gap of the cladding layer 13 are wider than the energy band gap of the active layer 12. The thickness directions of the semiconductor substrate 10, the cladding layers 11 and 13, the active layer 12, the contact layer 14, the photonic crystal layer 15A, the high refractive index layers 16 and 17, and the guide layer 18 coincide with the Z-axis direction.

If necessary, a light guide layer for adjusting the light distribution may be included between the cladding layer 11 and the cladding layer 13. The light guide layer may include a carrier barrier layer for efficiently confining carriers into the active layer 12.

Figure 3:
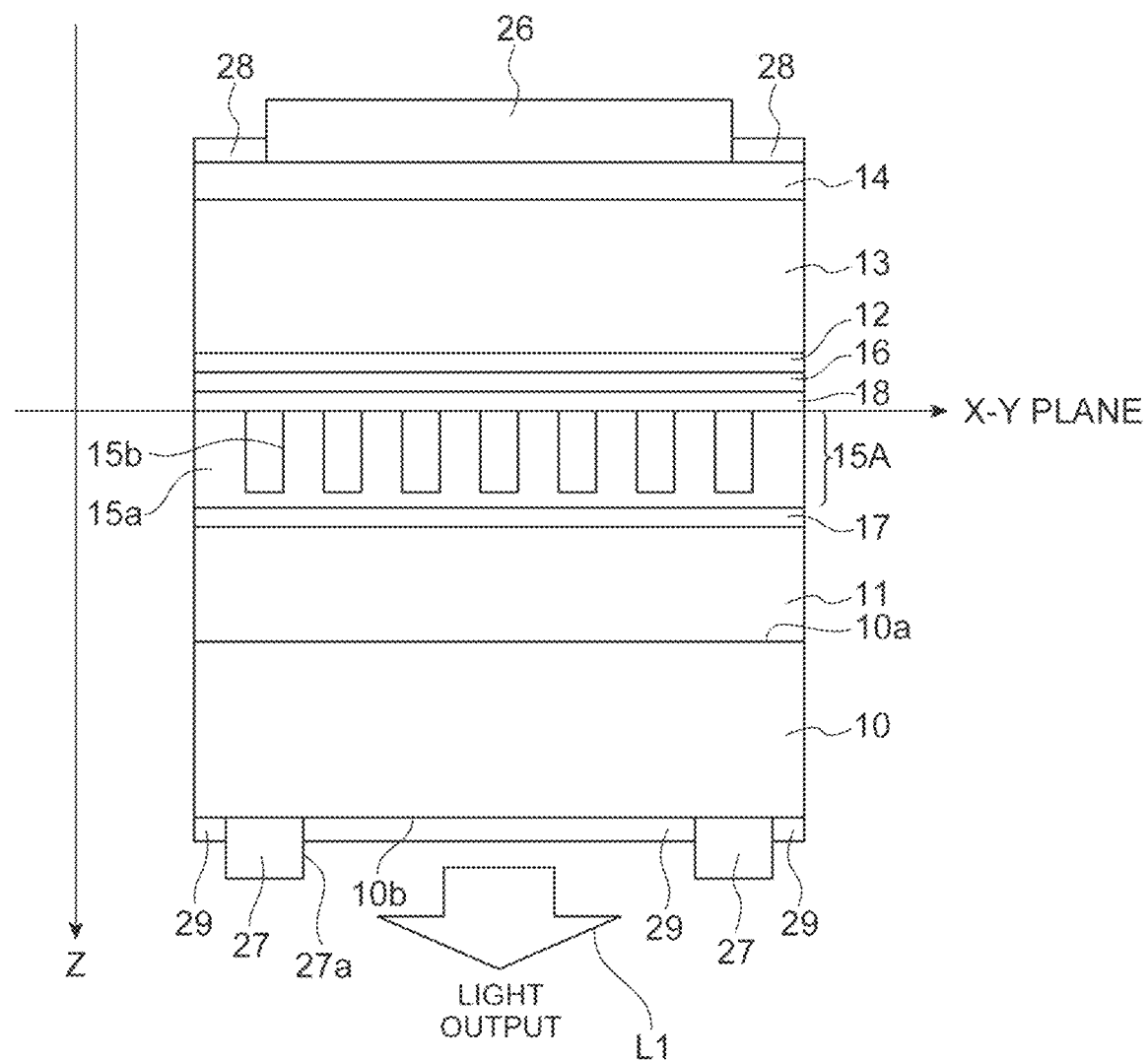
FIG. 3 is a diagram schematically showing a cross-sectional structure of the surface emitting laser element 1A.

In the examples shown in FIGS. 1 and 2, the photonic crystal layer 15A is provided between the active layer 12 and the cladding layer 13, but as shown in FIG. 3, the photonic crystal layer 15A may be provided between the cladding layer 11 and the active layer 12. Furthermore, when the light guide layer is provided between the active layer 12 and the cladding layer 11, the photonic crystal layer 15A is provided between the cladding layer 11 and the light guide layer. The light guide layer may include a carrier barrier layer for efficiently confining carriers into the active layer 12.

The photonic crystal layer (diffraction lattice layer) 15A is a resonance mode formation layer in the present embodiment. The photonic crystal layer 15A includes a base layer 15a and a plurality of modified refractive index regions 15b. The base layer 15a is a semiconductor layer comprised of a first refractive index medium. The plurality of modified refractive index regions 15b is comprised of a second refractive index medium having a refractive index different from that of the first refractive index medium, and exists in the base layer 15a. The guide layer 18 is a semiconductor layer covering the base layer 15a and the plurality of modified refractive index regions 15b. The refractive index of the guide layer 18 may be the same as the refractive index of the first refractive index medium. The refractive index of the guide layer 18 may be the same as the refractive index of the second refractive index medium. Alternatively, the refractive index of the guide layer 18 may be different from both the refractive index of the first refractive index medium and the refractive index of the second refractive index medium. The plurality of modified refractive index regions 15b is arrayed two-dimensionally and periodically on a design surface (X-Y plane) orthogonal to the thickness direction (Z-axis direction) of the photonic crystal layer 15A. When the equivalent refractive index is n, a wavelength $\lambda_0$ (=a×n, where a is the lattice spacing) selected by the photonic crystal layer 15A is included in the emission wavelength range of the active layer 12. The photonic crystal layer 15A can select the wavelength $\lambda_0$ of the emission wavelengths of the active layer 12 and output it to the outside. In the present embodiment, the wavelength $\lambda_0$ is in the range of, for example, 365 to 550 nm, and in one example, 405 nm.

Figure 4:
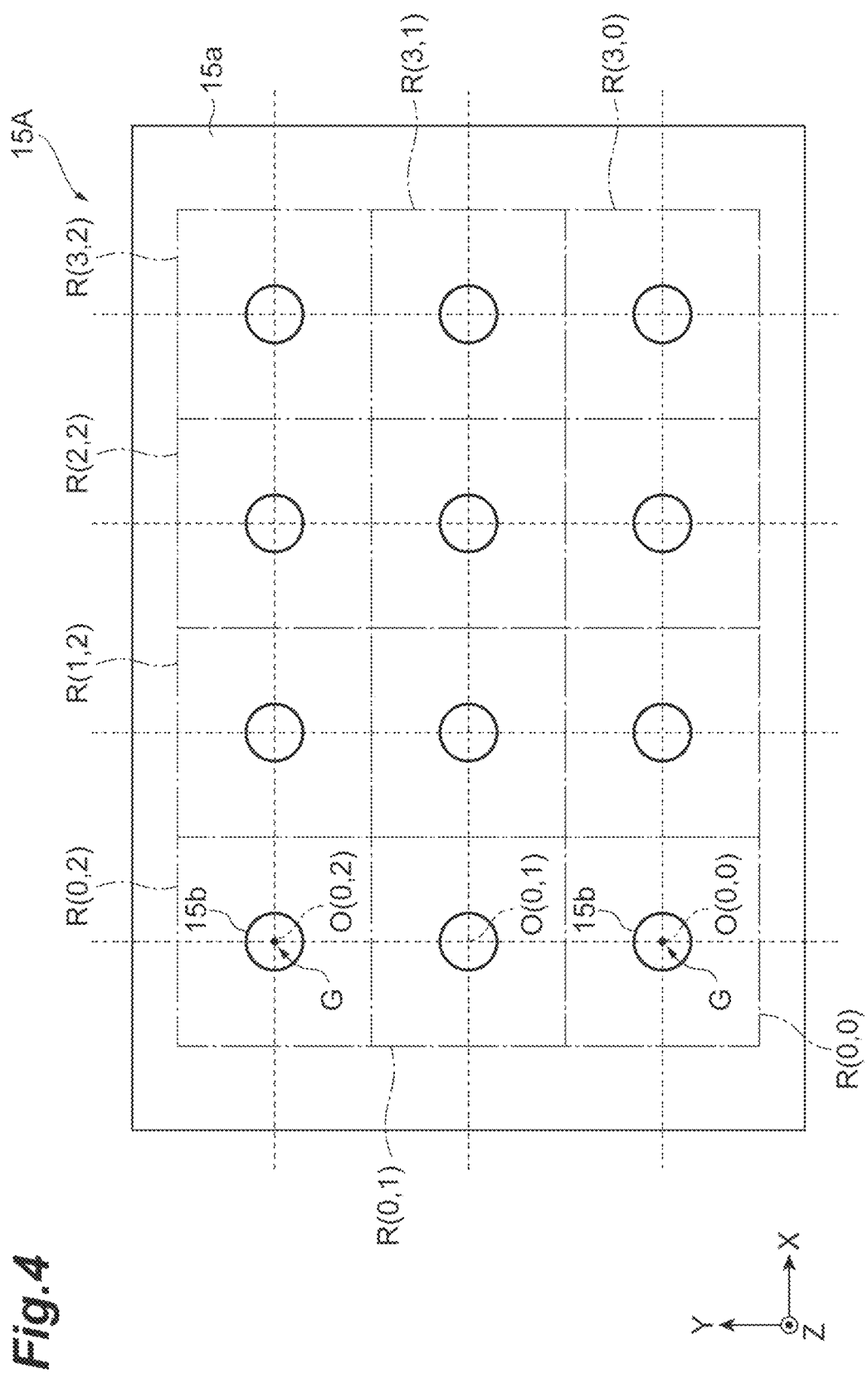
FIG. 4 is a plan view of a photonic crystal layer 15A.

FIG. 4 is a plan view of the photonic crystal layer 15A. Here, a virtual square lattice on the X-Y plane is set in the photonic crystal layer 15A. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. The plurality of modified refractive index regions 15b is provided in each unit constituent region R by a fixed number of one or two or more. The planar shape of the modified refractive index region 15b is circular, for example. In each unit constituent region R, a center of gravity G of the modified refractive index region 15b overlaps (coincides with) each lattice point o. It is to be noted that the periodic structure of the plurality of modified refractive index regions 15b is not limited to this, and for example, a triangular lattice may be set in place of the square lattice.

The internal configuration of the phase modulation layer 15 will now be described in more detail. FIG. 4 is a plan view of the phase modulation layer 15A. As shown in FIG. 4, a virtual square lattice is set on a design plane (reference plane) of the phase modulation layer 15A coincident with the X-Y plane. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. The plurality of modified refractive index regions 15b is provided in each unit constituent region R on at least a one-by-one basis (two or more modified refractive index regions 15b may be provided in each unit constituent region R). The planar shape of each modified refractive index region 15b is circular, for example. The center of gravity G of the modified refractive index region 15b overlaps (coincides with) each lattice point o. It is to be noted that the periodic structure of the plurality of modified refractive index regions 15b is not limited to this, and for example, a triangular lattice may be set in place of the square lattice.

Specifically, in FIG. 4, broken lines indicated by x0 to x3 indicate center positions in the unit constituent region R in the X-axis direction, and broken lines indicated by y0 to y2 indicate center positions in the unit constituent region R in the Y-axis direction. Therefore, the intersections of the broken lines x0 to x3 and the broken lines y0 to y2 indicate the respective centers O (0, 0) to O (3, 2) of the unit constituent regions R (0, 0) to R (3, 2), that is, the lattice points. The lattice constant of this virtual square lattice is a. It is to be noted that the lattice constant a is adjusted according to the emission wavelength.

Figure 5:
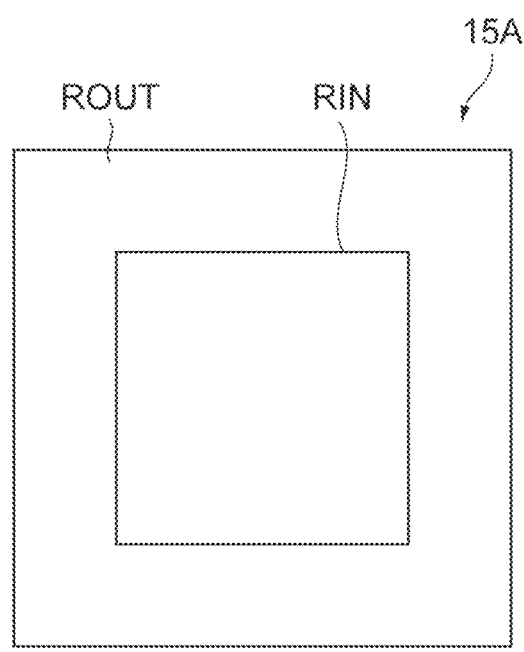
FIG. 5 is a plan view showing an example in which a modified refractive index region 15b is arranged only in a specific region of the photonic crystal layer.

FIG. 5 is a plan view showing an example in which the modified refractive index region 15b is arranged only in a specific region of the photonic crystal layer 15A. In the example shown in FIG. 5, a periodic structure of the modified refractive index region 15b is formed inside an inner region RIN of the square. On the other hand, the periodic structure of the modified refractive index region 15b is also formed in an outer region ROUT surrounding the inner region RIN, and an electrode 26 is formed on the inner region RIN, and hence a current flows mainly through the inner region RIN. In the case of this structure, light leakage in the in-plane direction can be suppressed, and a reduction in threshold current can be expected.

Figure 6:
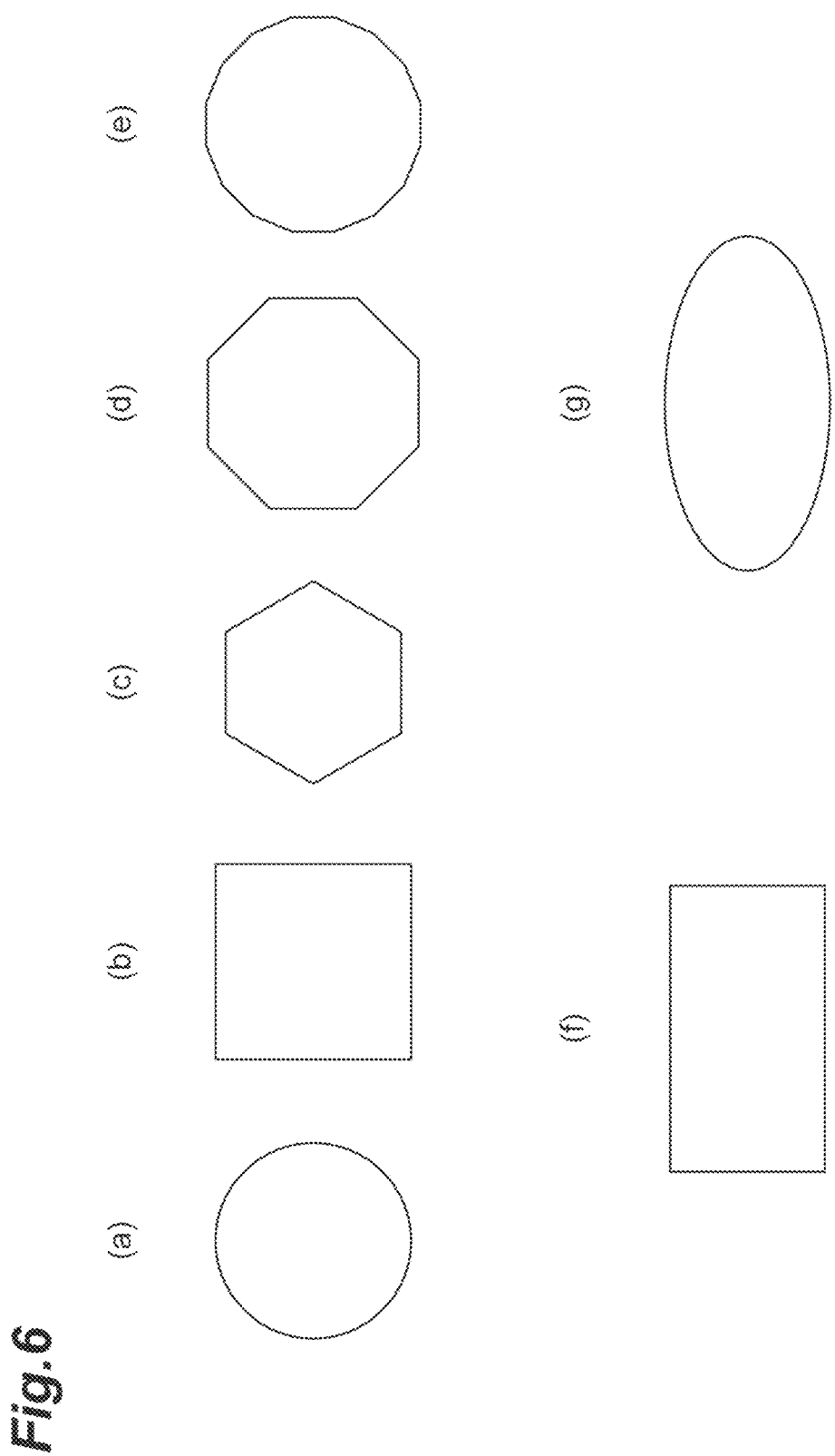
FIGS. 6A to 6G are diagrams showing examples of a planar shape of the modified refractive index region 15b.
Figure 7:
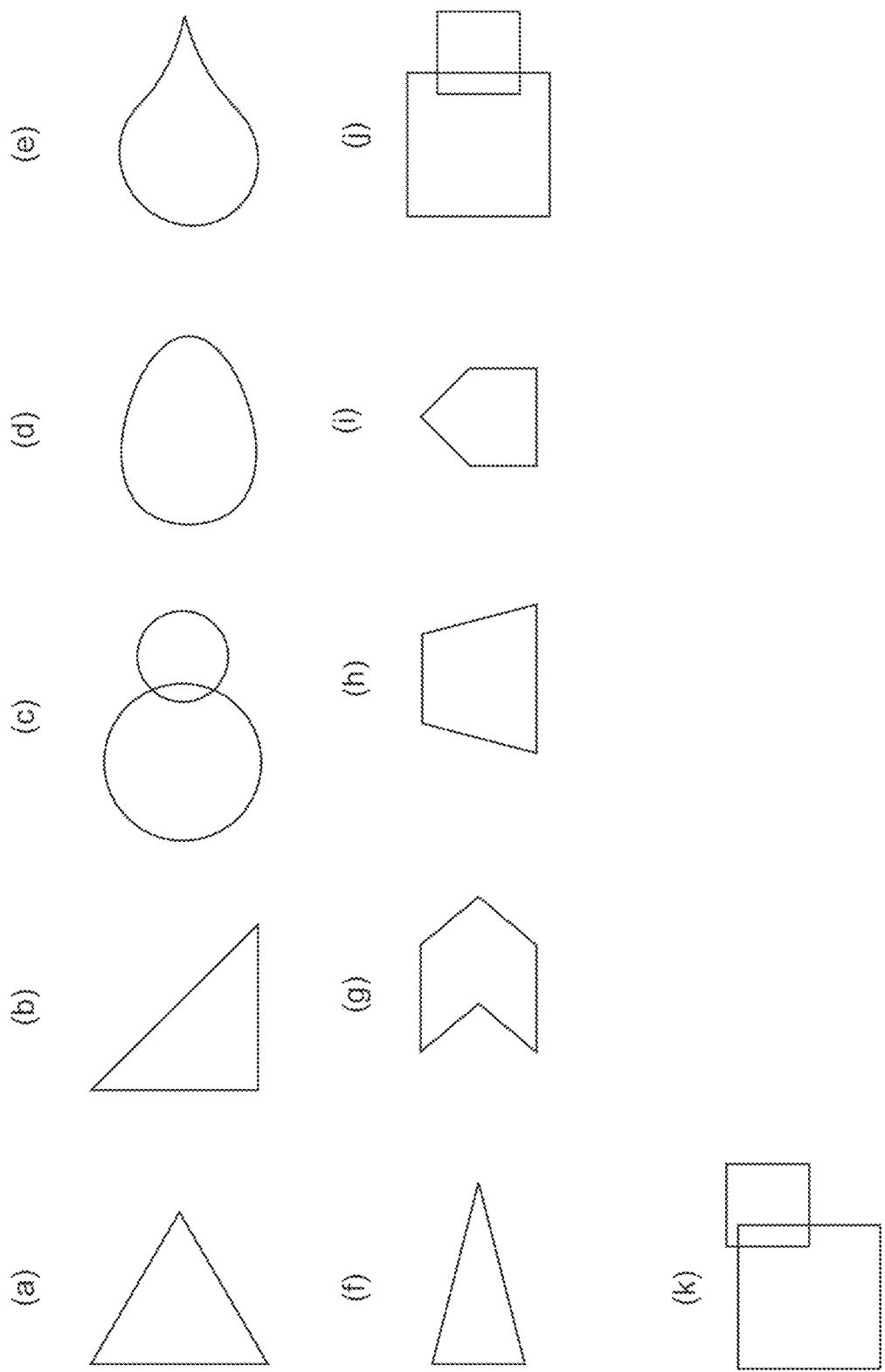
FIGS. 7A to 7K are diagrams showing examples of a planar shape of the modified refractive index region 15b.

Although FIG. 4 shows an example in which the shape of the modified refractive index region 15b on the X-Y plane is circular, the modified refractive index region 15b may have a shape other than a circular shape. For example, the shape of the modified refractive index region 15b on the X-Y plane may have mirror image symmetry (line symmetry). Here, mirror image symmetry (line symmetry) means that, across a certain straight line along the X-Y plane, the planar shape of the modified refractive index region 15b located on one side of the straight line and the planar shape of the modified refractive index region 15b located on the other side of the straight line can be mirror image symmetrical (line symmetrical) with each other. Examples of shapes having mirror image symmetry (line symmetry) include, in addition to a perfect circle shown in FIG. 6A, a square shown in FIG. 6B, a regular hexagon shown in FIG. 6C, a regular octagon shown in FIG. 6D, a regular hexadecagon shown in FIG. 6E, a rectangle shown in FIG. 6F, and an ellipse shown in FIG. 6G Furthermore, the shape of the modified refractive index region 15b on the X-Y plane may be a shape having no rotational symmetry of 180°. Examples of such shapes include an equilateral triangle shown in FIG. 7A, an isosceles right triangle shown in FIG. 7B, a shape shown in FIG. 7C (shape in which two circles or ellipses partially overlap), an oval shape shown in FIG. 7D (shape deformed so that the dimension in the minor axis direction in the vicinity of one end along the major axis of an ellipse becomes smaller than the dimension in the minor axis direction in the vicinity of the other end), a teardrop shape shown in FIG. 7E (shape in which one end along the major axis of an ellipse is deformed into a pointed end projecting along the major axis direction), an isosceles triangle shown in FIG. 7F, an arrow shape shown in FIG. 7G (shape in which one side of a rectangle is recessed in a triangular shape and the opposite side is pointed in a triangular shape), a trapezoid shown in FIG. 7H, a pentagon shown in FIG. 7I, a shape shown in FIG. 7J (shape in which two rectangles partially overlap each other), and a shape shown in FIG. 7K (shape in which two rectangles partially overlap each other and have no mirror image symmetry). Thus, since the shape of the modified refractive index region 15b on the X-Y plane does not have a rotational symmetry of 180°, a higher light output can be obtained.

FIGS. 8A to 8K are plan views showing other examples of the shape of the modified refractive index region on the X-Y plane. In this example, in addition to the modified refractive index region 15b, a modified refractive index region 15c different from the modified refractive index region 15b is further provided in one unit constituent region R. Each modified refractive index regions 15c is comprised of a second refractive index medium having a refractive index different from that of the first refractive index medium of the base layer 15a. Similarly to the modified refractive index region 15b, the modified refractive index region 15c may be a hole or may have a structure in which a compound semiconductor is embedded in the hole. The modified refractive index regions 15c correspond one-to-one to the respective modified refractive index regions 15b. Then, the center of gravity G in which the modified refractive index regions 15b and 15c are put together is located on the lattice point O of the unit constituent region R constituting the virtual square lattice. It is to be noted that both of the modified refractive index regions 15b and 15c are included in the range of the unit constituent region R constituting the virtual square lattice. The unit constituent region R is a region surrounded by a straight line bisecting between lattice points of the virtual square lattice.

Figure 8:
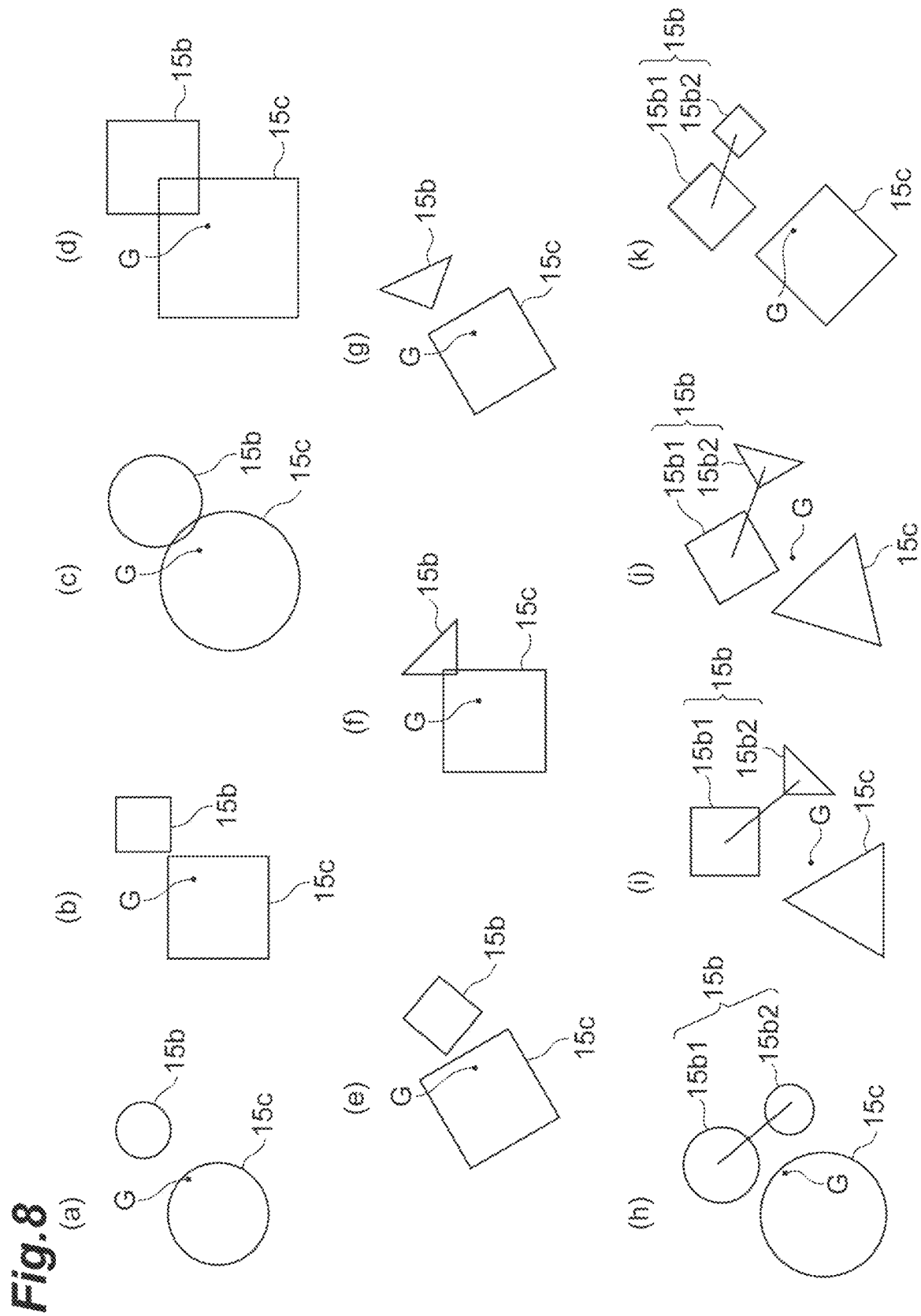
FIGS. 8A to 8K are plan views showing other examples of the shape of the modified refractive index region on an X-Y plane.

Although the planar shape of the modified refractive index region 15c is, for example, circular, it may have various shapes similarly to the modified refractive index region 15b. FIGS. 8A to 8K show examples of the shapes and the relative relationships of the modified refractive index regions 15b and 15c on the X-Y plane. FIGS. 8A and 8B show examples in which the modified refractive index regions 15b and 15c have figures of the same shape. FIGS. 8C and 8D show examples in which the modified refractive index regions 15b and 15c have figures of the same shape and are partially overlapped with each other. FIG. 8E shows an example in which the modified refractive index regions 15b and 15c have figures of the same shape and the modified refractive index regions 15b and 15c are rotated with each other. FIG. 8F shows an example in which the modified refractive index regions 15b and 15c have figures of shapes different from each other. FIG. 8G shows an example in which the modified refractive index regions 15b and 15c have figures of shapes different from each other and the modified refractive index regions 15b and 15c are rotated with each other.

As shown in FIGS. 8H to 8K, the modified refractive index region 15b may be configured with two regions 15b1 and 15b2 separated from each other. Then, the distance between the center of gravity (corresponding to the center of gravity of a single modified refractive index region 15b) where the regions 15b1 and 15b2 are combined and the center of gravity of the modified refractive index region 15c may be arbitrarily set within the unit constituent region R. In this case, as shown in FIG. 8H, the regions 15b1 and 15b2 and the modified refractive index region 15c may have figures of the same shape to each other. As shown in FIG. 8I, the figures of two of the regions 15b1 and 15b2 and the modified refractive index region 15c may be different from the other. As shown in FIG. 8J, in addition to the angle formed by the straight line connecting the regions 15b1 and 15b2 and the X-axis, the angle of the modified refractive index region 15c with respect to the X-axis may be arbitrarily set within the unit constituent region R. As shown in FIG. 8K, while the regions 15b1 and 15b2 and the modified refractive index region 15c maintain the same relative angle with each other, the angle formed by the straight line connecting the regions 15b1 and 15b2 and the X-axis may be arbitrarily set within the unit constituent region R.

It is to be noted that the plurality of modified refractive index regions 15b may be provided in each unit constituent region R. Here, the unit constituent region R refers to a region having a minimum area in a region surrounded by a perpendicular bisector with a lattice point O' of other unit constituent regions arrayed periodically with respect to the lattice point O of a certain unit constituent region R, and corresponds to a Wigner-Seitz cell in solid physics. In that case, while the plurality of modified refractive index regions 15b included in one unit constituent region R have figures of the same shape, the centers of gravity may be separated from each other. The shape of the modified refractive index regions 15b defined on the X-Y plane may be identical between the unit component regions R, and may be able to be overlapped with each other between the unit component regions R by a translation operation or a translation operation and a rotation operation. In that case, fluctuation of the photonic band structure is reduced, and a spectrum having a narrow line width can be obtained. Alternatively, the shape of the modified refractive index region defined on the X-Y plane may not necessarily be identical between the unit constituent regions R, and the shape may be different from each other between adjacent unit constituent regions R.

FIGS. 1 and 2 will be referred to again. The high refractive index layer 16 is provided between the active layer 12 and the photonic crystal layer 15A. The high refractive index layer 16 is provided in order to increase the optical confinement coefficient of the photonic crystal layer 15A and has a refractive index higher than that of each of the cladding layers 11 and 13 and the photonic crystal layer 15A. The high refractive index layer 16 has a superlattice structure. This superlattice structure is obtained by alternately laminating two very thin layers 16a and 16b having refractive indices different from each other, as shown in the enlarged view in FIG. 2. It is to be noted that in the superlattice structure, three or more layers having refractive indices different from each other may be repeatedly laminated.

The high refractive index layer 17 is provided between the cladding layer 11 and the cladding layer 13 at a position where the photonic crystal layer 15A can be sandwiched between the high refractive index layer 17 and the active layer 12. That is, in the example of FIG. 2, the high refractive index layer 17 is provided between the photonic crystal layer 15A and the cladding layer 13. In the example of FIG. 3, the high refractive index layer 17 is provided between the photonic crystal layer 15A and the cladding layer 11. The high refractive index layer 17 is provided together with the high refractive index layer 16 to increase the optical confinement coefficient of the photonic crystal layer 15A, and has a refractive index higher than that of each of the cladding layers 11 and 13 and the photonic crystal layer 15A. Similarly to the high refractive index layer 16, the high refractive index layer 17 also has a superlattice structure. This superlattice structure is obtained by alternately laminating two layers 17a and 17b having refractive indices different from each other, as shown in the enlarged view in FIG. 2. It is to be noted that in the superlattice structure, three or more layers having refractive indices different from each other may be repeatedly laminated.

It is to be noted that "the high refractive index layers 16 and 17 have a refractive index higher than that of the cladding layers 11 and 13 and the photonic crystal layer 15A" means that the value in which the refractive indices of the plurality of layers constituting the superlattice structure are weighted and averaged in accordance with the thickness is higher than the refractive index of each of the cladding layers 11 and 13 and the photonic crystal layer 15A.

The surface emitting laser element 1A further includes an electrode 26 provided on the contact layer 14 and an electrode 27 provided on the back surface 10b of the semiconductor substrate 10. The electrode 26 is in ohmic contact with the contact layer 14, and the electrode 27 is in ohmic contact with the semiconductor substrate 10. The electrode 26 is provided in the center region of the contact layer 14. A portion of the contact layer 14 other than the electrode 26 is covered with a protective film 28. It is to be noted that the contact layer 14 not in contact with the electrode 26 may be removed. The electrode 27 has a planar shape such as a frame (annular) surrounding the output region of the laser light L1, and has an opening 27a. It is to be noted that the planar shape of the electrode 27 can be various shapes such as a rectangular frame shape and an annular shape. A portion (including inside the opening 27a) of the back surface 10b of the semiconductor substrate 10 other than the electrode 27 is covered with an antireflection film 29. The antireflection film 29 in a region other than the opening 27a may be removed.

When a driving current is supplied between the electrode 26 and the electrode 27, recombination of electrons and holes occurs in the active layer 12 (light emission). The electrons and holes contributing to this light emission and the generated light are efficiently distributed between the cladding layer 11 and the cladding layer 13. Since the light outputted from the active layer 12 is distributed between the cladding layer 11 and the cladding layer 13, the light enters the inside of the photonic crystal layer 15A, and forms a resonance mode along the direction defined on the main surface 10a of the semiconductor substrate 10 according to the lattice structure inside the photonic crystal layer 15A. Then, light oscillates at a wavelength corresponding to an array period of the plurality of modified refractive index regions 15b, thereby generating laser light L1. The laser light L1 outputted from the photonic crystal layer 15A travels along the normal direction of the main surface 10a of the semiconductor substrate 10, and is directly outputted to the outside of the surface emitting laser element 1A from the back surface 10b through the opening 27a, or is reflected by the electrode 26 and then outputted to the outside of the surface emitting laser element 1A from the back surface 10b through the opening 27a.

For example, the semiconductor substrate 10 is a GaN substrate, and the cladding layer 11, the active layer 12, the photonic crystal layer 15A, the cladding layer 13, and the contact layer 14 are comprised of nitride semiconductors. In one example, the cladding layer 11 is a GaN layer or an AlGaN layer. The active layer 12 has a multiple quantum well structure (barrier layer: InGaN/quantum well layer: InGaN). The base layer 15a of the photonic crystal layer 15A and the guide layer 18 are a GaN layer or an AlGaN layer. The modified refractive index region 15b is a hole. The cladding layer 13 is a GaN layer or an AlGaN layer. The contact layer 14 is a GaN layer.

Thus, when the cladding layers 11 and 13 and the base layer 15a are a GaN layer or an AlGaN layer, at least one of the two or more layers constituting the superlattice structure of the high refractive index layers 16 and 17 (e.g., the layers 16a and 17a) is a nitride semiconductor layer containing In (e.g., an InGaN layer). The layer of the high refractive index layers 16 and 17 may be an InAlGaN layer further containing Al. The band gap of the layer of the high refractive index layers 16 and 17 is wider than the band gap of the quantum well layer of the active layer 12. For example, when the quantum well layer is a nitride semiconductor layer (e.g., an InGaN layer) containing In, the In composition (percentage of the molar ratio with respect to the all dopants contained in the nitride semiconductor) of the layer of the high refractive index layers 16 and 17 is smaller than the In composition of the quantum well layer. When the cladding layers 11 and 13 and the base layer 15a are a GaN layer or an AlGaN layer, the In composition of the high refractive index layers 16 and 17 is, for example, 2% or more.

When the nitride semiconductor contains In, the energy band gap and the refractive index can be easily changed by changing the composition ratio (molar ratio) of In. That is, in $In_xGa_{1-x}N$ or $In_xAl_yGa_{1-x-y}N$, the larger a composition ratio x of In becomes, the narrower the energy band gap becomes, and the larger the refractive index becomes. When the nitride semiconductor contains Al, the energy band gap and the refractive index can be easily changed by changing the composition ratio of Al. That is, in $Al_yGa_{1-y}N$ or $In_xAl_yGa_{1-x-y}N$, the larger a composition ratio y of Al becomes, the wider the energy band gap becomes, and the smaller the refractive index becomes. When the cladding layers 11 and 13 are an AlGaN layer, its Al composition ratio is, for example, 0 to 0.15, and in one example, 0.06. When the barrier layer of the active layer 12 is an InGaN layer, its In composition ratio is, for example, 0 to 0.2, and in one example, 0.01. When the quantum well layer of the active layer 12 is an InGaN layer, its In composition ratio is, for example, 0 to 0.2, and in one example, 0.10.

When the layer 16a of the high refractive index layers 16 and 17 is an $In_xGa_{1-x}N$ layer, its In composition ratio x is, for example, in a range of equal to or greater than 0.02 and less than x1, more preferably half or more of x1, where the In composition ratio of the quantum well layer of the active layer 12 is x1. When the carrier concentration to the active layer 12 may be hindered to some extent, the In composition ratio x of the high refractive index layers 16 and 17 may exceed x1. When the layer 16a of the high refractive index layers 16 and 17 is an $In_xAl_yGa_{1-x-y}N$ layer, its Al composition ratio y is, for example, in a range of equal to or greater than 0 and equal to or less than 0.15. The layer 16b of the high refractive index layers 16 and 17 is, for example, a GaN layer, an InGaN layer, or an InAlGaN layer. When the layer 16b is an InGaN layer, its In composition is smaller than that of the layer 16a.

The cladding layer 11 has the same conductivity type as the semiconductor substrate 10 has. The cladding layer 13 and the contact layer 14 have a conductivity type opposite to that of the semiconductor substrate 10. In one example, the semiconductor substrate 10 and the cladding layer 11 have n-type, and the cladding layer 13 and the contact layer 14 have p-type. The photonic crystal layer 15A has the same conductivity type as that of the semiconductor substrate 10 when provided between the active layer 12 and the cladding layer 11, and has the opposite conductivity type to that of the semiconductor substrate 10 when provided between the active layer 12 and the cladding layer 13. It is to be noted that the impurity concentration is, for example, $1\times10^{16}$ to $1\times10^{21}/cm^3$. In the case of being intrinsic (i-type) to which no impurity is intentionally added, the impurity concentration thereof is $1\times10^{16}/cm^3$ or less. The active layer 12 is not limited to be intrinsic (i-type) and may be doped. It is to be noted that regarding the impurity concentration of the photonic crystal layer 15A, it may be intrinsic (i-type) when it is necessary to suppress the effect of loss due to light absorption via the impurity level.

The high refractive index layers 16 and 17 have the same conductivity type as that of the semiconductor substrate 10 when located on the cladding layer 11 side with respect to the active layer 12, and have the opposite conductivity type to that of the semiconductor substrate 10 when located on the cladding layer 13 side with respect to the active layer 12. In this case, it is not necessary for all of the two or more layers constituting the superlattice structure to have the conductivity type, and only either one layer (e.g., the layers 16b and 17b having a small refractive index) may have the conductivity type. Alternatively, the high refractive index layers 16 and 17 may be undoped (i-type).

The thickness of the semiconductor substrate 10 is, for example, 150 µm. The thickness of the cladding layer 11 is, for example, 1200 nm. The thickness of the active layer 12 is, for example, 49 nm (when four barrier layers having a thickness of 10 nm and three quantum well layers having a thickness of 3 nm are alternately laminated). The thickness of the photonic crystal layer 15A is, for example, 70 nm. The thickness of the cladding layer 13 is, for example, 500 nm. The thickness of the contact layer 14 is, for example, 100 nm. The thickness of the high refractive index layer 16 is, for example, 5 to 200 nm, and the individual thickness of the layers 16a and 16b is, for example, 0.1 to 20 nm. In one example, the high refractive index layer 16 is configured by laminating seven layers of the layer 16a having a thickness of 5 nm and seven layers of the layer 16b having a thickness of 5 nm (total of 14 layers). The thickness of the high refractive index layer 17 is, for example, 5 to 200 nm, and the individual thickness of the layers 17a and 17b is, for example, 0.1 to 20 nm. In one example, the high refractive index layer 17 is configured by laminating three layers of the layer 17a having a thickness of 5 nm and three layers of the layer 17b having a thickness of 5 nm (total of six layers).

It is to be noted that in the structure described above, the modified refractive index region 15b is a hole, but the modified refractive index region 15b may be formed by embedding, into the hole, a semiconductor having a refractive index different from that of the base layer 15a. In that case, for example, a hole in the base layer 15a is formed by etching, and then a semiconductor is embedded in the hole by using the metal organic chemical vapor deposition method, the molecular beam epitaxy method, the sputtering method, or the epitaxial method. For example, when the base layer 15a is comprised of GaN, the modified refractive index region 15b may be comprised of AlGaN. After the modified refractive index region 15b is formed by embedding the semiconductor into the hole of the base layer 15a, the identical semiconductor to that of the modified refractive index region 15b may be further deposited thereon as the guide layer 18. It is to be noted that when the modified refractive index region 15b is a hole, an inert gas such as argon and nitrogen, or a gas such as hydrogen and air may be sealed in the hole.

The antireflection film 29 is comprised of, for example, a dielectric single layer film such as silicon nitride (e.g., SiN) or silicon oxide (e.g., $SiO_2$), or a dielectric multilayer film. As the dielectric multilayer film, for example, a film in which two or more types of dielectric layers selected from a group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$) are laminated can be applied. For example, in the case of a single-layer dielectric film, a film having a thickness of $\lambda/4$ of an optical film thickness for light having a wavelength $\lambda$ is laminated. The protective film 28 is an insulation film such as silicon nitride (e.g., SiN) or silicon oxide (e.g., $SiO_2$). The electrode 26 has a laminated structure of Ti and Al, for example. The electrode 27 has a laminated structure of Ni and Au, for example. It is to be noted that the materials of the electrodes 26 and 27 are only required to realize ohmic coupling and not limited to these ranges.

The effects obtained by the surface emitting laser element 1A of the present embodiment including the above configuration will be described. This surface emitting laser element 1A includes the high refractive index layers 16 and 17 having a refractive index higher than that of each of the cladding layer 11, the cladding layer 13, and the photonic crystal layer 15A. The high refractive index layers 16 and 17 are respectively arranged in the vicinity of the photonic crystal layer 15A, i.e., at a position between the cladding layer 11 and the cladding layer 13, where the photonic crystal layer 15A is sandwiched with the active layer 12, and between the active layer 12 and the photonic crystal layer 15A. The high refractive index layers 16 and 17 have an optical confinement coefficient larger than that of the surrounding layers (the cladding layer 11, the cladding layer 13, and the photonic crystal layer 15A). Therefore, the optical confinement coefficient of the photonic crystal layer 15A located in the vicinity of the high refractive index layers 16 and 17 also becomes large under the influence thereof. Therefore, according to the surface emitting laser element 1A of the present embodiment, the optical confinement coefficient of the photonic crystal layer 15A can be increased.

In a case of a nitride semiconductor, when a plurality of layers having different compositions from each other are laminated, defects due to differences in lattice constant and thermal expansion coefficient are more likely to occur compared with typical compound semiconductors such as GaAs-based and InP-based semiconductors. In particular, when it is attempted to form thick a high refractive index layer constituted by a single layer, it is difficult to obtain a good-quality layer structure due to strain caused by a difference in lattice constant with the substrate material. However, if the high refractive index layer is made thin, the effect of increasing the optical confinement coefficient of the photonic crystal layer 15A becomes limited. Therefore, in the surface emitting laser element 1A according to the present embodiment, the high refractive index layer 16 (17) has a superlattice structure in which two or more layers 16a and 16b (17a and 17b) having refractive indices different from each other are repeatedly laminated. Thus, by alternately growing the layer having a large refractive index and the layer having a small refractive index, the strain caused by the difference in lattice constant can be dispersed. As a result, it is possible to easily realize the high refractive index layers 16 and 17 having a sufficient thickness as a whole while reducing defects caused by distortion.

FIG. 9A is a surface photograph of a GaN layer obtained by growing a GaN layer on a sapphire substrate, growing an $In_{0.1}GaN$ bulk layer having a thickness of 25 nm and a GaN layer (cap layer) having a thickness of 40 nm on the GaN layer, and further raising the temperature to 1000° C. or higher before growing a GaN layer having a thickness of 450 nm. FIG. 9B is a surface photograph of a GaN layer obtained by growing a GaN layer on a sapphire substrate, alternately laminating an $In_{0.1}GaN$ layer having a thickness of 2.5 nm and a GaN layer having a thickness of 2.5 nm on the GaN layer for 10 periods to form a superlattice structure, growing a GaN layer (cap layer) having a thickness of 40 nm, and further raising the temperature to 1000° C. or higher before growing a GaN layer having a thickness of 450 nm. It is to be noted that the crystal growth temperature of the $In_{0.1}GaN$ bulk layer and the $In_{0.1}GaN/GaN$ superlattice is, for example, 750 to 850° C. In either case, the total film thickness of the InGaN layer becomes 25 nm, but it can be seen that the superlattice structure has caused the degradation of the InGaN layer to be reduced and a high-quality crystal to be formed.

As in the present embodiment, the cladding layer 11, the cladding layer 13, and the base layer 15a may be a GaN layer or an AlGaN layer, and at least one of the layers 16a and 17a of the two or more layers of the high refractive index layers 16 and 17 may be a nitride semiconductor layer containing In. Due to this, the high refractive index layers 16 and 17 having a refractive index higher than that of each of the cladding layer 11, the cladding layer 13, and the photonic crystal layer 15A can be preferably realized. In this case, the layers 16a and 17a may further contain Al. The larger the Al composition becomes, the lower the refractive index of the high refractive index layers 16 and 17 becomes. However, the larger the Al composition becomes, the band gap becomes wider and the light transmittivity can be enhanced. Furthermore, the increase in Al composition can reduce the lattice constant due to the nitride semiconductor layer containing In, and bring it close to the lattice constant of GaN of the base layer 15a, thereby making the effect of strain relaxation expected.

As in the present embodiment, the active layer 12 has a multiple quantum well structure in which quantum well layers and barrier layers are alternately laminated. The band gap of the layers 16a and 17a may be wider than the band gap of the quantum well layer. In this case, the high refractive index layers 16 and 17 can effectively function while suppressing the influence of the active layer 12 on the light-emitting action. At this time, the quantum well layer is a nitride semiconductor layer containing In, and the In composition of the layers 16a and 17a may be smaller than the In composition of the quantum well layer. For example, such a configuration allows the band gap of the layers 16a and 17a to be made wider than the band gap of the quantum well layer.

As in the present embodiment, the In composition of the layers 16a and 17a may be 2% or more. This allows the refractive indices of the high refractive index layers 16 and 17 to be sufficiently increased with respect to the refractive index of the surrounding, and the optical confinement coefficient of the photonic crystal layer 15A to be increased.

(First Variation)

Figure 10:
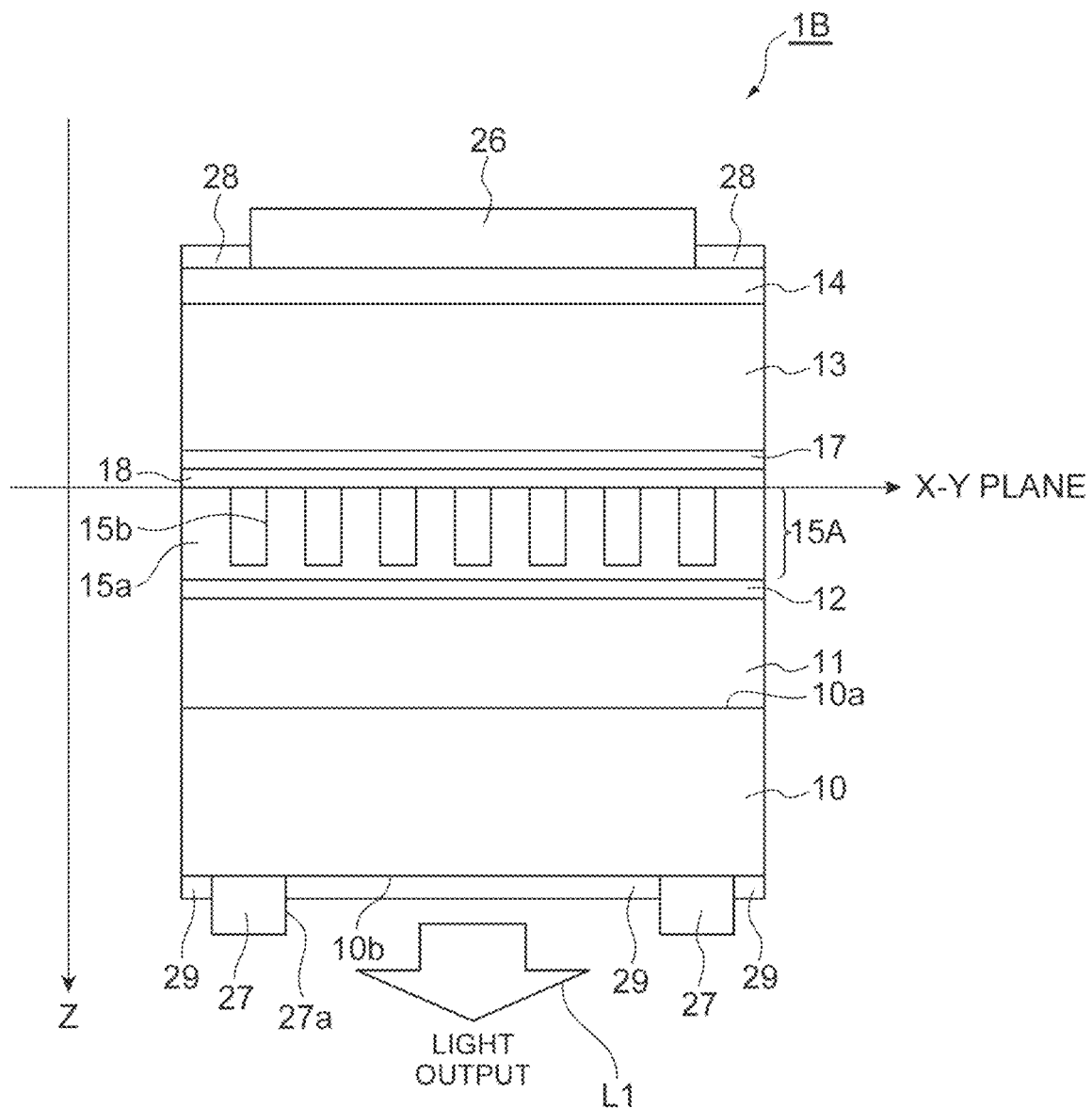
FIG. 10 schematically shows a cross-sectional configuration of a surface emitting laser element 1B according to a first variation.

FIG. 10 schematically shows a cross-sectional configuration of the surface emitting laser element 1B according to the first variation of the above embodiment. The difference between this first variation and the above-described embodiment is the number of layers of the high refractive index layer. That is, the surface emitting laser element 1B according to the first variation includes the high refractive index layer 17, but does not include the high refractive index layer 16. In other words, the high refractive index layer is provided only between the cladding layer 13 and the photonic crystal layer 15A, and the high refractive index layer is not interposed between the active layer 12 and the photonic crystal layer 15A. In this case, the active layer 12 also serves as a high refractive index layer. The active layer 12 (particularly quantum well layer) has a high In composition. Therefore, the refractive index of the active layer 12 is sufficiently larger than the refractive index of the surrounding layers (the cladding layer 11 and the photonic crystal layer 15A). Therefore, the optical confinement coefficient of the active layer 12 is large, and, due to its influence, the optical confinement coefficient of the photonic crystal layer 15A becomes also large. Hence, even if the high refractive index layer between the active layer 12 and the photonic crystal layer 15A is omitted as in this first variation, the same effects as those in the above embodiment can be obtained.

Figure 11:
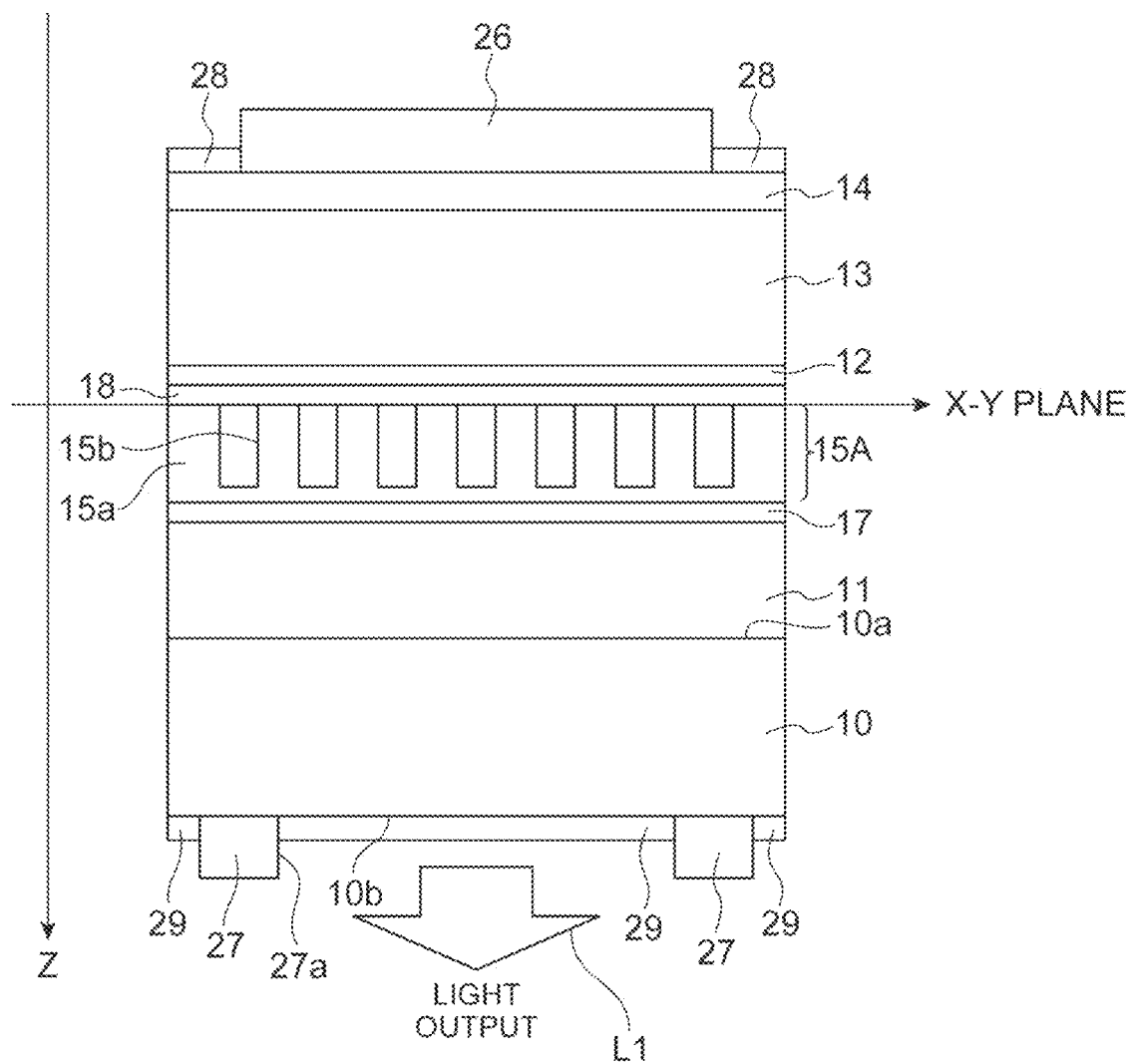
FIG. 11 shows a variation of a case where an active layer 12 is located between a photonic crystal layer 15A and a cladding layer 13.

FIG. 11 shows a variation of a configuration (see FIG. 3) where the active layer 12 is located between the photonic crystal layer 15A and the cladding layer 13. In this case, the high refractive index layer 16 between the active layer 12 and the photonic crystal layer 15A is omitted, and the high refractive index layer is provided only between the cladding layer 11 and the photonic crystal layer 15A. Such a configuration can also achieve the similar effects as those of the above-described embodiment.

It is to be noted that the arrangement of the high refractive index layer is not limited to that of the above-described embodiment and this first variation. For example, the high refractive index layer may be provided only between the active layer 12 and the photonic crystal layer 15A.

(Second Variation)

Figure 12:
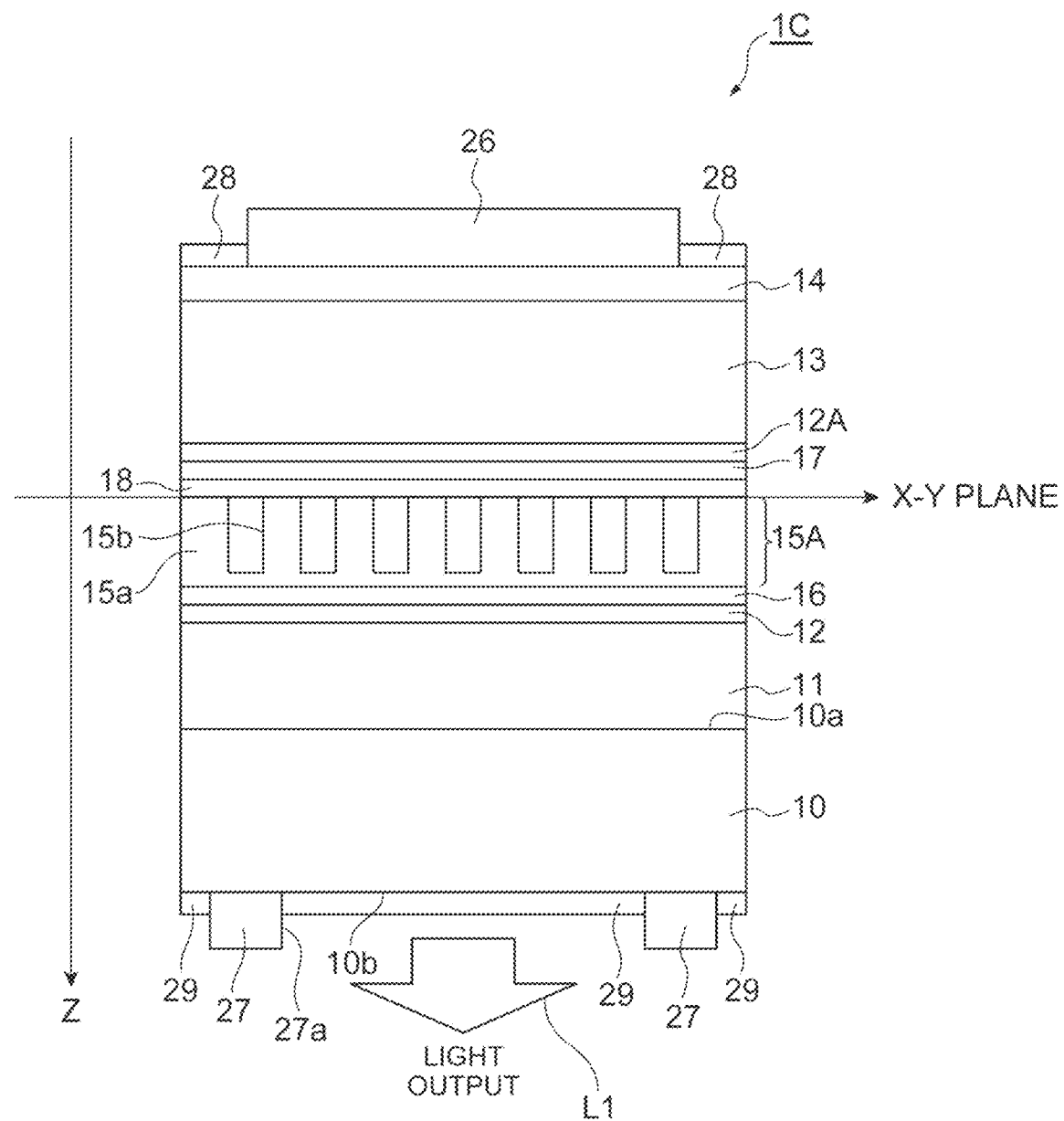
FIG. 12 schematically shows a cross-sectional configuration of a surface emitting laser element 1C according to a second variation.

FIG. 12 schematically shows a cross-sectional configuration of a surface emitting laser element 1C according to the second variation of the above-described embodiment. The difference between this second variation and the above-described embodiment is the number of the active layers. That is, the surface emitting laser element 1C according to the second variation further includes an active layer 12A in addition to the active layer 12 shown in FIG. 2. The active layer 12A is provided, for example, between the high refractive index layer 17 and the cladding layer 13. The internal structure of the active layer 12A is the same as that of the active layer 12. With such a configuration, the active layer 12A having a sufficiently large optical confinement coefficient is provided in the vicinity of the high refractive index layer 17. Therefore, this second variation can also more remarkably achieve the effects of the above embodiment.

(Third Variation)

Figure 13:
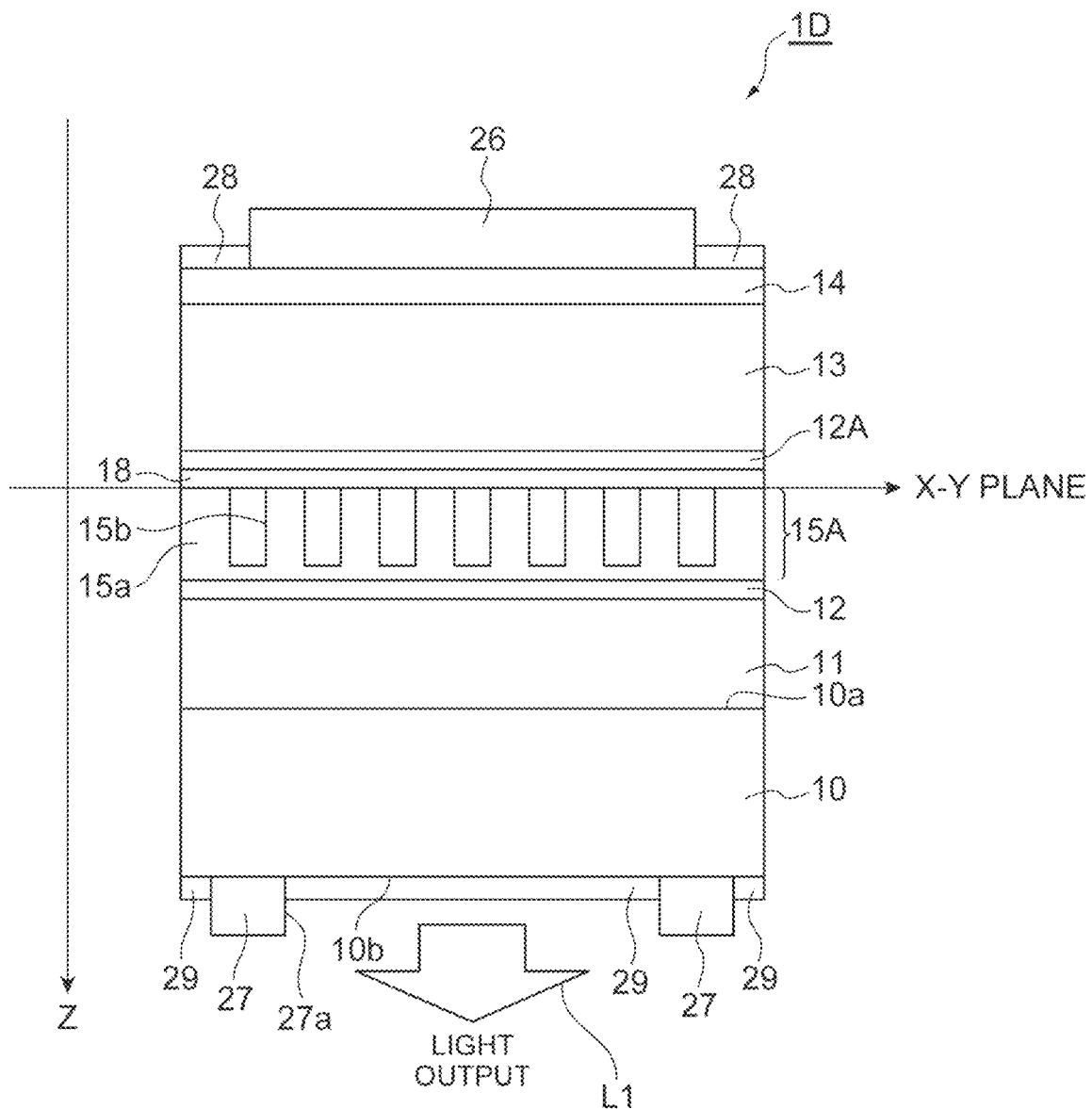
FIG. 13 schematically shows a cross-sectional configuration of a surface emitting laser element 1D according to a third variation.

FIG. 13 schematically shows a cross-sectional configuration of a surface emitting laser element 1D according to the third variation of the above-described embodiment. In this third variation, the high refractive index layers 16 and 17 are further omitted from those in the second variation. That is, the surface emitting laser element 1D includes none of the high refractive index layers 16 and 17, and any high refractive index layer other than the active layers 12 and 12A is not provided any of between the cladding layer 11 and the photonic crystal layer 15A and between the cladding layer 13 and the photonic crystal layer 15A. In this case, the active layers 12 and 12A play a role of the high refractive index layers 16 and 17. That is, the photonic crystal layer 15A is sandwiched by the active layers 12 and 12A having sufficiently large optical confinement coefficients. Therefore, this third variation can also achieve the similar effects as those of the above-described embodiment.

Second Embodiment

While in the above-described embodiment (first embodiment), the surface emitting laser element 1A that is a PCSEL has been described, the light-emitting device of the present invention is not limited to a PCSEL but can be various surface emitting laser elements. For example, a surface emitting laser element that outputs any optical image by controlling a phase spectrum and an intensity spectrum of light outputted from a plurality of two-dimensionally arrayed light-emitting points has been studied. Such a surface emitting laser element is called static-integrable phase modulating (S-iPM) laser, and outputs a two-dimensional optical image of any shape along both the normal direction of the main surface of the semiconductor substrate and the tilt direction intersecting with the normal direction.

Figure 14:
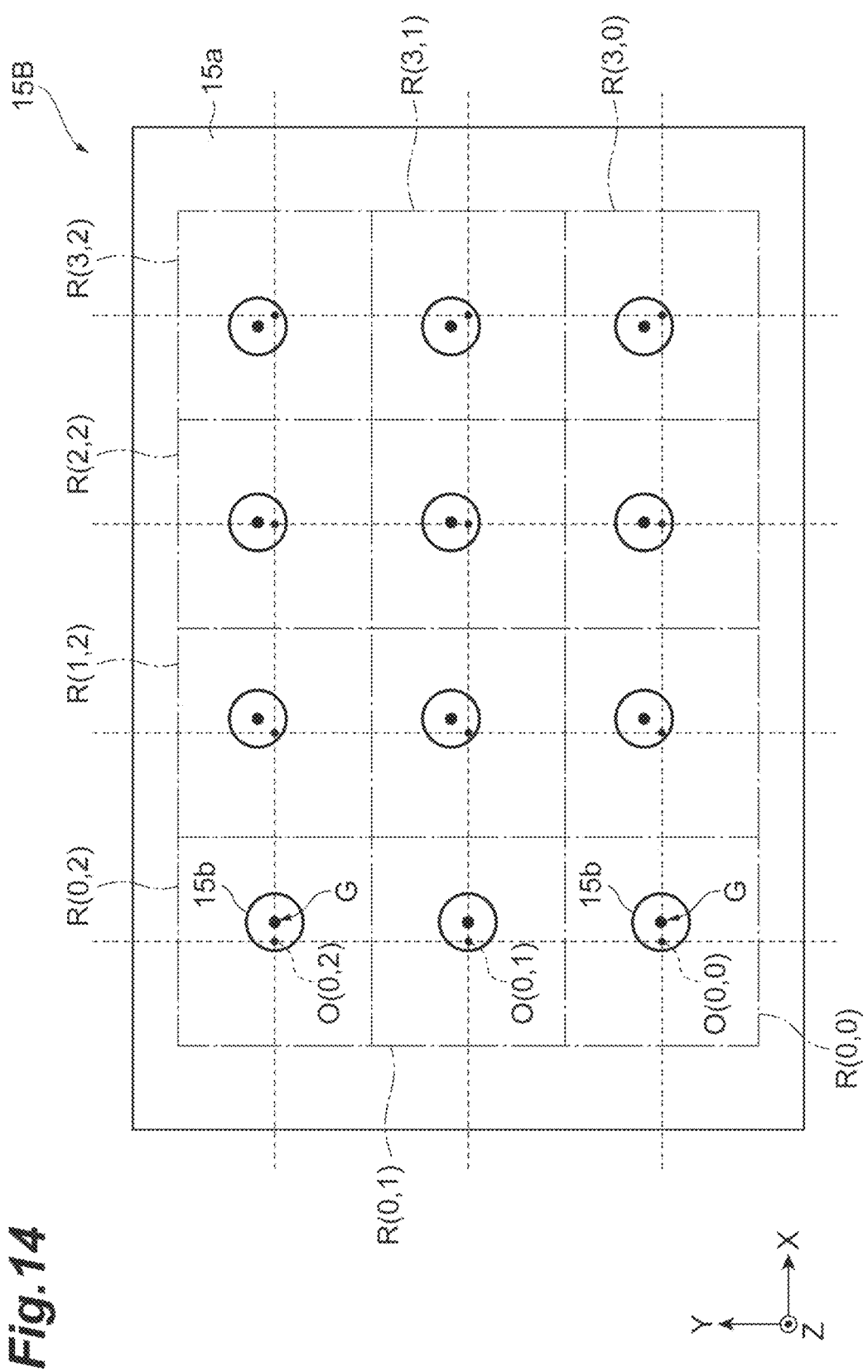
FIG. 14 is a plan view of a phase modulation layer 15B included in S-iPM laser.

FIG. 14 is a plan view of a phase modulation layer 15B included in S-iPM laser. The surface emitting laser element 1A of each of the above-described embodiments and variations may include the phase modulation layer 15B shown in FIG. 14 in place of the photonic crystal layer 15A (See FIG. 4). This enables the surface emitting laser element 1A to function as S-iPM laser. The phase modulation layer 15B is a resonance mode formation layer in this second embodiment. It is to be noted that the surface emitting laser element 1A has the same configuration as that of the first embodiment except for the phase modulation layer 15B, and therefore a detailed description thereof is omitted.

The phase modulation layer 15B includes the base layer 15a comprised of the first refractive index medium and the modified refractive index region 15b comprised of the second refractive index medium having a refractive index different from that of the first refractive index medium. Here, it is assumed that a virtual square lattice is set on the design surface of the phase modulation layer 15B that coincides with the X-Y plane. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. The plurality of modified refractive index regions 15b are provided one-by-one in each unit constituent region R. The planar shape of the modified refractive index region 15b is circular, for example. In the unit constituent region R (x, y), the center of gravity G of the modified refractive index region 15b is arranged away from the lattice point O (x, y) located at the center of the unit constituent region R (x, y).

Figure 15:
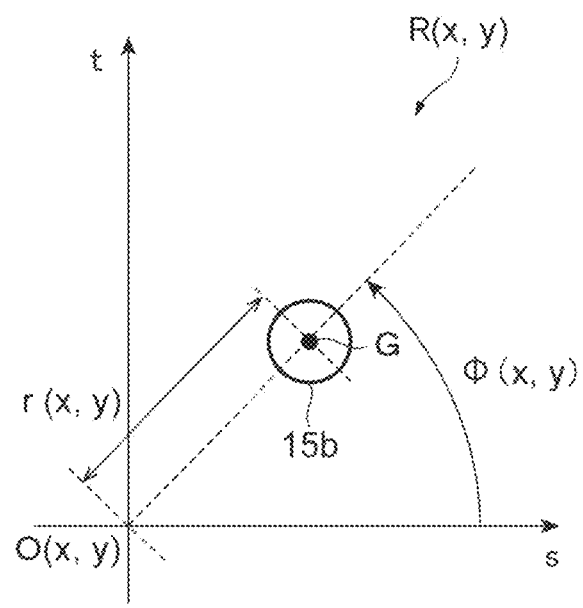
FIG. 15 is a diagram showing a part of the phase modulation layer 15B in an enlarged manner.

As shown in FIG. 15, in the unit constituent region R (x, y) defined by an s-axis parallel to the X-axis and a t-axis parallel to the Y-axis, let an angle formed by a direction from the lattice point O (x, y) corresponding to the origin of the s-t coordinate system in the unit constituent region R (x, y) toward the center of gravity G and the s-axis be φ (x, y). When a rotation angle φ is 0°, the direction of the vector connecting the lattice point O (x, y) and the center of gravity G coincides with the positive direction of the X-axis. Let the length of the vector connecting the lattice point O (x, y) and the center of gravity G be r (x, y). In one example, r (x, y) is constant throughout the entire phase modulation layer 15B.

As shown in FIG. 14, in the phase modulation layer 15B, the rotation angle φ around the lattice point O of the center of gravity G of the modified refractive index region 15b is independently set for each unit constituent region R (x, y) according to a desired optical image. The rotation angle distribution φ (x, y) has a specific value for each unit constituent region R (x, y), but is not necessarily expressed by a specific function. That is, the rotation angle distribution φ (x, y) is determined from a phase distribution included in a complex amplitude distribution obtained by performing an inverse Fourier transform on a desired optical image. It is to be noted that when the complex amplitude distribution is obtained from the desired optical image, the reproducibility of the output beam pattern (beam projection pattern) is improved by applying a repetition algorithm such as the Gerchberg-Saxton (GS) method commonly used at the time of calculation of hologram generation.

In the second embodiment, the laser light outputted from the active layer 12 enters the inside of the phase modulation layer 15B while being confined between the cladding layer 11 and the cladding layer 13, and forms a predetermined mode corresponding to the lattice structure inside the phase modulation layer 15B. The laser light L1 scattered in the phase modulation layer 15B is outputted to the outside from the back surface 10b of the semiconductor substrate 10. At this time, the zero-order light is outputted along the normal direction of the main surface 10a. On the other hand, the +1 order light and the −1 order light are outputted in any direction including the normal direction of the main surface 10a and the tilt direction intersecting with the normal direction.

Figure 16:
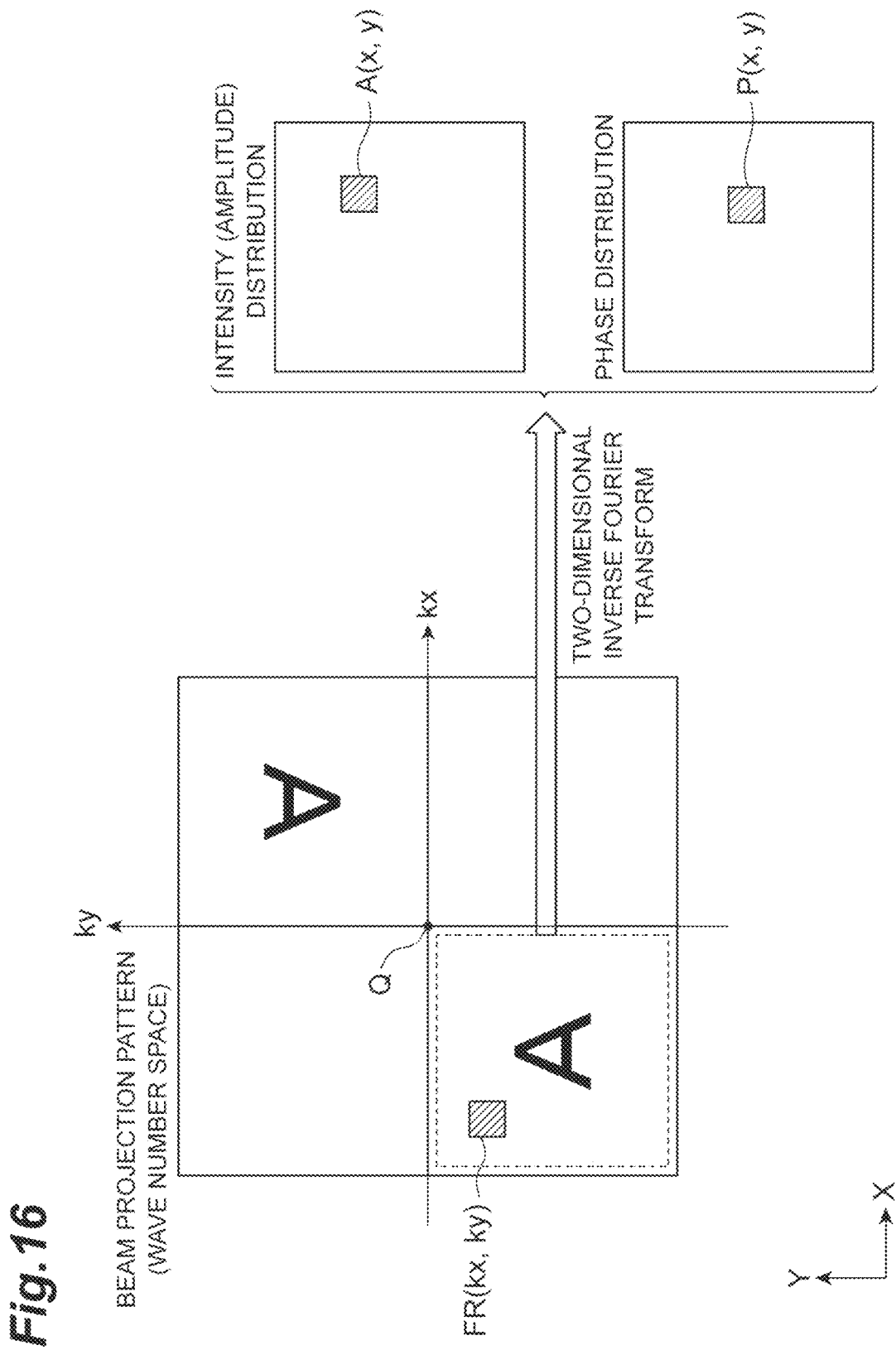
FIG. 16 is a diagram for explaining a relationship between an optical image obtained by forming an output beam pattern of the surface emitting laser element and a rotation angle distribution φ (x, y) in the phase modulation layer 15B.

FIG. 16 is a diagram for explaining a relationship between an optical image obtained by forming an output beam pattern (beam projection pattern) of the surface emitting laser element according to the second embodiment and the rotation angle distribution φ (x, y) in the phase modulation layer 15B. It is to be noted that a center Q of the output beam pattern is located on an axis along the normal direction of the main surface 10a of the semiconductor substrate 10, and FIG. 16 shows a kx-ky coordinate system (four quadrants) with the center Q as the origin. As an example, FIG. 16 shows a case in which optical images are obtained in the first quadrant and the third quadrant, but images can be obtained in the second quadrant and the fourth quadrant or all the quadrants. In this second embodiment, as shown in FIG. 16, an optical image that is point symmetric with respect to the origin is obtained. FIG. 16 shows, as an example, a case where the character "A" is obtained as the +1 order diffracted light in the third quadrant and a pattern with the character "A" rotated by 180° is obtained as the −1 order diffracted light in the first quadrant. It is to be noted that in the case of a rotationally symmetric optical image (e.g., cross, circle, double circle, and so on), they are observed as one optical image where they overlap.

The optical image of the output beam pattern outputted from the surface emitting laser element according to the second embodiment includes at least one of a spot, a straight line, a cross, a line drawing, a lattice pattern, a photograph, a stripe pattern, computer graphics (CG), and a character. Here, in order to obtain a desired optical image, the rotation angle distribution φ (x, y) of the modified refractive index region 15b of the phase modulation layer 15B is determined by the following procedure.

First, as a first precondition, in the XYZ orthogonal coordinate system defined by the Z-axis coincident with the normal direction and the X-Y plane coincident with one surface of the phase modulation layer 15B including the plurality of modified refractive index regions 15b and including the X-axis and the Y-axis orthogonal to each other, a virtual square lattice composed of M1 (integer of 1 or more)×N1 (integer of 1 or more) unit constituent regions R each having a square shape is set on the X-Y plane.

Figure 17:
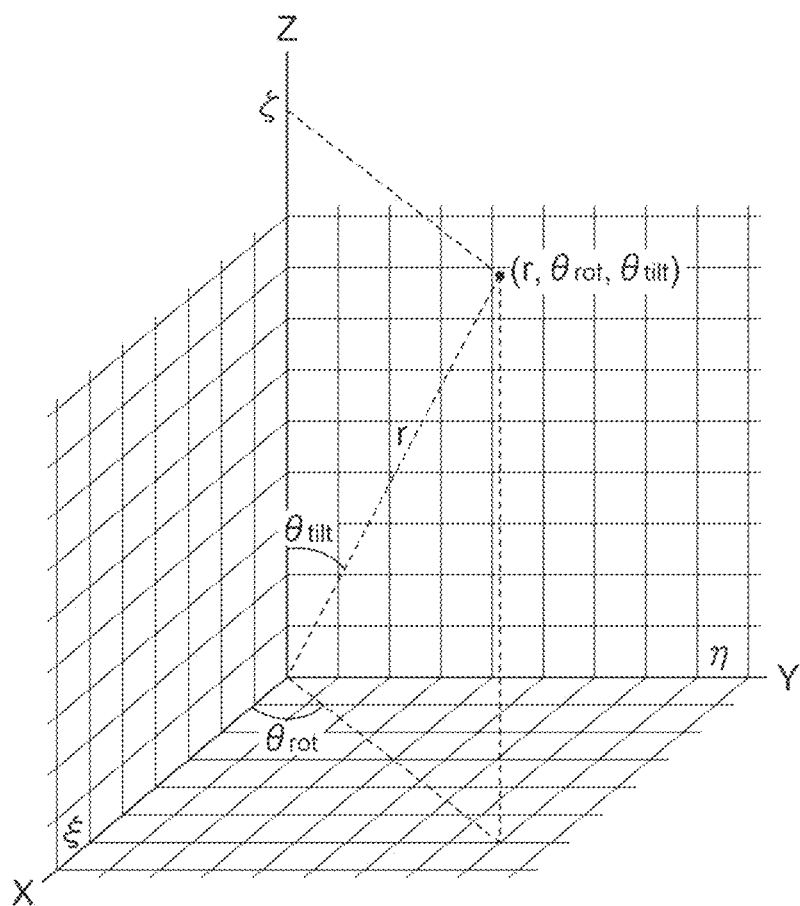
FIG. 17 is a diagram for explaining coordinate transformation from spherical coordinates to coordinates in an XYZ orthogonal coordinate system.

As a second precondition, it is assumed that coordinates (ξ, η, ζ) in the XYZ orthogonal coordinate system satisfy the relationship shown by the following Formulas (1) to (3) with respect to spherical coordinates (r, $\theta_{rot}$, $\theta_{tilt}$) defined by a moving radius length r, a tilt angle $\theta_{tilt}$ from the Z-axis, and a rotation angle $\theta_{rot}$ from the X-axis specified on the X-Y plane, as shown in FIG. 17. It is to be noted that FIG. 17 is a diagram for explaining coordinate transformation from the spherical coordinates (r, $\theta_{rot}$, $\theta_{tilt}$) to the coordinates (ξ, η, ζ) in the XYZ orthogonal coordinate system, in which the coordinates (ξ, η, ζ) express a design optical image on a predetermined plane set in the XYZ orthogonal coordinate system that is a real space. When the beam projection pattern corresponding to the optical image outputted from the surface emitting laser element is a set of bright spots oriented to the direction defined by the angles $\theta_{tilt}$ and $\theta_{rot}$, the angles Nit and O rot are assumed to be converted into the coordinate value $k_x$ on the Kx-axis, which is a normalized wave number defined by the following Formula (4) and corresponds to the X-axis, and the coordinate value $k_y$ on the Ky-axis, which is a normalized wave number defined by the following Formula (5), corresponds to the Y-axis, and is orthogonal to the Kx-axis. The normalized wave number means a wave number normalized with the wave number corresponding to the lattice spacing of a virtual square lattice being 1.0. At this time, in the wave number space defined by the Kx-axis and the Ky-axis, a specific wave number range including the beam pattern corresponding to an optical image is constituted of M2 (integer of 1 or more)×N2 (integer of 1 or more) image regions FR each having a square shape. It is to be noted that the integer M2 does not necessarily coincide with the integer M1. Similarly, the integer N2 also does not necessarily coincide with the integer N1. Formulas (4) and (5) are disclosed in the above-mentioned Non-Patent Document 1, for example.

$$\xi = r \sin\theta_{tilt} \cos\theta_{rot} \qquad (1)$$

$$\eta = r \sin\theta_{tilt} \sin\theta_{rot} \qquad (2)$$

$$\zeta = r \cos\theta_{tilt} \qquad (3)$$

$$k_x = \frac{a}{\lambda}\sin\theta_{tilt}\cos\theta_{rot} \qquad (4)$$

$$k_y = \frac{a}{\lambda}\sin\theta_{tilt}\sin\theta_{rot} \qquad (5)$$

a: Lattice constant of virtual square lattice
λ: Oscillation wavelength

As a third precondition, a complex amplitude F (x, y) obtained by subjecting each of the image regions FR ($k_x$, $k_y$) specified by a coordinate component kg (integer of 0 or more and M2-1 or less) in the Kx-axis direction and a coordinate component $k_y$ (integer of 0 or more and N2-1 or less) in the Ky-axis direction in the wave number space to the two-dimensional inverse discrete Fourier transform into the unit constituent region R (x, y) on the X-Y plane specified by the coordinate component x (integer of 0 or more and M1-1 or less) in the X-axis direction and the coordinate component y (integer of 0 or more and N1-1 or less) in the Y-axis direction is given by the following Formula (6), with j being an imaginary unit. When the amplitude term is A (x, y) and the phase term is P (x, y), the complex amplitude F (x, y) is defined by the following Formula (7). Furthermore, as a fourth precondition, the unit constituent region R (x, y) is defined by the s-axis and the t-axis, which are parallel to the X-axis and the Y-axis, respectively, and orthogonal to each other at the lattice point O (x, y) serving as the center of the unit constituent region R (x, y).

$$F(x, y) = \sum_{k_x=0}^{M2-1} \sum_{k_y=0}^{N2-1} FR(k_x, k_y)\exp\left[j2\pi\left(\frac{k_x}{M2}x + \frac{k_y}{N2}y\right)\right] \qquad (6)$$

$$F(x,y)=A(x,y)\times \exp[jP(x,y)] \qquad (7)$$

Under the above first to fourth preconditions, the phase modulation layer 15B is configured to satisfy the following first and second conditions. That is, the first condition is that the center of gravity G is arranged in the unit constituent region R (x, y) in a state away from the lattice point O (x, y). The second condition is that, in a state where the line length r (x, y) from the lattice point O (x, y) to the corresponding center of gravity G is set to a common value in each of the M1×N1 unit constituent regions R, the corresponding modified refractive index region 15b is arranged in the unit component regions R (x, y) so that the angle φ (x, y) formed by the line segment connecting the lattice point O (x, y) and the corresponding center of gravity G and the s-axis satisfies the relationship, $$\varphi(x,y)=C\times P(x,y)+B$$

C: Proportional constant, e.g., 180°/z
B: Arbitrary constant, e.g., 0.

Figure 18:
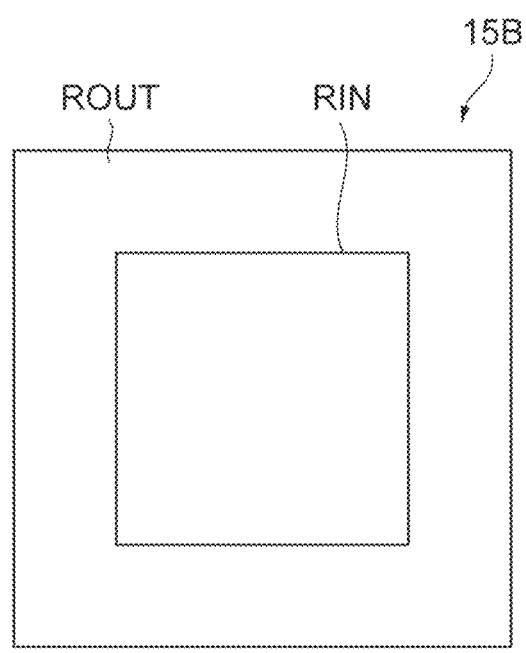
FIG. 18 is a plan view showing an example in which the refractive index structure of FIG. 14 is applied only in a specific region of the phase modulation layer.
Figure 20:
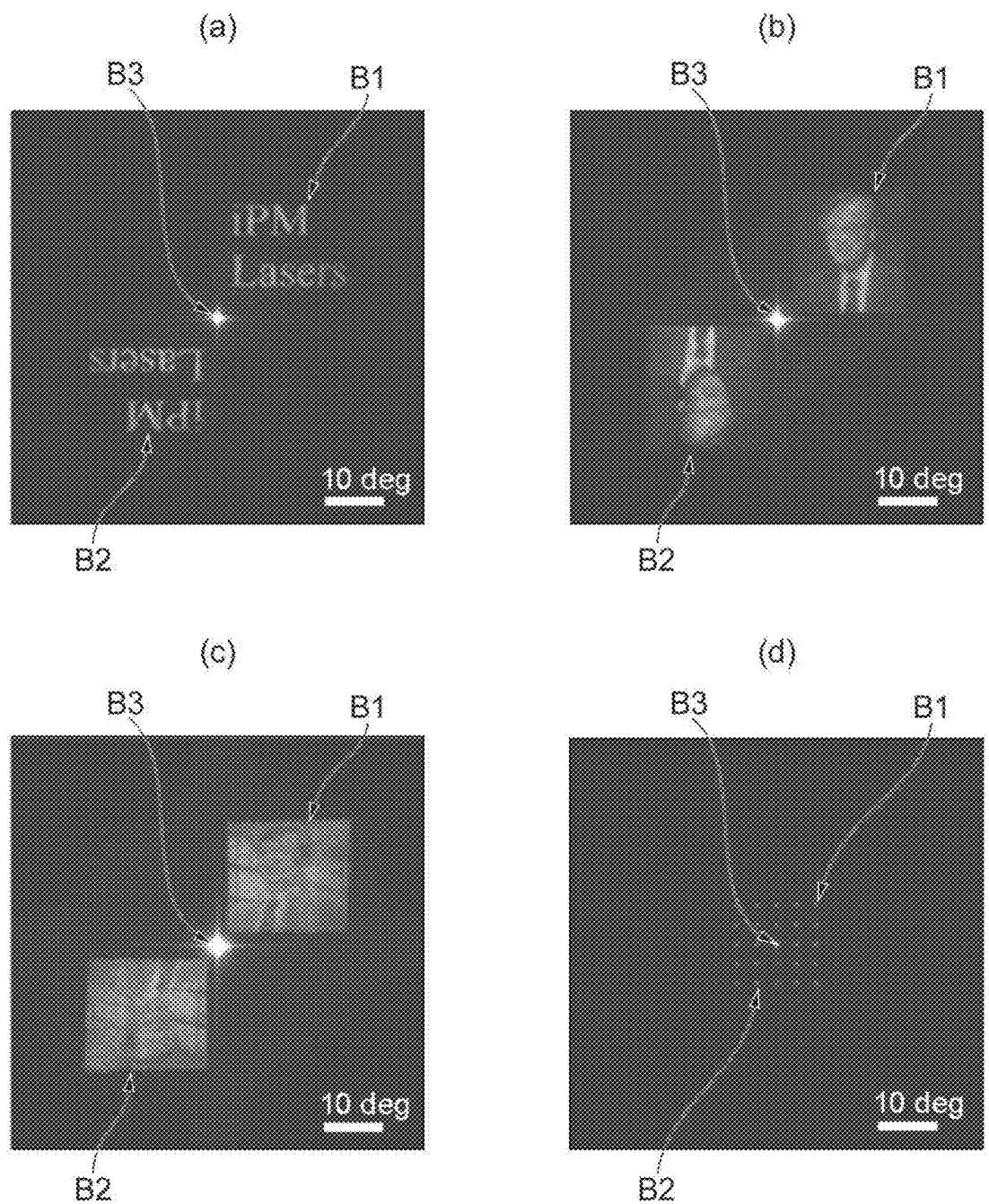
FIGS. 20A to 20D show examples of beam patterns (optical images) outputted from the surface emitting laser element.

FIG. 18 is a plan view showing an example in which the refractive index structure of FIG. 14 is applied only in a specific region of the phase modulation layer. In the example of FIG. 18, a refractive index structure (e.g.: structure of FIG. 14) for outputting a target beam projection pattern is formed inside the inner region RIN of the square. On the other hand, in an outer region ROUT surrounding the inner region RIN, a perfect circular modified refractive index region whose center of gravity coincides with the lattice point position of the square lattice is arranged. For example, the filling factor FF in the outer region ROUT is set to 12%. Inside the inner region RIN and in the outer region ROUT, the lattice spacings of the virtually set square lattices are identical (=a). This structure has an advantage that the light is distributed also in the outer region ROUT, it is hence possible to suppress the occurrence of high-frequency noise (so-called window function noise) caused by a sudden change in the light intensity at the periphery of the inner region RIN. In addition, light leakage in the in-plane direction can be suppressed, and a reduction in threshold current can be expected.

As a method of obtaining the intensity distribution and the phase distribution from the complex amplitude distribution obtained by the inverse Fourier transform, for example, an intensity (amplitude) distribution I (x, y) can be calculated by using the abs function of "MATLAB", numerical analysis software of MathWorks, Inc., and the phase distribution P (x, y) can be calculated by using the angle function of MATLAB.

Here, points of attention will be given regarding a case where a general discrete Fourier transform (or fast Fourier transform) is used for calculation when the rotation angle distribution φ (x, y) is obtained from the inverse Fourier transform result of the optical image and the arrangement of each modified refractive index region 15b is determined. An output beam pattern calculated from the complex amplitude distribution obtained by the inverse Fourier transform of FIG. 19A, which is a desired optical image becomes as shown in FIG. 19B. When divided into four quadrants of A1, A2, A3, and A4 as shown in FIGS. 19A and 19B, in the first quadrant of the output beam pattern of FIG. 19B, a pattern in which the pattern obtained by rotating the pattern in the first quadrant in FIG. 19A by 180 degrees and the pattern in the third quadrant in FIG. 19A are superimposed appears. In the second quadrant of the beam pattern, a pattern in which the pattern obtained by rotating the pattern in the second quadrant in FIG. 19A by 180 degrees and the pattern in the fourth quadrant in FIG. 19A are superimposed appears. In the third quadrant of the beam pattern, a pattern in which the pattern obtained by rotating the pattern in the third quadrant in FIG. 19A by 180 degrees and the pattern in the first quadrant in FIG. 19A are superimposed appears. In the fourth quadrant of the beam pattern, a pattern in which the pattern obtained by rotating the pattern in the fourth quadrant in FIG. 19A by 180 degrees and the pattern in the second quadrant in FIG. 19A are superimposed appears. At this time, the pattern rotated by 180 degrees is a pattern formed by the −1 order light component.

Therefore, when a pattern having a value only in the first quadrant is used as an optical image (original optical image) before the inverse Fourier transform, the first quadrant of the original optical image appears in the third quadrant of the resulting beam projection pattern, and a pattern in which the pattern in the first quadrant of the original optical image is rotated by 180 degrees appears in the first quadrant of the resulting beam projection pattern.

FIGS. 20A to 20D show examples of beam projection patterns (optical images) outputted from GaAs-based S-iPM laser in the near-infrared wavelength band using the same principle as that in the second embodiment. The center of each figure corresponds to the axis (Z-axis) perpendicular to the main surface 10a of the semiconductor substrate 10. As shown in these figures, the surface emitting laser element outputs +1 order light outputted in a first direction tilted with respect to the axis and including a first optical image portion B1, −1 order light outputted in a second direction symmetrical with the first direction with respect to the axis and including a second optical image portion B2 rotationally symmetrical with the first optical image portion B1 with respect to the axis, and zero-order light B3 traveling on the axis.

As described above, in the phase modulation layer 15B, the centers of gravity G of the plurality of modified refractive index regions 15b have a rotation angle set for each modified refractive index region 15b around the lattice point O of the virtual square lattice. In such a case, as compared with the case where the centers of gravity G of the plurality of modified refractive index regions 15b are located on the lattice point O of the square lattice (first embodiment), the light intensity of light (zero-order light B3) outputted in the direction perpendicular to the main surface 10a of the semiconductor substrate 10 is reduced, and the light intensity of high-order light (e.g., +1 order light and −1 order light) outputted in the direction tilted with respect to the direction is increased. Furthermore, since the center of gravity G of each modified refractive index region 15b has a rotation angle corresponding to the optical image, the phase of light can be modulated for each modified refractive index region 15b. Therefore, according to this surface emitting laser element, it is possible to output an optical image of any shape in a direction tilted with respect to a direction perpendicular to the main surface 10a of the semiconductor substrate 10.

The surface emitting laser element of the second embodiment includes, similarly to the first embodiment, the first variation, or the second variation, both or one of the high refractive index layers 16 and 17 (see FIGS. 2 and 3) having a higher refractive index than that of the cladding layers 11 and 13 and the phase modulation layer 15B. The high refractive index layers 16 and 17 are respectively provided in the vicinity of the phase modulation layer 15B, i.e., at a position between the cladding layer 11 and the cladding layer 13, where the phase modulation layer 15B is sandwiched with the active layer 12, and between the active layer 12 and the phase modulation layer 15B. Since the high refractive index layers 16 and 17 have an optical confinement coefficient larger than the surrounding layers have, the optical confinement coefficient of the phase modulation layer 15B located in the vicinity of the high refractive index layers 16 and 17 also becomes large under the influence thereof. Therefore, according to the surface emitting laser element of the second embodiment, the optical confinement coefficient of the phase modulation layer 15B (i.e., the layer forming the resonance mode) can be increased. Also in the surface emitting laser element, the high refractive index layer 16 (17) has a superlattice structure in which two or more layers 16a and 16b (17a and 17b) having refractive indices different from each other are repeatedly laminated. This can disperse the strain caused by the difference in lattice constant. That is, it is possible to easily realize the high refractive index layers 16 and 17 having a sufficient thickness as a whole while reducing defects caused by distortion.

Third Embodiment

Figure 21:
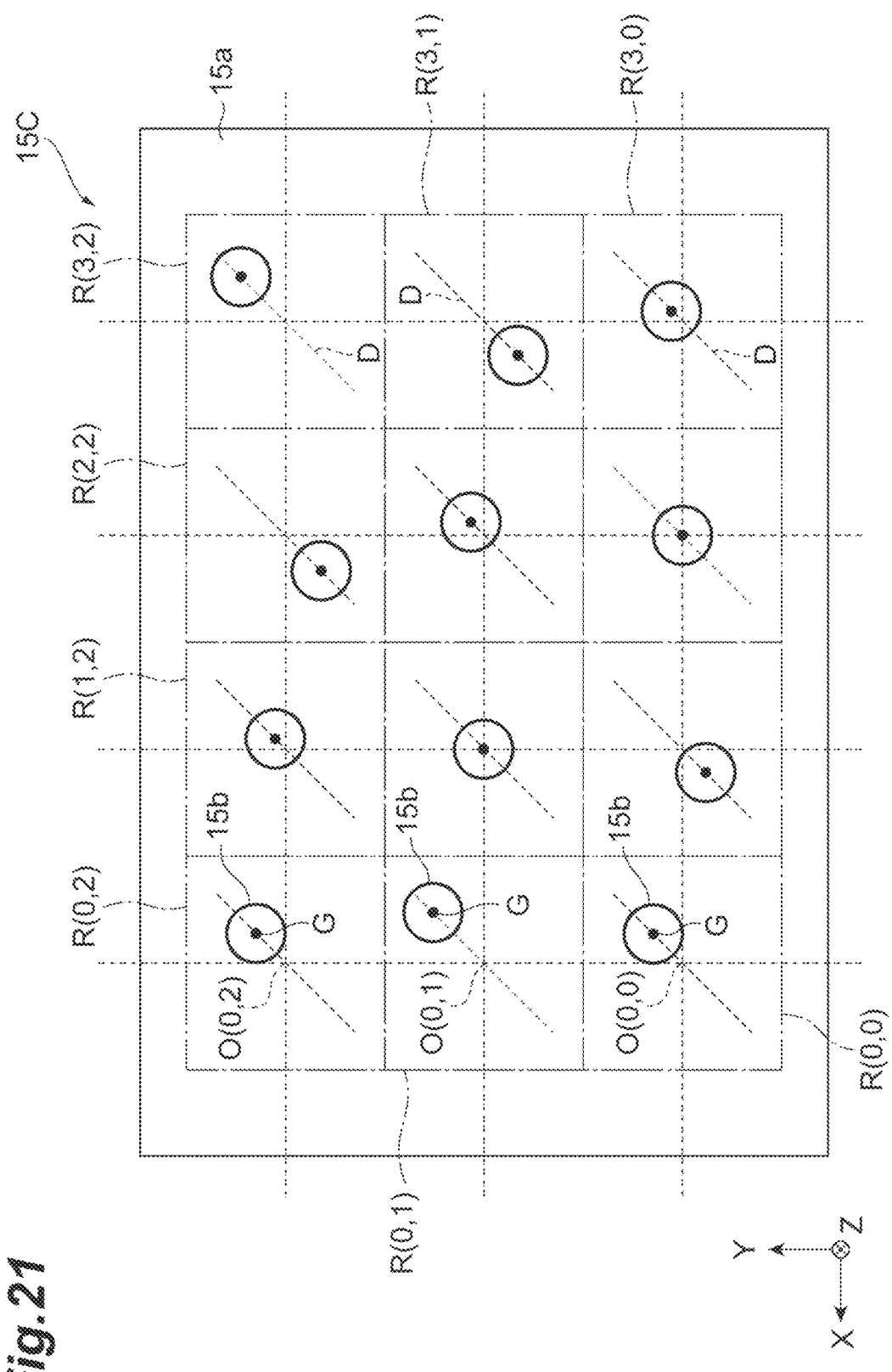
FIG. 21 is a plan view of a phase modulation layer 15C included in S-iPM laser.
Figure 22:
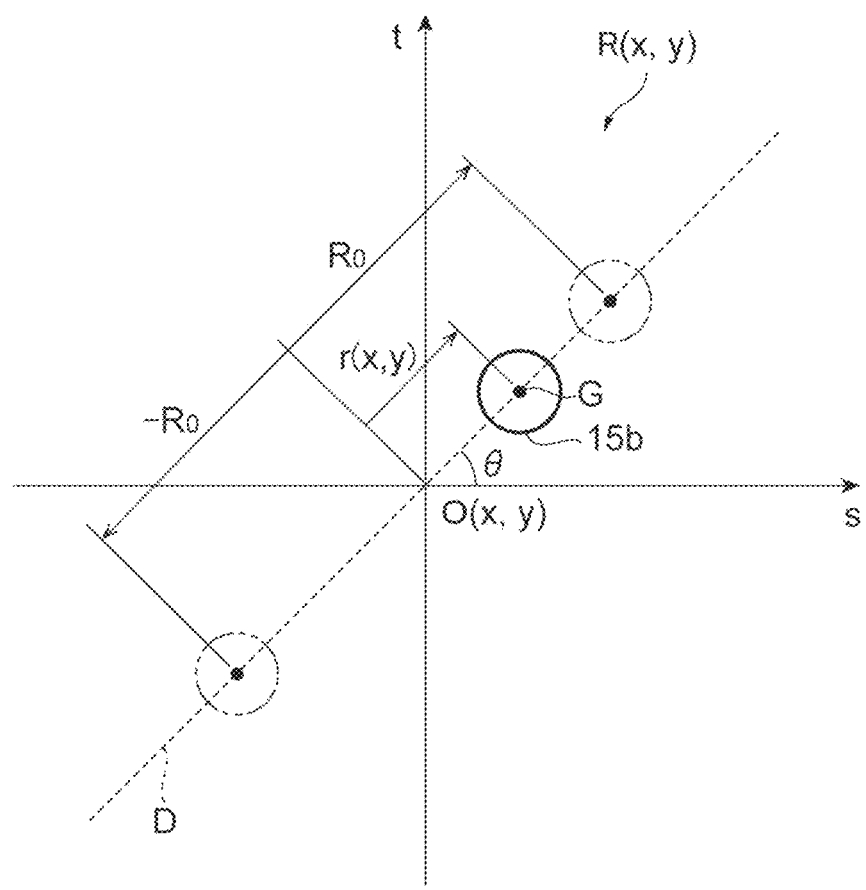
FIG. 22 is a diagram showing the positional relationship of the modified refractive index region 15b in the phase modulation layer 15C.

The S-iPM laser is not limited to the configuration of the second embodiment described above. For example, even the configuration of the phase modulation layer of the third embodiment can preferably realize the S-iPM laser. FIG. 21 is a plan view of the phase modulation layer 15C included in S-iPM laser. FIG. 22 is a diagram showing the positional relationship of the modified refractive index region 15b in the phase modulation layer 15C. The phase modulation layer 15C is a resonance mode formation layer in this third embodiment. As shown in FIGS. 21 and 22, in the phase modulation layer 15C, the center of gravity G of each modified refractive index region 15b is arranged on the straight line D. The straight line D is a straight line passing through the corresponding lattice point O of each unit constituent region R and tilted with respect to each side of the square lattice. In other words, the straight line D is a straight line tilted with respect to both the s-axis (the axis parallel to the X-axis) and the t-axis (the axis parallel to the Y-axis) that define the coordinate system of the unit constituent region R(x, y). The tilt angle of the straight line D with respect to one side of the square lattice (the s-axis positive direction) is θ. The tilt angle θ is constant in the phase modulation layer 15C. The tilt angle θ satisfies $0°<θ<90°$, and $θ=45°$ in one example. Alternatively, the tilt angle θ satisfies $180°<θ<270°$, and $θ=225°$ in one example. When the tilt angle θ satisfies $0°<θ<90°$ or $180°<θ<270°$, the straight line D extends from the first quadrant to the third quadrant of the coordinate plane defined by the s-axis and the t-axis. Alternatively, the tilt angle θ satisfies 90°<θ<180°, and θ=135° in one example. Alternatively, the tilt angle θ satisfies 270°<θ<360°, and θ=315° in one example. When the tilt angle θ satisfies 90°<θ<180° or 270°<θ<360°, the line D extends from the second quadrant to the fourth quadrant of the coordinate plane defined by the s-axis and the t-axis. Thus, the tilt angle θ is an angle excluding 0°, 90°, 180°, and 270°. By setting the tilt angle θ as described above, it is possible to cause both the light wave traveling in the X-axis direction and the light wave traveling in the Y-axis direction to contribute to the output beam. Here, let the distance between the lattice point O and the center of gravity G be r (x, y). x denotes the position of the x-th lattice point on the X-axis and y denotes the position of the y-th lattice point on the Y-axis. When the distance r (x, y) is a positive value, the center of gravity G is located in the first quadrant (or the second quadrant). When the distance r (x, y) is a negative value, the center of gravity G is located in the third quadrant (or the fourth quadrant). When the distance r (x, y) is 0, the lattice point O and the center of gravity G coincide with each other.

The distance r (x, y) between the center of gravity G of each modified refractive index region and the lattice point O (x, y) located at the center (origin of the s-t coordinate system) of each unit constituent region R (x, y) shown in FIG. 21 is set individually for each modified refractive index region 15b according to a desired optical image. The distribution of the distance r (x, y) has a specific value for each unit constituent region R (x, y) determined by the values of the coordinate values x and y, but is not necessarily represented by a specific function. The distribution of the distance r (x, y) is determined from a phase distribution included in a complex amplitude distribution obtained by performing an inverse Fourier transform on a desired optical image. That is, as shown in FIG. 22, the distance r (x, y) is set to 0 when the phase P (x, y) in a certain unit constituent region R (x, y) is $P_0$. When the phase P (x, y) is $\pi + P_0$, the distance r (x, y) is set to the maximum value $R_0$. When the phase P (x, y) is $-\pi + P_0$, the distance r (x, y) is set to the minimum value $-R_0$. Then, for an intermediate phase P (x, y), the distance r (x, y) is given so that r (x, y)={P (x, y)−$P_0$}×$R_0$/π is true. Here, the initial phase $P_0$ can be set arbitrarily. Assuming that the lattice spacing of the square lattice is a, the maximum value $R_0$ of r (x, y) is within the range of, for example, $$0 \le R_0 \le \frac{a}{\sqrt{2}} \qquad (8)$$

It is to be noted that when the complex amplitude distribution is obtained from the desired optical image, the reproducibility of the beam projection pattern is improved by applying a repetition algorithm such as the Gerchberg-Saxton (GS) method commonly used at the time of calculation of hologram generation.

In this third embodiment, a desired optical image can be obtained by determining the distribution of the distance r (x, y) of the modified refractive index region 15b of the phase modulation layer 15C by the following procedure. That is, the above first to fourth preconditions described in the second embodiment, the phase modulation layer 15C is configured to satisfy the following conditions. That is, the corresponding modified refractive index region 15b is arranged in the unit constituent regions R (x, y) so that the distance r (x, y) from the lattice point O (x, y) to the center of gravity G of the corresponding modified refractive index region 15b satisfies the following relationship.

$$r(x,y)=C\times(P(x,y)-P_0)$$

C: Proportional constant, e.g., $R_0/\pi$ $P_0$: Arbitrary constant, e.g., 0. That is, the distance r (x, y) is set to 0 when the phase P (x, y) in the unit constituent region R (x, y) is $P_0$. When the phase P (x, y) is $\pi + P_0$, the distance r (x, y) is set to the maximum value $R_0$. When the phase P (x, y) is $-\pi + P_0$, the distance r (x, y) is set to the minimum value $-R_0$. When it is desired to obtain a desired optical image, it is preferable that the optical image is subjected to inverse discrete Fourier transform and the distribution of the distance r (x, y) corresponding to the phase P (x, y) of its complex amplitude is given to the plurality of modified refractive index regions 15b. The phase P (x, y) and the distance r (x, y) may be proportional to each other.

It is to be noted that also in the third embodiment, the refractive index structure of FIG. 21 may be applied only in a specific region of the phase modulation layer. For example, as in the example of FIG. 18, a refractive index structure (e.g.: structure of FIG. 21) for outputting a target beam projection pattern is formed inside the inner region RIN of the square. In this case, in an outer region ROUT surrounding the inner region RIN, a perfect circular modified refractive index region whose center of gravity coincides with the lattice point position of the square lattice is arranged. For example, the filling factor FF in the outer region ROUT is set to 12%. Inside the inner region RIN and in the outer region ROUT, the lattice spacings of the virtually set square lattices are identical (=a). In the case of this structure, the light is distributed also in the outer region ROUT, it is hence possible to suppress the occurrence of high-frequency noise (so-called window function noise) caused by a sudden change in the light intensity at the periphery of the inner region RIN. In addition, light leakage in the in-plane direction can be suppressed, and a reduction in threshold current can be expected.

As a method of obtaining the intensity distribution and the phase distribution from the complex amplitude distribution obtained by the inverse Fourier transform, for example, an intensity (amplitude) distribution I (x, y) can be calculated by using the abs function of "MATLAB", numerical analysis software of MathWorks, Inc., and the phase distribution P (x, y) can be calculated by using the angle function of MATLAB. It is to be noted that the points of attention regarding a case where a general discrete Fourier transform (or fast Fourier transform) is used for calculation when the phase distribution P (x, y) is obtained from the inverse Fourier transform result of the optical image and the distance r (x, y) of each modified refractive index region 15b is determined are the same as those in the second embodiment described above.

As described above, in the phase modulation layer 15C, the centers of gravity G of the plurality of modified refractive index regions 15b are arranged on the straight line D passing through the lattice point O of the virtual square lattice and tilted with respect to the square lattice. Then, the distance r (x, y) between the center of gravity G of each modified refractive index region 15b and the corresponding lattice point O is individually set according to the optical image. Also in such a case, as compared with the case where the centers of gravity of the plurality of modified refractive index regions 15b are located on the lattice point O of the square lattice (first embodiment), the light intensity of light (zero-order light B3 shown in FIGS. 20A to 20D) outputted along the normal direction of the main surface 10a of the semiconductor substrate 10 is reduced, and the light intensity of high-order light (e.g., +1 order light and −1 order light) outputted along the tilt direction intersecting with the normal direction is increased. Furthermore, since the distance r (x, y) between the center of gravity G of each modified refractive index region 15b and the corresponding lattice point O is individually set according to the optical image, the phase of light can be modulated for each modified refractive index region 15b. Therefore, according to the surface emitting laser element, an optical image of any shape can be outputted along a tilt direction intersecting with the normal direction of the main surface 10a of the semiconductor substrate 10.

The surface emitting laser element of the third embodiment also includes, similarly to the first embodiment, the first variation, or the second variation described above, both or one of the high refractive index layers 16 and 17 (see FIGS. 2 and 3) having a higher refractive index than that of the cladding layers 11 and 13 and the phase modulation layer 15C. The high refractive index layers 16 and 17 are respectively provided in the vicinity of the phase modulation layer 15C, i.e., at a position between the cladding layer 11 and the cladding layer 13, where the phase modulation layer 15C is sandwiched with the active layer 12, and between the active layer 12 and the phase modulation layer 15C. Since the high refractive index layers 16 and 17 have an optical confinement coefficient larger than the surrounding layers have, the optical confinement coefficient of the phase modulation layer 15C located in the vicinity of the high refractive index layers 16 and 17 also becomes large under the influence thereof. Therefore, also according to the surface emitting laser element of the third embodiment, the optical confinement coefficient of the phase modulation layer 15C (i.e., the layer forming the resonance mode) can be increased. Also in the surface emitting laser element, the high refractive index layer 16 (17) has a superlattice structure in which two or more layers 16a and 16b (17a and 17b) having refractive indices different from each other are repeatedly laminated. This can disperse the strain caused by the difference in lattice constant. That is, it is possible to easily realize the high refractive index layers 16 and 17 having a sufficient thickness as a whole while reducing defects caused by distortion.

(Fourth Variation)

Figure 23:
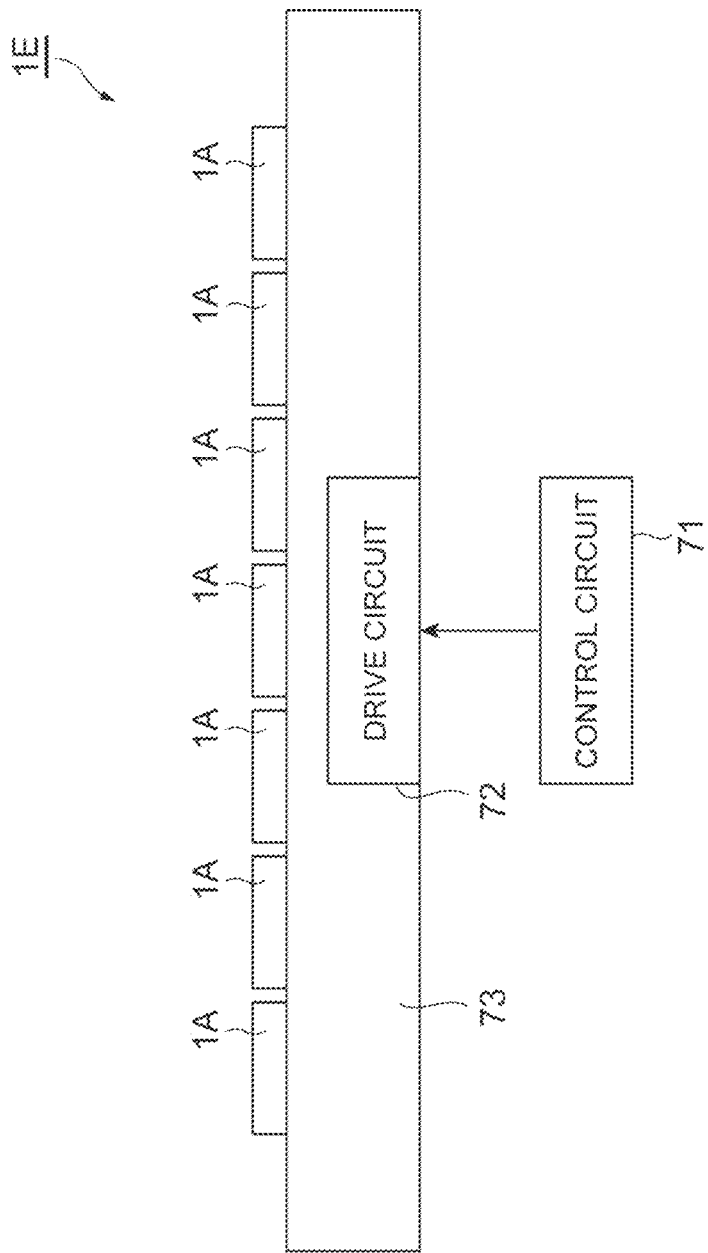
FIG. 23 is a diagram showing the configuration of a light-emitting apparatus 1E according to a fourth variation.

FIG. 23 is a diagram showing the configuration of the light-emitting apparatus 1E according to the fourth variation. The light-emitting apparatus 1E includes a support substrate 73, the plurality of surface emitting laser elements 1A arrayed one-dimensionally or two-dimensionally on the support substrate 73, and a drive circuit 72 that individually drives the plurality of surface emitting laser elements 1A. The configuration of each surface emitting laser element 1A has the same structure as that of the first embodiment. The drive circuit 72 is provided on the back surface or inside of the support substrate 73, and individually drives each surface emitting laser element 1A. The drive circuit 72 supplies a drive current to the individual surface emitting laser elements 1A in accordance with an instruction from a control circuit 71.

It is possible to preferably realize a head-up display or the like by, as in the fourth variation, providing the plurality of individually driven surface emitting laser elements 1A. It is to be noted that in the present variation, a surface emitting laser element according to another embodiment or variation may be applied in place of the surface emitting laser element 1A. Also in that case, the same effects can be obtained.

Specific Example

The inventors have examined the relationship between the refractive index of the high refractive index layers 16 and 17 and the optical confinement coefficient of the resonance mode formation layer in each embodiment described above. The results will be described below. FIGS. 24 to 33 are tables showing specific layer structures of the surface emitting laser element. These tables show the conductivity type (p is p-type, n is n-type, and u is undoped), composition, film thickness, refractive index, and optical confinement coefficient F of each layer. It is to be noted that the layer number 1 indicates the contact layer 14, the layer number 2 indicates the cladding layer 13, the layer number 3 indicates the carrier barrier layer, the layer number 4 indicates the guide layer, the layer numbers 5 to 11 indicate the active layers 12 of the multiple quantum well structure, the layer number 12 indicates the carrier barrier layer, the layer number 13 indicates the high refractive index layer 16, the layer number 14 indicates the guide layer 18, the layer number 15 indicates the resonance mode formation layer (the photonic crystal layer 15A, and the phase modulation layer 15B or 15C), the layer number 16 indicates the guide layer, the layer number 17 indicates the high refractive index layer 17, the layer number 18 indicates the guide layer, and the layer number 19 indicates the cladding layer 11. It is to be noted that a refractive index $n_{Air\text{-}hole}$ of the resonance mode formation layer is calculated using the following Formula (9) expressing the average permittivity.

$$n_{Air\text{-}Hole} = \sqrt{FF \cdot n_{Air}^2 + (1-FF)n_{GaN}^2} \qquad (9)$$

$n_{Air}$ is the refractive index of air (=1), $n_{GaN}$ is the refractive index of GaN(=2.5549), and FF is the filling factor (=0.15).

In these structure examples, the In composition of the InGaN layers (layers 16a and 17a) of the high refractive index layers 16 and 17 is 0% (FIG. 24), 1% (FIG. 25), 2% (FIG. 26), 3% (FIG. 27), 4% (FIG. 28), 5% (FIG. 29), 6% (FIG. 30), 7% (FIG. 31), 8% (FIG. 32), and 9% (FIG. 33), respectively, thereby changing the refractive index of the InGaN layers of the high refractive index layers 16 and 17 at a wavelength of 405 nm from 2.5549 to 2.7425.

Figure 34:
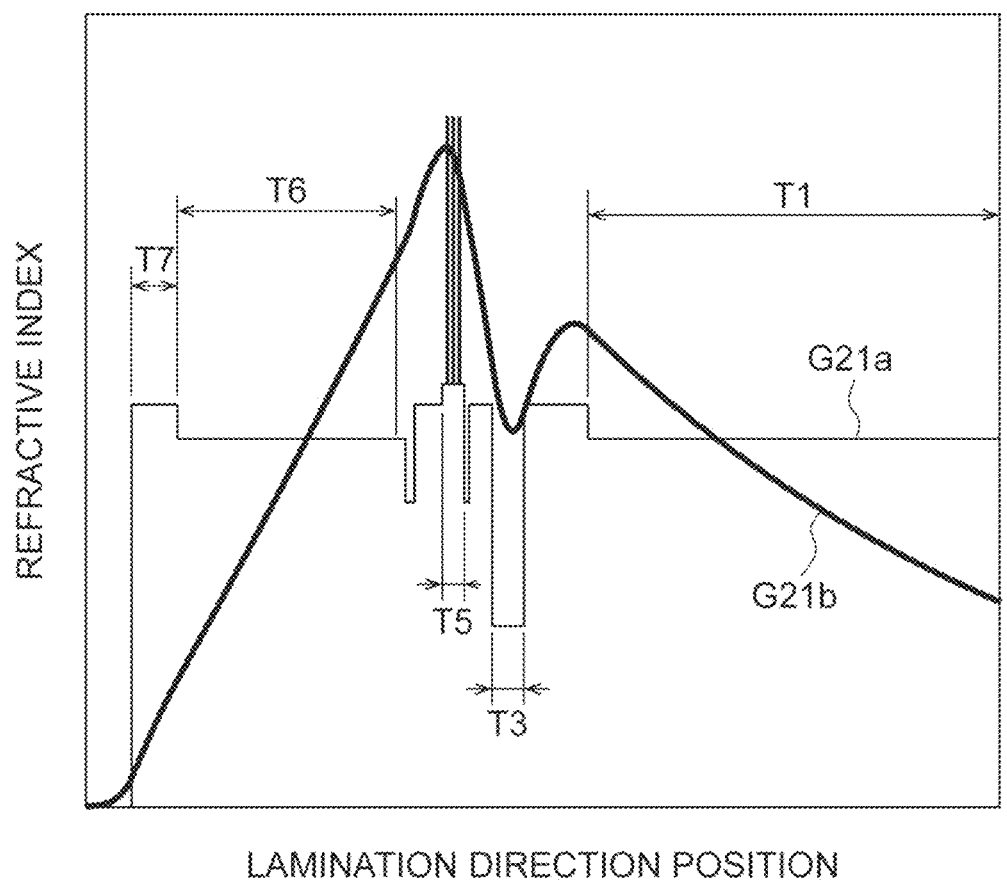
FIG. 34 is a graph showing a refractive index profile and mode distribution of the surface emitting laser element including the layer structure shown in FIG. 24.
Figure 35:
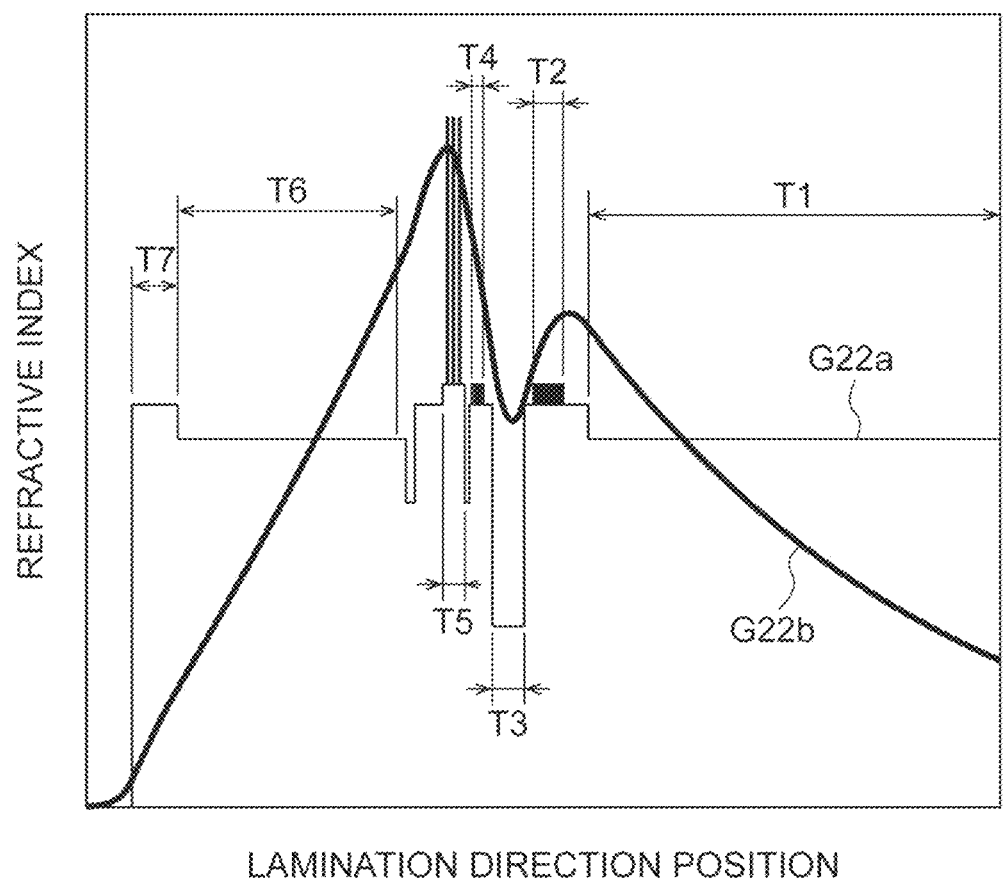
FIG. 35 is a graph showing a refractive index profile and mode distribution of the surface emitting laser element including the layer structure shown in FIG. 25.
Figure 36:
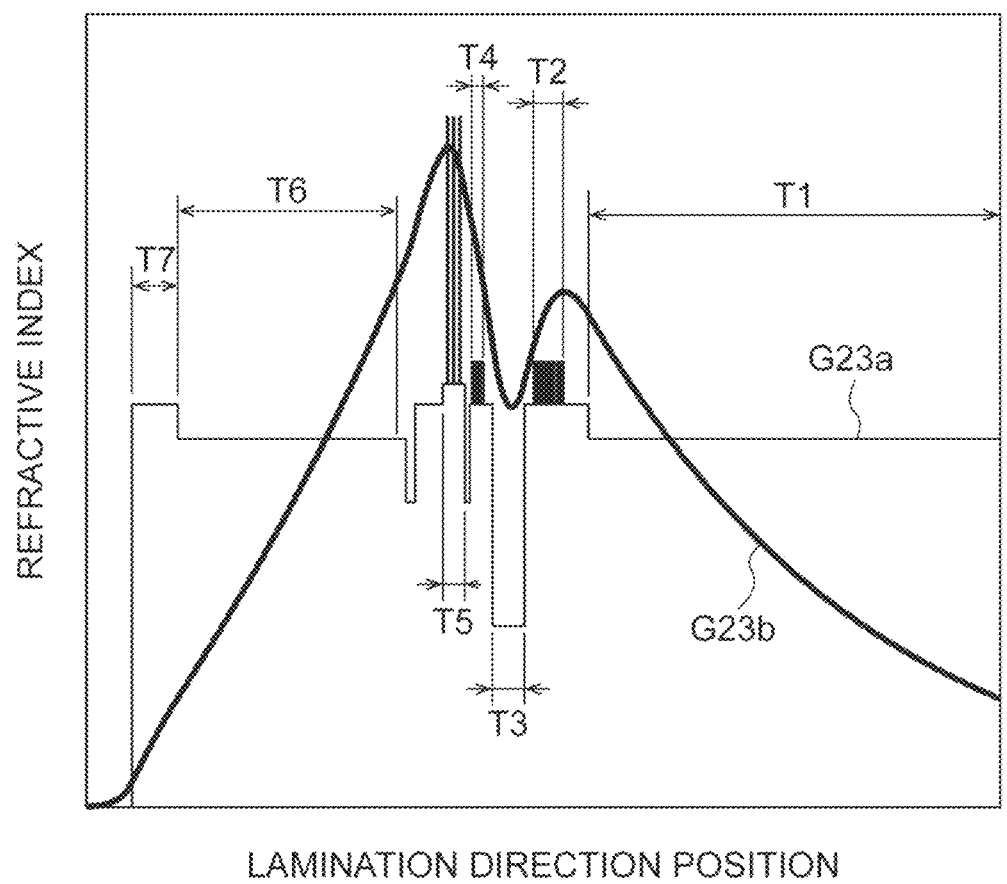
FIG. 36 is a graph showing a refractive index profile and mode distribution of the surface emitting laser element including the layer structure shown in FIG. 26.
Figure 37:
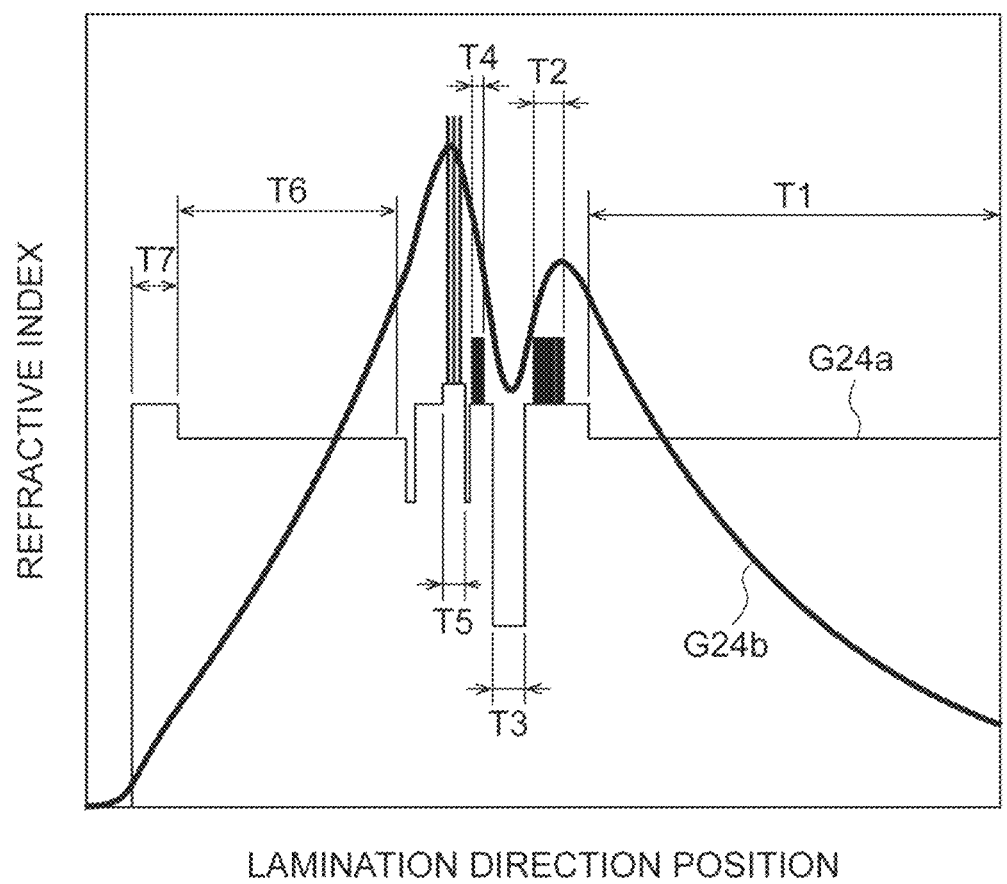
FIG. 37 is a graph showing a refractive index profile and mode distribution of the surface emitting laser element including the layer structure shown in FIG. 27.
Figure 38:
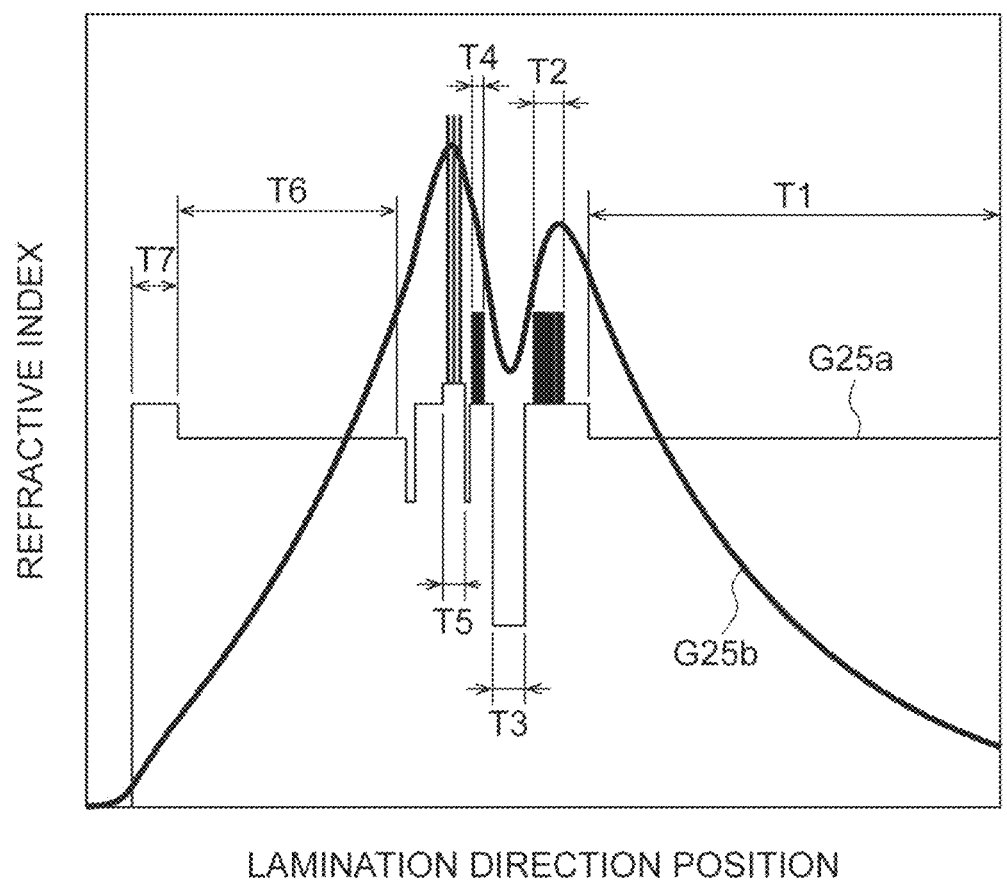
FIG. 38 is a graph showing a refractive index profile and mode distribution of the surface emitting laser element including the layer structure shown in FIG. 28.
Figure 39:
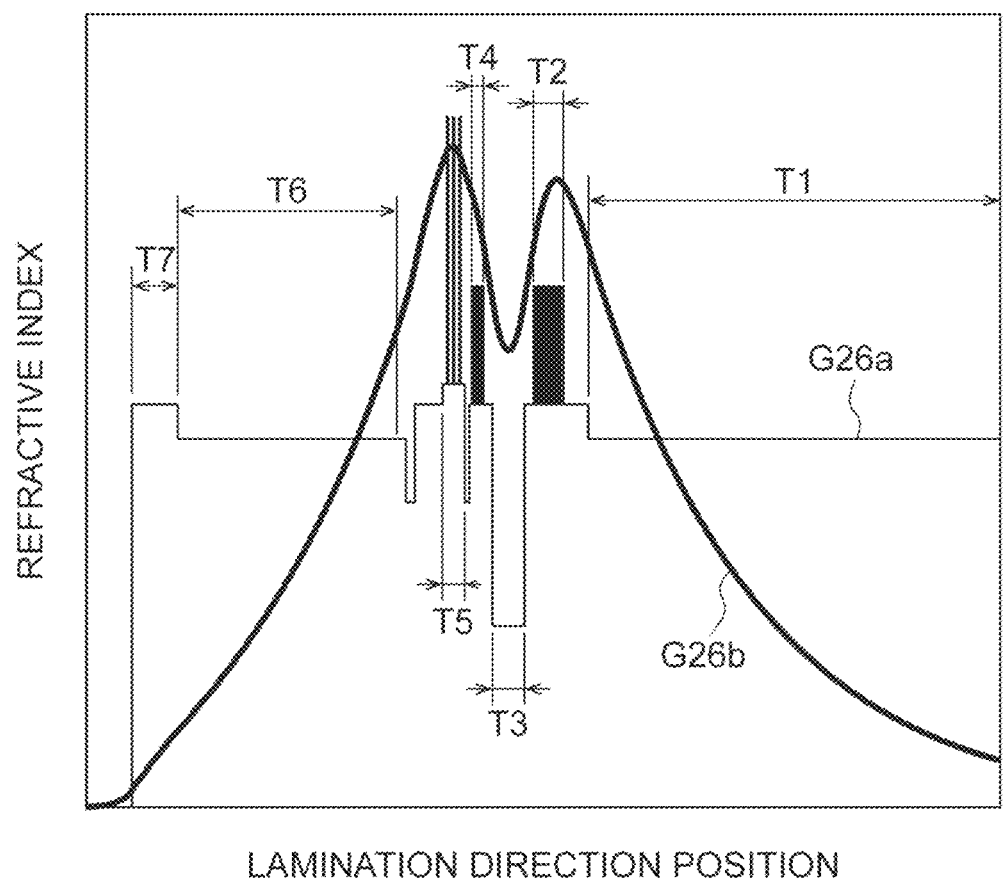
FIG. 39 is a graph showing a refractive index profile and mode distribution of the surface emitting laser element including the layer structure shown in FIG. 29.
Figure 40:
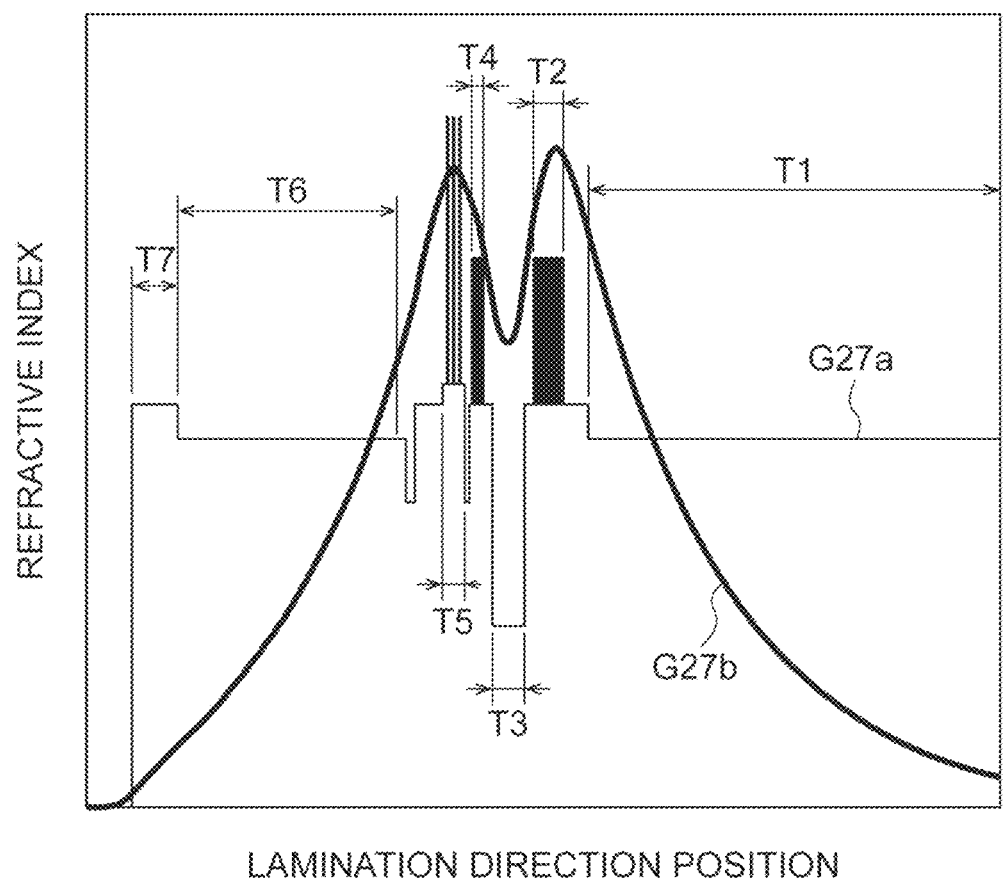
FIG. 40 is a graph showing a refractive index profile and mode distribution of the surface emitting laser element including the layer structure shown in FIG. 30.
Figure 41:
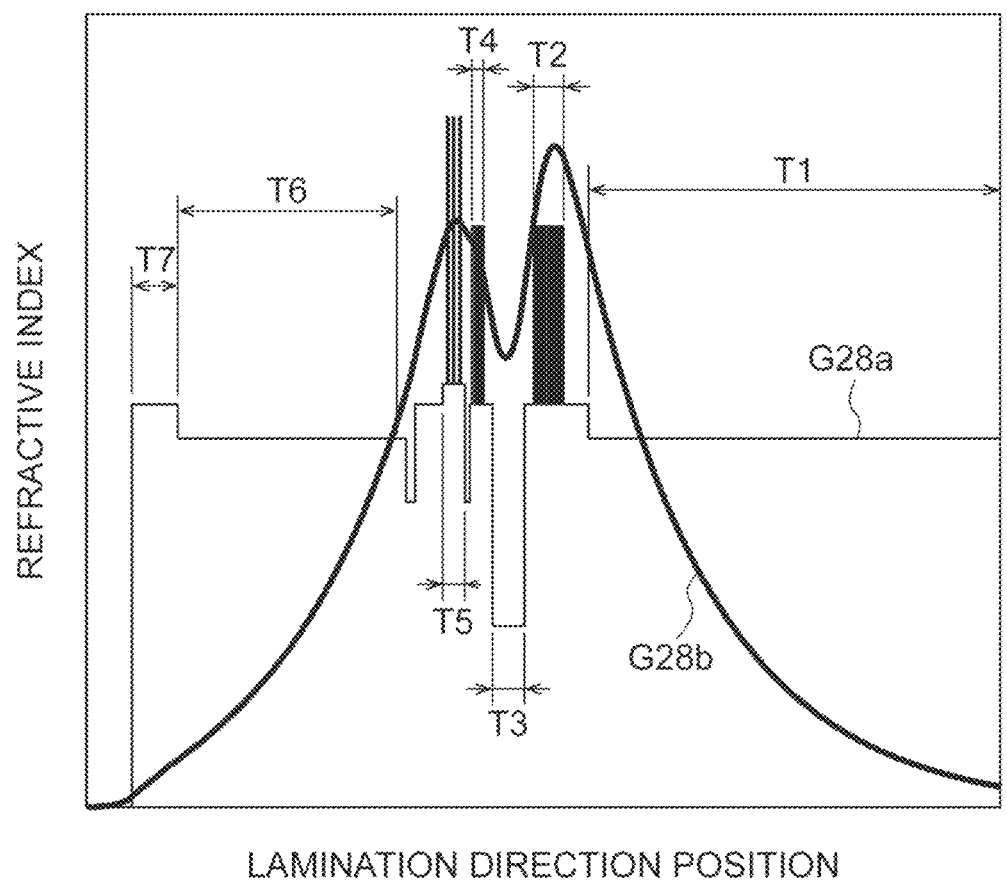
FIG. 41 is a graph showing a refractive index profile and mode distribution of the surface emitting laser element including the layer structure shown in FIG. 31.
Figure 42:
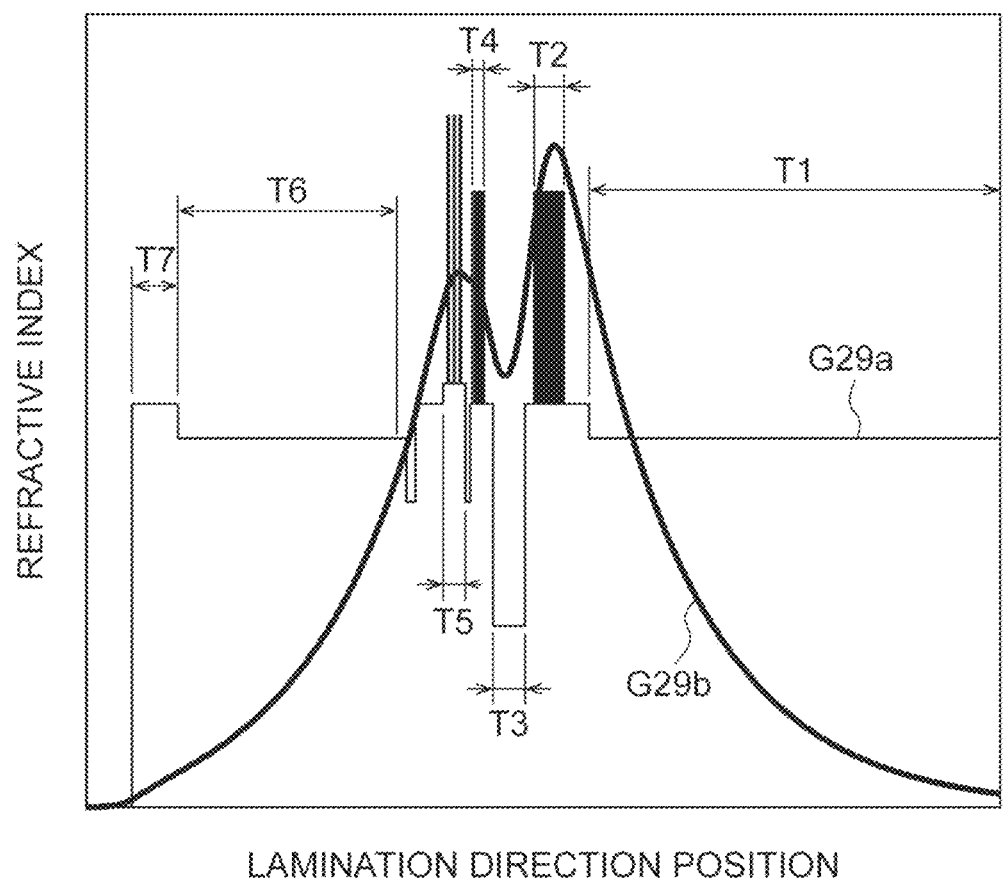
FIG. 42 is a graph showing a refractive index profile and mode distribution of the surface emitting laser element including the layer structure shown in FIG. 32.
Figure 43:
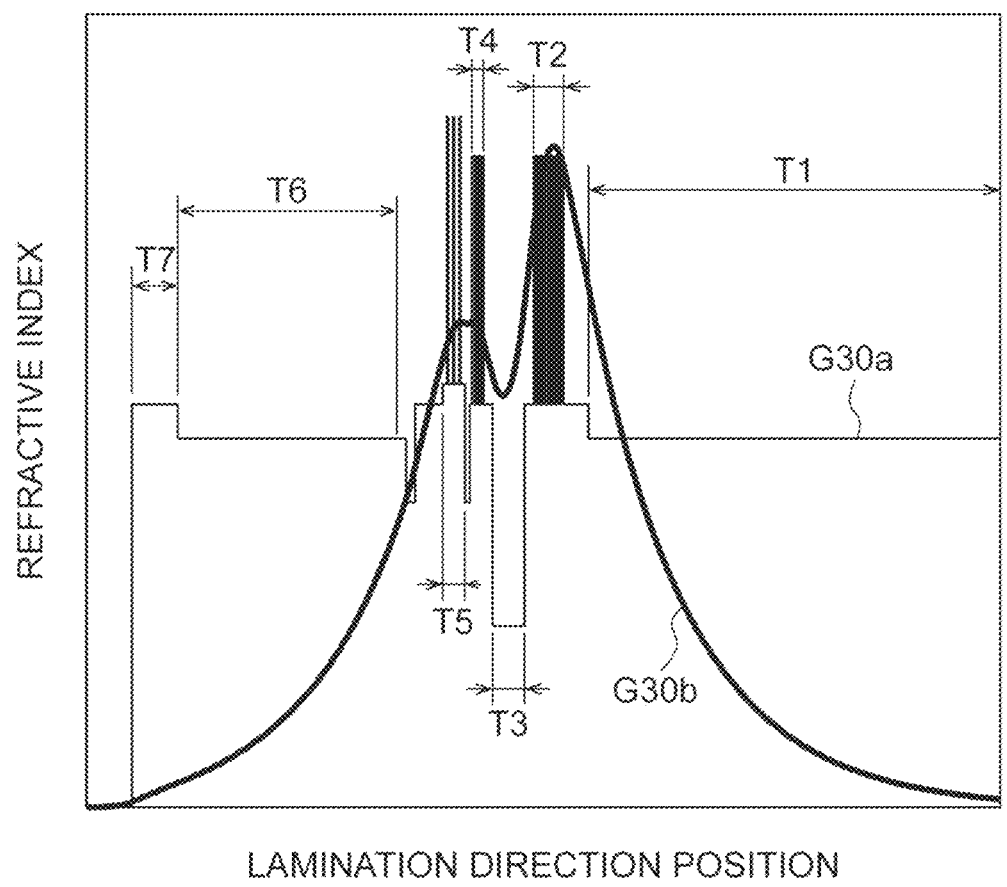
FIG. 43 is a graph showing a refractive index profile and mode distribution of the surface emitting laser element including the layer structure shown in FIG. 33.

FIGS. 34 to 43 are graphs each showing a surface emitting laser element, refractive index profile, and mode distribution as follows: FIG. 34 shows a surface emitting laser element having a layer structure shown in FIG. 24; FIG. 35 shows a surface emitting laser element having a layer structure shown in FIG. 25; FIG. 36 shows a surface emitting laser element having a layer structure shown in FIG. 26; FIG. 37 shows a surface emitting laser element having a layer structure shown in FIG. 27; FIG. 38 shows a surface emitting laser element having a layer structure shown in FIG. 28; FIG. 39 shows a surface emitting laser element having a layer structure shown in FIG. 29; FIG. 40 shows a surface emitting laser element having a layer structure shown in FIG. 30; FIG. 41 shows a surface emitting laser element having a layer structure shown in FIG. 31; FIG. 42 shows a surface emitting laser element having a layer structure shown in FIG. 32; and FIG. 43 shows a surface emitting laser element having a layer structure shown in FIG. 33. In the figures, graphs G21a to G30a represent the refractive index profile, and graphs G21b to G30b represent the mode distribution. The mode distribution represents the magnitude of the electric field amplitude in the TE mode.

The horizontal axis represents a lamination direction position (range is 2.0 μm). The equivalent refractive indices $N_{eff}$ of the layer structures shown in FIGS. 24 to 33 are 2.5296, 2.5302, 2.5311, 2.5321, 2.5334, 2.5350, 2.5369, 2.5393, 2.5422, and 2.5457, respectively. In FIGS. 34 to 43, a range T1 is the cladding layer 11, a range T2 is the high refractive index layer 16, a range T3 is the resonance mode formation layer, a range T4 is the high refractive index layer 17, a range T5 is the active layer 12, a range T6 is the cladding layer 13, and a range T7 is the contact layer 14.

Here, the equivalent refractive index refers to a refractive index felt by the light of the resonance mode distributed in the layer thickness direction with respect to the layer structure. On the basis of the equivalent refractive index $N_{eff}$, the lattice spacing a of lattice points or virtual lattice points can be determined. For example, when lattice points or virtual lattice points are arranged in a square lattice shape, the lattice spacing a can be determined as follows depending on the band edge corresponding to the wavelength) selected by the resonance mode formation layer. That is, when the F point is used at the band edge, the lattice spacing a is determined so as to satisfy $\lambda = N_{eff} \times a$. On the other hand, when M point is used at the band edge, the lattice spacing a is determined so as to satisfy $\lambda = (2^{1/2})N_{eff} \times a$. However, when the M point is used, the fundamental wave is not outputted in the layer thickness direction as it is. Therefore, a phase shift of $d\Psi(x, y) = (\pm \pi x/a, \pm \pi y/a)$ is added to the phase distribution $\Psi(x, y)$. At this time, the wavelength) can be selected from the wavelength range of the active layer 12 and outputted to the outside.

As shown in FIGS. 24 and 34, when the In composition of the InGaN layers of the high refractive index layers 16 and 17 is 0% (that is, GaN), the refractive indices of the high refractive index layers 16 and 17 are the same as the refractive indices of the cladding layers 11 and 13, and in that case, the optical confinement coefficient F of the resonance mode formation layer remains at 3.8%. On the other hand, as shown in FIGS. 25 to 33 and FIGS. 35 to 43, the larger the In composition of the InGaN layers of the high refractive index layers 16 and 17 becomes (i.e., the larger the refractive indices of the high refractive index layers 16 and 17 become), the larger the optical confinement coefficient Γ of the resonance mode formation layer gradually becomes. Specifically, Γ=4.4% for an In composition of 1%, Γ=5.0% for an In composition of 2%, Γ=5.6% for an In composition of 3%, Γ=6.2% for an In composition of 4%, Γ=6.8% for an In composition of 5%, Γ=7.5% for an In composition of 6%, Γ=8.1% for an In composition of 7%, Γ=8.8% for an In composition of 8%, and Γ=9.4% for an In composition of 9%.

Thus, by providing the surface emitting laser element with the high refractive index layers 16 and 17, the optical confinement coefficient of the resonance mode formation layer can be increased. Therefore, it is possible to obtain a practical light-emitting device capable of reducing the threshold current value and continuously oscillating. In particular, since the In composition of the InGaN layers of the high refractive index layers 16 and 17 is 2% or more, the optical confinement coefficient F of the resonance mode formation layer can be raised to an effective value of 5.0% or more.

The light-emitting device according to the present invention is not limited to each of the above-described embodiment, and various other variations can be made. For example, each embodiment and variations described above may be combined with one another depending on the desired purpose and effects. In each embodiment described above, the high refractive index layer may be provided only between the active layer 12 and the resonance mode formation layer. Even in such a case, the optical confinement coefficient of the resonance mode formation layer can be increased. While each embodiment and variation described above have given the examples of the configuration in which light is emitted from the back surface 10b of the semiconductor substrate 10 (back surface emission type), the present invention is also applicable to a surface emitting laser element in which light is emitted from the front surface of the contact layer 14 (alternatively, the surface of the cladding layer 13 exposed by removing a part of the contact layer 14).

REFERENCE SIGNS LIST 1A, 1B, 1C, 1D . . . Surface emitting laser element; 1E . . . Light-emitting apparatus; 10 . . . Semiconductor substrate; 10a . . . Main surface; 10b . . . Back surface; 11 . . . Cladding layer; 11, 13 . . . Cladding layer; 12, 12A . . . Active layer; 13 . . . Cladding layer; 14 . . . Contact layer; 15A . . . Photonic crystal layer; 15B, 15C . . . Phase modulation layer; 15a . . . Base layer; 15b, 15c . . . Modified refractive index region; 16, 17 . . . High refractive index layer; 18 . . . Guide layer; 26, 27 . . . Electrode; 27a . . . Opening; 28 . . . Protective film; 29 . . . Antireflection film; 71 . . . Control circuit; 72 . . . Drive circuit; 73 . . . Support substrate; B1, B2 . . . Optical image portion; B3 . . . Zero-order light; D . . . Straight line; FR . . . Image region; G . . . Center of gravity; L1 . . . Laser light; O . . . Lattice point; Q . . . Center; R . . . Unit constituent region; RIN . . . Inner region; and ROUT . . . Outer region.

The invention claimed is:

1. A light-emitting device, comprising:
a substrate having a main surface;
a first cladding layer provided on the main surface;
an active layer provided on the first cladding layer;
a second cladding layer provided on the active layer;
a resonance mode formation layer provided between the first cladding layer and the active layer or between the active layer and the second cladding layer, the resonance mode formation layer including a base layer and a plurality of modified refractive index regions, the plurality of modified refractive index regions having a refractive index different from a refractive index of the base layer and distributed two-dimensionally on a design surface orthogonal to a normal of the main surface; and
a high refractive index layer provided between the first cladding layer and the second cladding layer, the high refractive index layer having a refractive index higher than a refractive index of any of the first cladding layer, the second cladding layer, and the resonance mode formation layer, the high refractive index layer provided in at least one of a space in which the resonance mode formation layer is sandwiched between the high refractive index layer and the active layer, and a space in which the high refractive index layer is sandwiched between the active layer and the resonance mode formation layer, wherein
the first cladding layer, the active layer, the second cladding layer, the resonance mode formation layer, and the high refractive index layer mainly contain a nitride semiconductor, and
the high refractive index layer has a superlattice structure in which two or more layers having refractive indices different from each other are repeatedly laminated along a normal direction of the main surface.

2. A light-emitting device according to claim 1, wherein, comprising:
a substrate having a main surface;
a first cladding layer provided on the main surface;
an active layer provided on the first cladding layer;
a second cladding layer provided on the active layer;
a resonance mode formation layer provided between the first cladding layer and the active layer or between the active layer and the second cladding layer, the resonance mode formation layer including a base layer and a plurality of modified refractive index regions, the plurality of modified refractive index regions having a refractive index different from a refractive index of the base layer and distributed two-dimensionally on a design surface orthogonal to a normal of the main surface; and
a high refractive index layer provided between the first cladding layer and the second cladding layer, the high refractive index layer having a refractive index higher than a refractive index of any of the first cladding layer, the second cladding layer, and the resonance mode formation layer, the high refractive index layer provided in at least one of a space in which the resonance mode formation layer is sandwiched between the high refractive index layer and the active layer, and a space in which the high refractive index layer is sandwiched between the active layer and the resonance mode formation layer, wherein
the first cladding layer, the active layer, the second cladding layer, the resonance mode formation layer, and the high refractive index layer mainly contain a nitride semiconductor,
the high refractive index layer has a superlattice structure in which two or more layers having refractive indices different from each other are repeatedly laminated along a normal direction of the main surface, and
the resonance mode formation layer includes a photonic crystal layer in which the plurality of modified refractive index regions are periodically arranged.

3. A light-emitting device, comprising:
a substrate having a main surface;
a first cladding layer provided on the main surface;
an active layer provided on the first cladding layer;
a second cladding layer provided on the active layer;
a resonance mode formation layer provided between the first cladding layer and the active layer or between the active layer and the second cladding layer, the resonance mode formation layer including a base layer and a plurality of modified refractive index regions, the plurality of modified refractive index regions having a refractive index different from a refractive index of the base layer and distributed two-dimensionally on a design surface orthogonal to a normal of the main surface; and
a high refractive index layer provided between the first cladding layer and the second cladding layer, the high refractive index layer having a refractive index higher than a refractive index of any of the first cladding layer, the second cladding layer, and the resonance mode formation layer, the high refractive index layer provided in at least one of a space in which the resonance mode formation layer is sandwiched between the high refractive index layer and the active layer, and a space in which the high refractive index layer is sandwiched between the active layer and the resonance mode formation layer, wherein
the first cladding layer, the active layer, the second cladding layer, the resonance mode formation layer, and the high refractive index layer mainly contain a nitride semiconductor,
the high refractive index layer has a superlattice structure in which two or more layers having refractive indices different from each other are repeatedly laminated along a normal direction of the main surface, and
in order to output light for forming an optical image along the normal direction of the main surface of the substrate, a tilt direction intersecting with the normal direction, or both the normal direction and the tilt direction,
in a virtual square lattice set on the design surface of the resonance mode formation layer, at least one modified refractive index region of the plurality of modified refractive index regions is associated with each lattice point of the virtual square lattice, and a center of gravity of each of the plurality of modified refractive index regions is arranged at a position having a rotation angle corresponding to the optical image centered on a corresponding lattice point in a state of being apart from the corresponding lattice point.

4. A light-emitting device, comprising:
a substrate having a main surface;
a first cladding layer provided on the main surface;
an active layer provided on the first cladding layer;
a second cladding layer provided on the active layer;
a resonance mode formation layer provided between the first cladding layer and the active layer or between the active layer and the second cladding layer, the resonance mode formation layer including a base layer and a plurality of modified refractive index regions, the plurality of modified refractive index regions having a refractive index different from a refractive index of the base layer and distributed two-dimensionally on a design surface orthogonal to a normal of the main surface; and
a high refractive index layer provided between the first cladding layer and the second cladding layer, the high refractive index layer having a refractive index higher than a refractive index of any of the first cladding layer, the second cladding layer, and the resonance mode formation layer, the high refractive index layer provided in at least one of a space in which the resonance mode formation layer is sandwiched between the high refractive index layer and the active layer, and a space in which the high refractive index layer is sandwiched between the active layer and the resonance mode formation layer, wherein
the first cladding layer, the active layer, the second cladding layer, the resonance mode formation layer, and the high refractive index layer mainly contain a nitride semiconductor,
the high refractive index layer has a superlattice structure in which two or more layers having refractive indices different from each other are repeatedly laminated along a normal direction of the main surface, and
in order to output light for forming an optical image along the normal direction of the main surface of the substrate, a tilt direction intersecting with the normal direction, or both the normal direction and the tilt direction, in a virtual square lattice set on the design surface of the resonance mode formation layer, at least one modified refractive index region of the plurality of modified refractive index regions is associated with each lattice point of the virtual square lattice, and a center of gravity of each of the plurality of modified refractive index regions is arranged on a straight line passing through a corresponding lattice point and tilted with respect to the virtual square lattice, in a state where a distance between the center of gravity and the corresponding lattice point is individually set according to the optical image.

5. The light-emitting device according to claim 1, wherein the first cladding layer, the second cladding layer, and the base layer are a GaN layer or an AlGaN layer, and
at least one layer of the two or more layers of the high refractive index layer is a nitride semiconductor layer containing In.

6. The light-emitting device according to claim 5, wherein the at least one layer of the high refractive index layer further contains Al.

7. The light-emitting device according to claim 5, wherein the active layer has a multiple quantum well structure in which quantum well layers and barrier layers are alternately laminated along the normal direction, and
a band gap of the at least one layer of the high refractive index layer is wider than a band gap of the quantum well layer.

8. The light-emitting device according to claim 7, wherein the quantum well layer is a nitride semiconductor layer containing In, and
In composition of the at least one layer of the high refractive index layer, defined by a molar ratio with respect to all dopants contained in the nitride semiconductor, is smaller than In composition of the quantum well layer.

9. The light-emitting device according to claim 5, wherein In composition of the at least one layer of the high refractive index layer, defined by a molar ratio with respect to all dopants contained in the nitride semiconductor, is 2% or more.

10. The light-emitting device according to claim 9, wherein the In composition of the at least one layer of the high refractive index layer is 2% or more.

11. The light-emitting device according to claim 2, wherein
the first cladding layer, the second cladding layer, and the base layer are a GaN layer or an AlGaN layer, and
at least one layer of the two or more layers of the high refractive index layer is a nitride semiconductor layer containing In.

12. The light-emitting device according to claim 11, wherein the at least one layer of the high refractive index layer further contains Al.

13. The light-emitting device according to claim 11, wherein
the active layer has a multiple quantum well structure in which quantum well layers and barrier layers are alternately laminated along the normal direction, and
a band gap of the at least one layer of the high refractive index layer is wider than a band gap of the quantum well layer.

14. The light-emitting device according to claim 13, wherein
the quantum well layer is a nitride semiconductor layer containing In, and
In composition of the at least one layer of the high refractive index layer, defined by a molar ratio with respect to all dopants contained in the nitride semiconductor, is smaller than In composition of the quantum well layer.

15. The light-emitting device according to claim 11, wherein In composition of the at least one layer of the high refractive index layer, defined by a molar ratio with respect to all dopants contained in the nitride semiconductor, is 2% or more.

16. The light-emitting device according to claim 15, wherein the In composition of the at least one layer of the high refractive index layer is 2% or more.

17. The light-emitting device according to claim 3, wherein
the first cladding layer, the second cladding layer, and the base layer are a GaN layer or an AlGaN layer, and
at least one layer of the two or more layers of the high refractive index layer is a nitride semiconductor layer containing In.

18. The light-emitting device according to claim 17, wherein the at least one layer of the high refractive index layer further contains Al.

19. The light-emitting device according to claim 17, wherein
the active layer has a multiple quantum well structure in which quantum well layers and barrier layers are alternately laminated along the normal direction, and
a band gap of the at least one layer of the high refractive index layer is wider than a band gap of the quantum well layer.

20. The light-emitting device according to claim 19, wherein
the quantum well layer is a nitride semiconductor layer containing In, and
In composition of the at least one layer of the high refractive index layer, defined by a molar ratio with respect to all dopants contained in the nitride semiconductor, is smaller than In composition of the quantum well layer.

21. The light-emitting device according to claim 17, wherein In composition of the at least one layer of the high refractive index layer, defined by a molar ratio with respect to all dopants contained in the nitride semiconductor, is 2% or more.

22. The light-emitting device according to claim 21, wherein the In composition of the at least one layer of the high refractive index layer is 2% or more.

23. The light-emitting device according to claim 4, wherein
the first cladding layer, the second cladding layer, and the base layer are a GaN layer or an AlGaN layer, and
at least one layer of the two or more layers of the high refractive index layer is a nitride semiconductor layer containing In.

24. The light-emitting device according to claim 23, wherein the at least one layer of the high refractive index layer further contains Al.

25. The light-emitting device according to claim 23, wherein
the active layer has a multiple quantum well structure in which quantum well layers and barrier layers are alternately laminated along the normal direction, and
a band gap of the at least one layer of the high refractive index layer is wider than a band gap of the quantum well layer.

26. The light-emitting device according to claim 25, wherein
   the quantum well layer is a nitride semiconductor layer containing In, and
   In composition of the at least one layer of the high refractive index layer, defined by a molar ratio with respect to all dopants contained in the nitride semiconductor, is smaller than In composition of the quantum well layer.

27. The light-emitting device according to claim 23, wherein In composition of the at least one layer of the high refractive index layer, defined by a molar ratio with respect to all dopants contained in the nitride semiconductor, is 2% or more.

28. The light-emitting device according to claim 27, wherein the In composition of the at least one layer of the high refractive index layer is 2% or more.

* * * * *